(12) United States Patent
Fritz et al.

(10) Patent No.: US 7,245,717 B2
(45) Date of Patent: Jul. 17, 2007

(54) TELECOMMUNICATIONS CHASSIS AND CARD

(75) Inventors: Gregory J. Fritz, St. Paul, MN (US); Alejandra Anderson, Maple Grove, MN (US); Robin Berg, Shakopee, MN (US); Derek Sayres, Lonsdale, MN (US); Eric Sit, Eden Prairie, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 910 days.

(21) Appl. No.: 09/861,187

(22) Filed: May 18, 2001

(65) Prior Publication Data

US 2002/0173278 A1    Nov. 21, 2002

(51) Int. Cl.
*H05K 5/02* (2006.01)

(52) U.S. Cl. .................. 379/413.04; 361/796; 361/752

(58) Field of Classification Search ................ 361/679, 361/826, 829, 802, 796; 455/90.3, 128; 439/377
See application file for complete search history.

(56) References Cited

U.S. PATENT DOCUMENTS

| | | | |
|---|---|---|---|
| 4,353,469 A | 10/1982 | Etchison, Jr. et al. | 211/41 |
| 4,519,016 A | 5/1985 | Bradley et al. | 361/415 |
| 5,394,305 A * | 2/1995 | Moral et al. | 361/796 |
| 5,966,648 A | 10/1999 | Ortberg et al. | 455/347 |
| 5,991,163 A * | 11/1999 | Marconi et al. | 361/788 |
| 6,425,488 B1 * | 7/2002 | Notohardjono et al. | 211/26 |
| 6,637,845 B2 * | 10/2003 | Berg et al. | 312/223.2 |
| 2002/0118524 A1 | 8/2002 | Berg, Jr. et al. | 361/796 |
| 2002/0118525 A1 | 8/2002 | Fritz et al. | 361/796 |

FOREIGN PATENT DOCUMENTS

| | | |
|---|---|---|
| AU | B-77784/81 | 11/1980 |
| EP | 1 009 210 A2 | 6/2000 |
| WO | WO 99/66771 | 12/1999 |

OTHER PUBLICATIONS

Fritz, et al., entitled *Telecommunications Chassis and Card*, filed Apr. 3, 2001, U.S. Appl. No. 09/825,163.
Fritz, et al., entitled *Telecommunications Chassis and Card*, filed May 18, 2001, U.S. Appl. No. 09/860,653.

(Continued)

*Primary Examiner*—Sinh Tran
*Assistant Examiner*—Walter F Briney, III
(74) *Attorney, Agent, or Firm*—Merchant & Gould P.C.

(57) ABSTRACT

A chassis and associated telecommunication circuit card are disclosed. The chassis has heat dissipation structures and may accommodate a high density of the circuitry cards. Embodiments may include one surface with one or more ridges for rigidity and ventilation and fin slots for receiving circuit card guide fins. Embodiments may include a surface with knockouts for receiving circuit card guides. Embodiments may also include multiple bracket hole patterns for mounting brackets for different racks or for a single multi-rack bracket having more than one mounting hole pattern. The circuit card includes conductor structures such as multiple board layers with paired and segregated conductors. The circuit card also includes some components positioned to cooperate with the ventilation structures of the chassis and includes some components chosen for low-power consumption or reduced flammability.

5 Claims, 63 Drawing Sheets

OTHER PUBLICATIONS

*Homeworx Hwx Integrated Fan and Power Supply*; ADC Telecommunications, Nov. 1997, p. 1-4.
*Soneplex DS3 Remote Control System*; ADC, Jan. 1998, pp. 1-6.
*Soneplex Broadband System; ADC*, Feb. 1998, pp. 1-4.
*Soneplex TI Repeater Module; ADC*.
*Soneplex EI Loop Extender Platform*; ADC Jan. 1998, pp. 1-4.
*EZTI/DI Voice and Data Multiplexer*; ADC Jun. 1998, pp. 1-6.
*50 Termination Bantam Jack Panel*; ADC Telecommunications May 1998.
*50 Termination DS2 Bantam Jack Panel*; ADC Telecommunications May 1998.
*PxPlus DSI Digital Signal Cross-Connect; ADC* Jan. 1997.
*Chassis -Loaded*; ADC Telecommunications; Jul. 1998, pp. 7, 8 and 21.
*Rear Cross—Connect*; ADC Telecommunications Jun. 1996, p. 10.
*Video Signal Distribution Products, Analog Video Interface System, Test/Access Coaxial Jack Products with Table of Contents*: ADC Telecommunications; Oct. 1996, pp. 2, 16, 44.
*Multifunction Panel*; ADC Telecommunications; Jun. 1997, p. 1.
*Enteraprise Structured Connectivity Systems FL100 Product Family*; ADC Telecommunications, Nov. 1998, p. 2.
*Front and Rear Load Frame Modules*; ADC Telecommunications, Jun. 1998, pp. 28-29.

* cited by examiner

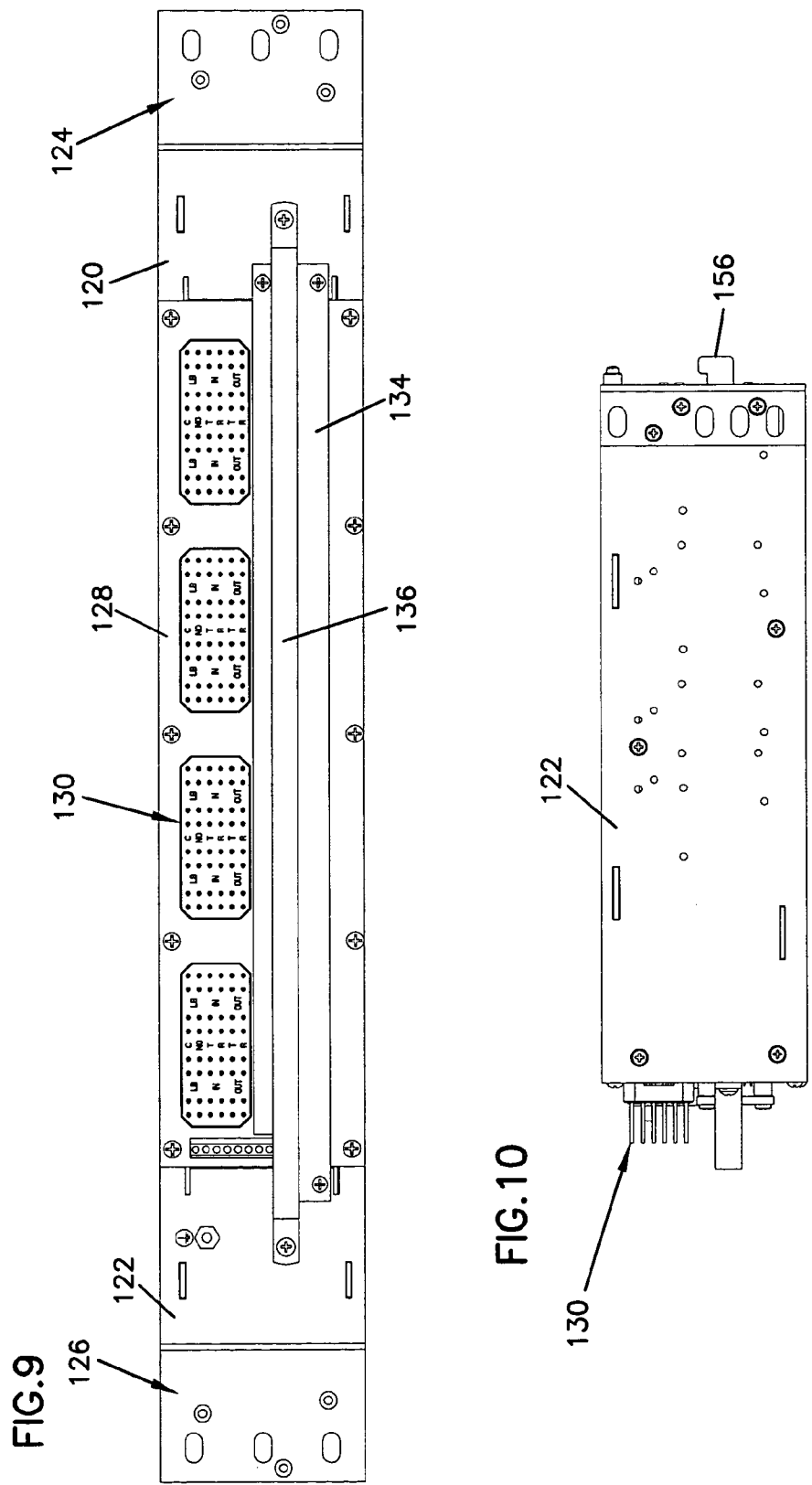

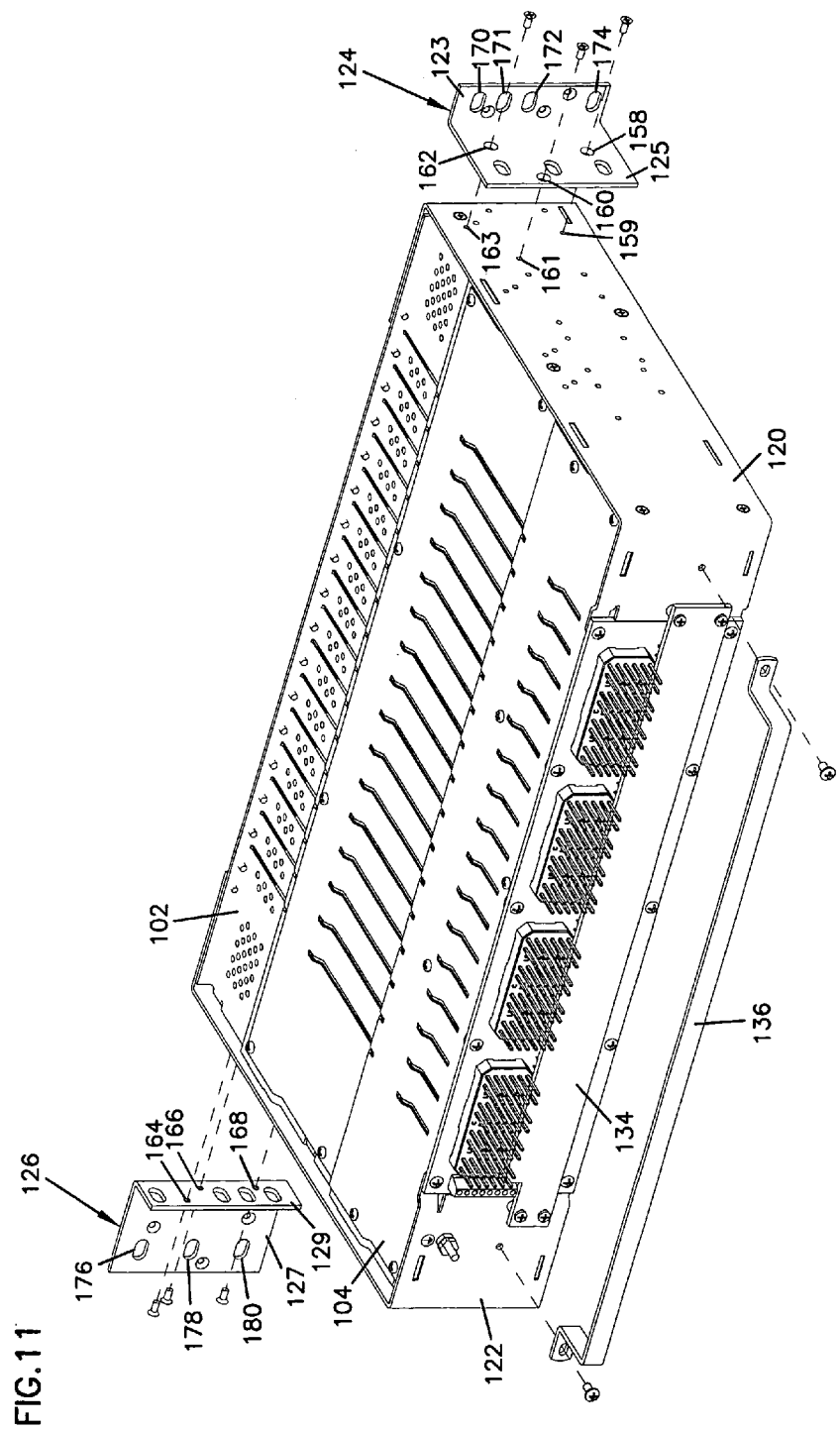

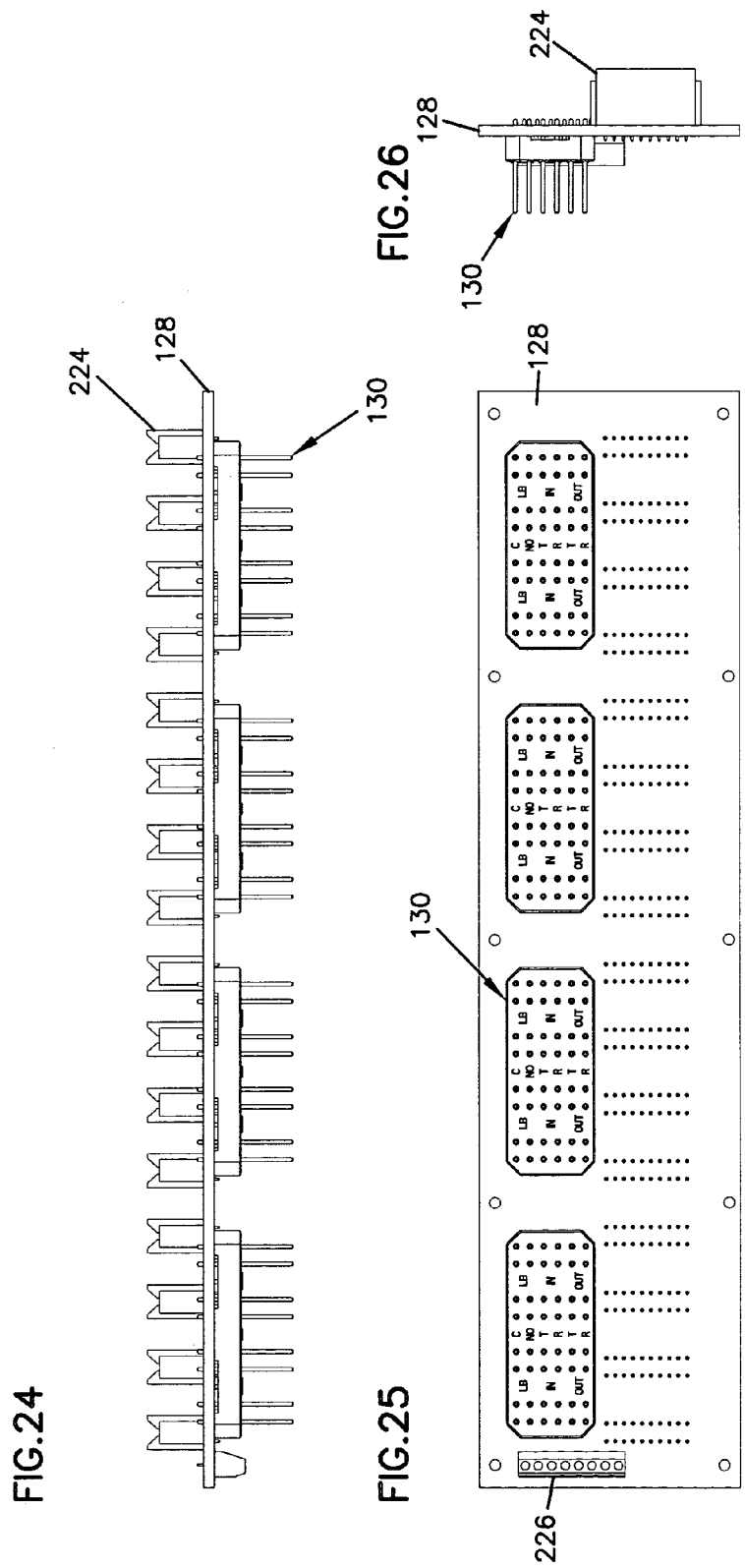

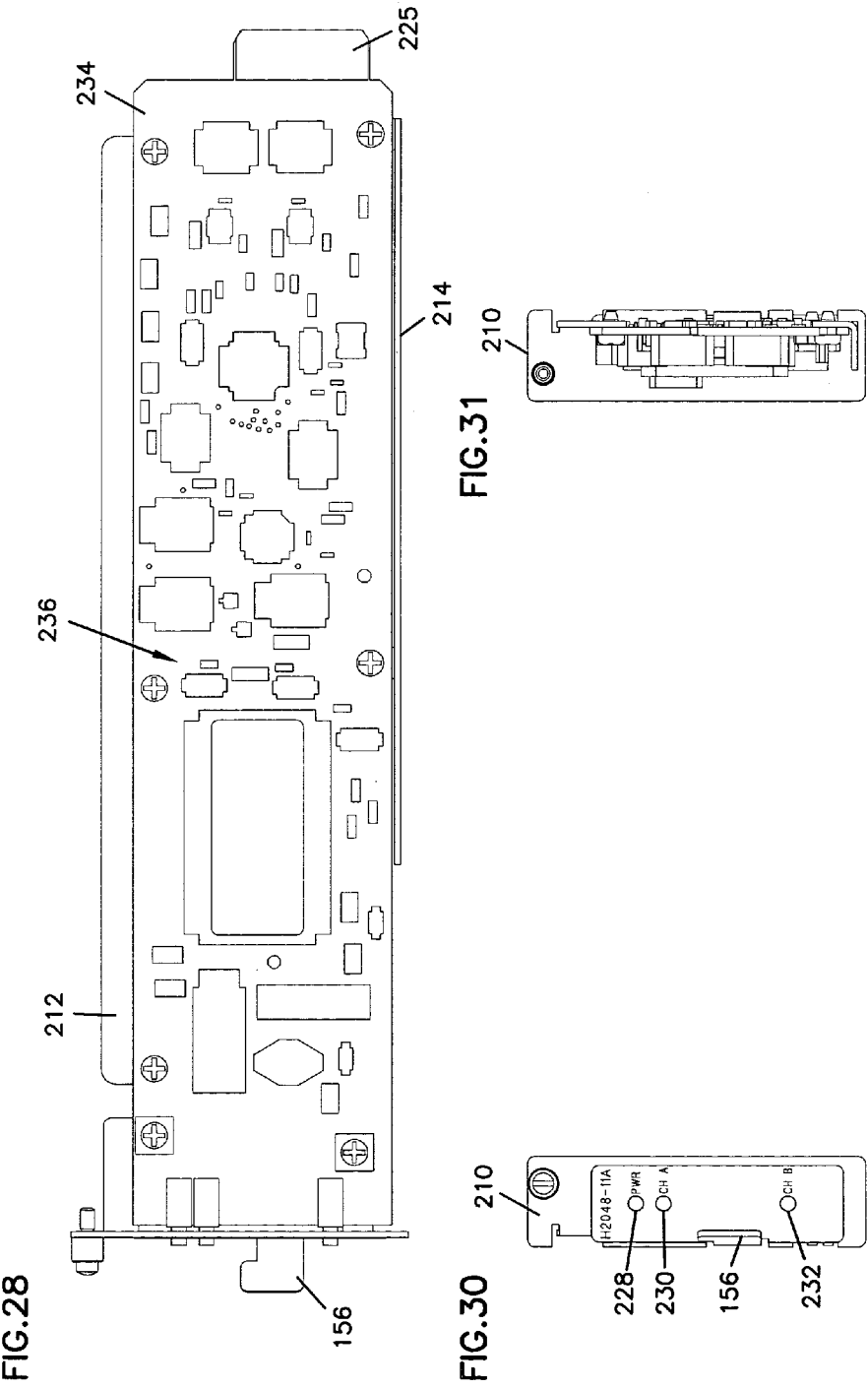

TELECOMMUNICATIONS CHASSIS AND CARD

TECHNICAL FIELD

This invention relates to chassis for holding telecommunications cards such as repeater circuits. More specifically, the present invention relates to chassis and cards with structures for high card density and structures for mounting with multiple rack styles.

BACKGROUND

It is desirable for a chassis for holding telecommunication circuit cards to support a high density of cards, yet the chassis must effectively dissipate heat developed during operation. The cards installed in the chassis perform electrical operations, such as signal transception and amplification that generate a significant amount of heat. Typically, a chassis is installed in a particular rack that contains several other chassis stacked above and below. The heat that may develop within a chassis in the rack has the potential to harm circuit cards housed in the chassis above and below the chassis where the heat emanates from. Additionally, the rack housing the chassis may be one of several different rack types, such as an EIA rack style, a WECO rack style, or an ETSI rack style, and a different chassis may be required for each to ensure proper mounting.

The chassis must also provide external protection for the circuit cards it houses. Thus, the chassis cannot freely expose the circuit cards to areas outside the chassis when attempting to dissipate heat. Additionally, the chassis must provide a structural interconnection that maintains electrical continuity between the circuit cards and external transmission mediums such as copper wires or fiber optic cables while facilitating insertion and removal of the cards. A sufficient structure must be used to facilitate this circuit card modularity, which further limits the chassis' ability to provide outlets for heat.

Additionally, to reduce the chassis size for a given number of circuits, the circuit card density must be increased. Increasing circuit card density is difficult not only due to heat dissipation, but also because of electromagnetic noise that must be contained. Generally, increasing circuit card density involves employing smaller cards, and smaller cards require higher component density within the cards. Achieving effective heat dissipation with adequate electromagnetic noise containment may even be more difficult for smaller card designs with higher component densities.

Thus several factors must be accounted for in the chassis and card design. Chassis designs with large interior spaces for directing heat away from circuit cards may be undesirable because the chassis may become too large when accommodating a high density of circuits. Chassis designs with open exteriors for directing heat away from the circuit cards may be undesirable because the circuit cards may not be sufficiently protected from externalities such as falling objects or heat spreading from a chassis positioned above or below in the rack. Card designs that are relatively large require a larger chassis to house the same quantity of cards. Additionally, a different chassis must be provided for each rack style for proper mounting.

Thus, there is a need for a chassis and card design whereby the chassis may contain a high density of readily removable circuit cards while providing effective heat dissipation and electromagnetic noise containment and/or be mountable in multiple rack styles.

SUMMARY

The present invention provides a chassis and card design that may accommodate a high density of readily removable circuits while providing heat dissipation and electromagnetic noise containment features. Ventilation structures are employed to direct heat away from internal circuitry. Additionally, chassis designs of the present invention may provide exterior features that establish protection from externalities and prevent the harmful spread of heat to chassis or other equipment stacked above or below. Card designs of the present invention may provide conductor structures for containing electromagnetic noise and/or individual components placed in locations for coordination with the ventilation structures of the chassis. Additionally, the chassis may provide configurable mounting structures to enable a single chassis to be mounted in racks of different styles.

The present invention may be viewed as a chassis for housing telecommunications cards. The chassis includes a housing having a first and second horizontal surface and vertical sidewalls between the first and second horizontal surfaces. The first and second horizontal surfaces have a plurality of openings, and the first horizontal surface has a first ridge substantially perpendicular to a longitudinal axis of the vertical sidewalls. The chassis also includes a first horizontal cover overlaying the first horizontal surface, and the first horizontal cover has a first ridge that is aligned with the first ridge of the first horizontal surface.

The present invention may also be viewed as another chassis for holding telecommunications cards. The chassis includes a housing having a first and second horizontal surface and vertical sidewalls between the first and second horizontal surfaces. The first and second horizontal surfaces have a plurality of openings, wherein the second horizontal surface has a first ridge substantially perpendicular to a longitudinal axis of the vertical sidewalls, and the first ridge has a plurality of knockouts. Each knockout is for receiving a guide of a telecommunications card.

The present invention may also be viewed as a chassis for housing repeater cards. The chassis includes a housing with vertical sidewalls, a first horizontal surface, and a second horizontal surface, wherein the first horizontal surface has a first ridge extending substantially perpendicular to a longitudinal axis of the vertical sidewalls and a second ridge substantially parallel to the first ridge. The first ridge and the second ridge each have an elongated opening. The chassis also includes one or more repeater cards positioned between the first horizontal surface and the second horizontal surface, and the one or more repeater cards have a DC-DC converter and a transceiver. The DC-DC converter is positioned at least partially between the elongated opening of the first ridge and the second surface. The transceiver is positioned at least partially between the elongated opening of the second ridge and the second surface.

The present invention may be viewed as another chassis for holding telecommunications cards. The chassis includes a housing having first and second horizontal surfaces and first and second vertical sidewalls, and the first vertical sidewall having a plurality of holes. The chassis also includes a first bracket mounted to the housing, with the first bracket having a first side and a second side perpendicular to the first side. The first side of the first bracket has a first horizontal dimension and a first and second set of holes, and the second side of the first bracket has a second horizontal dimension different than the first horizontal dimension and has a first and second set of holes. When the first set of holes of the first side of the first bracket align with at least a portion of the plurality of holes of the first sidewall, the second set of holes of the first side of the first bracket are blocked by the first vertical sidewall. When the first set of holes of the second side of the first bracket align with at least a portion of the plurality of holes of the first vertical sidewall, the second set of holes of the second side of the first bracket are blocked by the first vertical sidewall.

The present invention may be viewed as another chassis for holding telecommunications cards. The chassis includes first and second horizontal surfaces and first and second vertical sidewalls separating the first and second horizontal surfaces, wherein the first vertical sidewall has a plurality of at least three holes. The chassis also includes a first bracket having a first side and having a second side substantially perpendicular to the first side, the first side having a set of at least two holes and the second side having a set of at least two holes. The set of at least two holes of the first side align with a first set of at least two but fewer than all of the plurality of holes of the first vertical sidewall when the first side abuts the first vertical sidewall. The set of at least two holes of the second side align with a second set of at least two but fewer than all of the plurality of holes of the first vertical sidewall when the second side abuts the first vertical sidewall. The first set includes at least one hole not included in the second set.

The present invention may be viewed as a method of installing brackets on a chassis. The method involves providing a housing having first and second horizontal surfaces and first and second vertical sidewalls, with the first vertical sidewall having a plurality of holes. The method also involves providing a first bracket having a first side and a second side perpendicular to the first side, wherein the first side of the first bracket has a first horizontal dimension and a first and second set of holes and wherein the second side of the first bracket has a second horizontal dimension different than the first horizontal dimension and has a first and second set of holes. When installing the first bracket such that the first side abuts the first vertical sidewall, the method involves aligning the first set of holes of the first side of the first bracket with at least a portion of the plurality of holes of the first sidewall and blocking the second set of holes of the first side of the first bracket by the first vertical sidewall. When installing the first bracket such that the second side abuts the first vertical sidewall, the method involves aligning the first set of holes of the second side of the first bracket with at least a portion of the plurality of holes of the first vertical sidewall and blocking the second set of holes of the second side of the first bracket by the first vertical sidewall.

The present invention may be viewed as another method of installing brackets on a chassis. The method involves providing a housing having first and second horizontal surfaces and first and second vertical sidewalls separating the first and second horizontal surfaces, wherein the first vertical sidewall has a plurality of at least three holes. The method further involves providing a first bracket having a first side and having a second side substantially perpendicular to the first side, with the first side having a set of at least two holes and the second side having a set of at least two holes. When installing the bracket such that the first side abuts the first vertical sidewall, the method involves aligning the set of at least two holes of the first side with a first set of at least two but fewer than all of the plurality of holes of the first vertical sidewall. When installing the bracket such that the second side abuts the first vertical sidewall, the method involves aligning the set of at least two holes of the second side with a second set of at least two but fewer than all of the plurality of holes of the first vertical sidewall, wherein the first set comprises at least one hole not included in the second set.

DESCRIPTION OF THE DRAWINGS

FIG. 9 is a rear view of the loaded chassis.

FIG. 10 is a left side view of the loaded chassis.

FIG. 11 is a partially exploded top rear perspective view of the empty chassis.

FIG. 24 is a top view of the backplane.

FIG. 25 is a rear view of the backplane.

FIG. 26 is a left side view of the backplane.

FIG. 28 is a right side view of the circuit card.

FIG. 30 is a front view of the circuit card.

FIG. 31 is a rear view of the circuit card.

DETAILED DESCRIPTION

Figure 1:
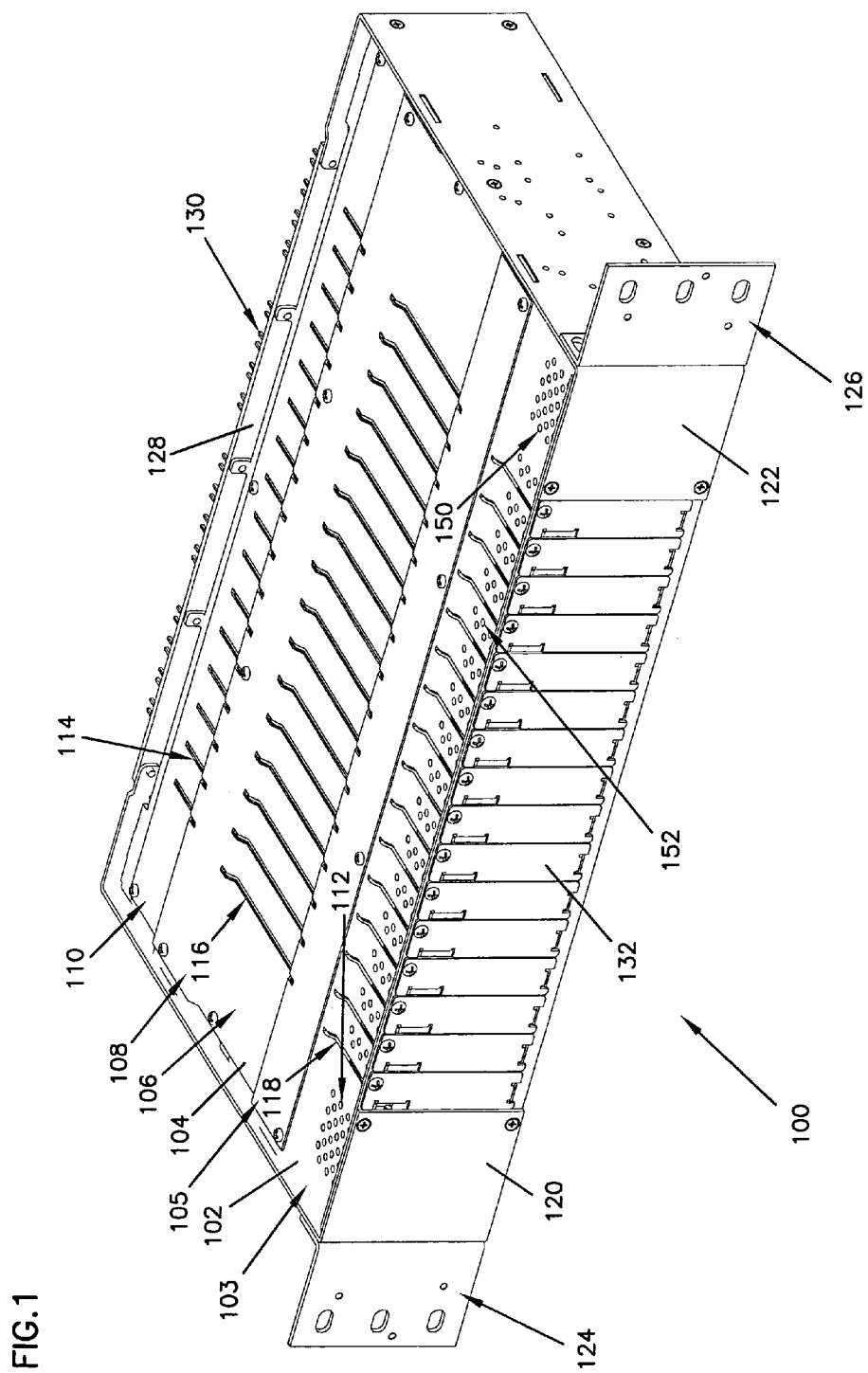
FIG. 1 is a top front perspective view of an empty chassis in accordance with one embodiment of the present invention.

Various embodiments of the present invention will be described in detail with reference to the drawings, wherein like reference numerals represent like parts and assemblies through the several views. Reference to various embodiments does not limit the scope of the invention, which is limited only by the scope of the claims attached hereto.

FIGS. 1–7 show an embodiment of the chassis 100 for holding telecommunications cards. The empty chassis 100 of FIGS. 1–7 has a horizontal surface 102 mounted to vertical sidewalls 120, 122. In this embodiment, each vertical sidewall 120, 122 has a 90 degree bend at the front and rear ends allowing the sidewalls 120, 122 to form partial front and rear panels of the chassis 100. The vertical sidewalls 120, 122 have a longitudinal axis that extends from the front to the back of the chassis 100, which is from the front bend to the rear bend in the embodiment shown. The chassis 100 also has a horizontal surface 142 mounted to the vertical sidewalls 120, 122. Both horizontal surfaces 102, 142 and both sidewalls 120, 122 of this embodiment are made of a material such as cold-rolled steel. The cold-rolled steel may have a chromate plating to reduce electromagnetic interference.

Covers are provided over the first horizontal surface 102 and the second horizontal surface 142. The first horizontal cover 104 overlays the first horizontal surface 102 and mounts directly to it. The second horizontal cover 154 underlays the second horizontal surface 142 and mounts directly to it. The covers 104 and 154 of this embodiment are made of a mesh surface such as aluminum having 63% of its area formed by densely populated openings. Other materials and air passage percentages are also applicable. The mesh material allows rising air to pass through while preventing objects from falling into or out of the chassis 100 that would otherwise enter the chassis 100 through large openings provided in the first and second horizontal surfaces 102, 142 that are discussed below.

Figure 12:
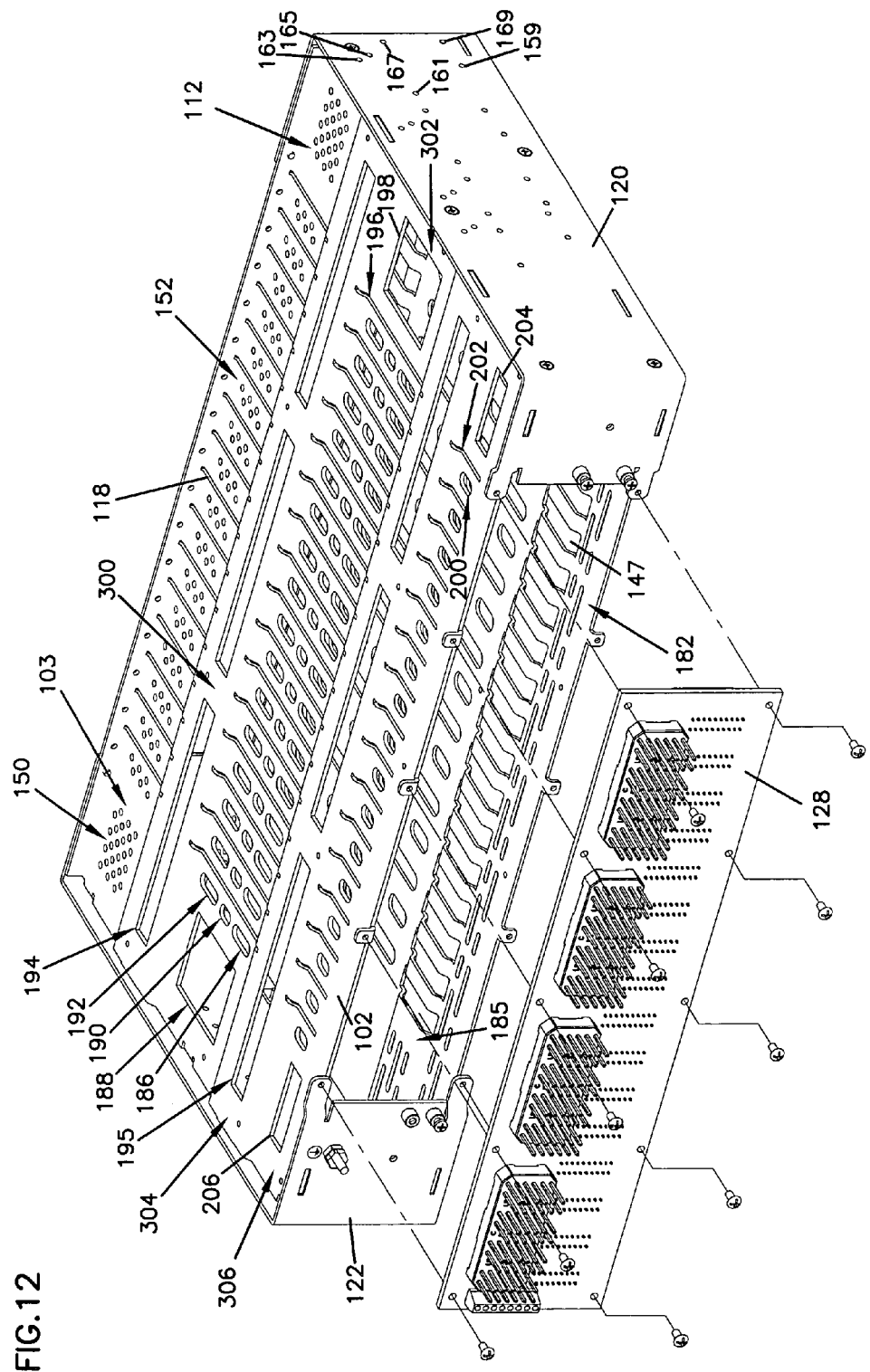
FIG. 12 is a partially exploded top rear perspective view of the empty chassis with a top and a bottom mesh cover removed.

The first horizontal surface 102 is contoured to provide two ridges 300, 304 dividing three recessed areas 103, 302, and 306, as is best seen in FIG. 12. The two parallel ridges 300, 304 extend across the width of the chassis 100 perpendicularly to the longitudinal axis of the vertical sidewalls 120, 122. The first area 103 of the first horizontal surface extends beyond the coverage area of the first horizontal cover 104. The first horizontal cover 104 of this embodiment is also contoured to provide two ridges 105, 108 and two recessed areas 106 and 110. The ridge 105 of the first horizontal cover 104 is aligned with and overlaps ridge 300 of the first horizontal surface 102. The ridge 108 of the first horizontal cover 104 is aligned with and overlaps ridge 304 of the first horizontal surface 102. The recessed area 106 of the first horizontal cover 104 overlaps with recessed area 302 of the first horizontal surface 102, and the recessed area 110 of the first horizontal cover 104 overlaps with recessed area 306 of the first horizontal surface 102.

The first horizontal surface 102 includes a first row of fin slots 118 in area 103 that are for receiving a fin of a circuit card, discussed below. The first row of fin slots 118 extends into the ridge 300 and the fin slots are perpendicular to the longitudinal direction of the ridge 300. The first horizontal surface 102 also includes a second row of fin slots 196 that extend across the area 302 from the ridge 300 to the ridge 304. The first horizontal surface 102 also includes a third row of fin slots 202 in area 306 that extends into the ridge 304. The fin slots of each row align with fin slots in the other rows and guide each circuit card as it is inserted into the chassis 100. The ridges 300, 304 add rigidity to the first horizontal surface by allowing the fin slots to be broken into sets of rows while allowing the fin of the card to pass by as it is being inserted. The rigidity of the first horizontal surface 102 would be reduced if the ridges 300, 304 were not present because each fin slot would need to be continuous to facilitate circuit card entry rather than being broken into three sections as shown.

The first horizontal cover 104 has a row of fin slots 116 in the area 106 that align with the row of fin slots 196 in the area 302 of the first horizontal surface 102. The first horizontal cover 104 also has a row of fin slots 114 in the area 110 that align with the row of fin slots 202 in the area 306 of the first horizontal surface 102. The rows of fin slots in the first horizontal cover 104 also allow the fin of the circuit card to be guided as it is inserted into the chassis 100. Similar to the first horizontal surface 102, the rigidity of the first horizontal cover 142 would be reduced if the ridges 105, 108 were not present because each fin slot would need to be continuous to facilitate circuit card entry rather than being broken into two sections as shown.

In the embodiment shown, the chassis 100 has open interior regions on each side defined by the wrap-around vertical sidewalls 120, 122. The first horizontal surface 102 has ventilation holes 112 over the left region in the area 103 and ventilation holes 150 over the right region in the area 103. Also in the area 103, the first horizontal surface has ventilation holes 152 placed between each fin slot of the first row 118. The second horizontal surface has ventilation holes 148 under the left region and ventilation holes 146 under the right region.

Because the chassis is empty in FIGS. 1–7, card slot covers 132 are mounted to the chassis 100 to avoid exposing the interior of the chassis 100. The rear of the chassis 100 is enclosed by a backplane 128 that is attached to each wrap-around vertical sidewall 120, 122. The backplane 128 provides connections between cables and the circuit cards housed by the chassis 100. The backplane 128 includes external connectors 130 that connect to cables routed to the rear of the chassis rack (not shown) where the chassis 100 is installed.

The rear of the chassis 100 includes a cover 134 made from a material such as lexan that may be placed over a portion of the backplane 128 where circuit leads and pins from card connectors, discussed below, are present. A cable bar 136 may also be installed to hold the cables connected to the external connectors 130. A chassis ground connector 138 may also be included for grounding the chassis 100.

The second horizontal surface 142 may include a first ridge 183 spanning the width of the chassis 100 and being parallel to the ridge 300 of the first horizontal surface 102. The first ridge 183 may include a row of knockouts 144 for receiving a guide of a circuit card. The knockout 144 is a portion of the ridge 183 that has been removed to create a passage for the guide. As shown, the card slot covers 132 have a guide 131 that fits into the knockout 144 to stabilize the bottom of the card slot cover 132. As shown in FIG. 12, the second horizontal surface 142 may also include a second ridge 185 positioned near the backplane 128 and extending substantially parallel to the ridge 183 across the width of the chassis 100. An area 182 is provided between the second ridge 185 and the backplane 128. The second ridge 185 also includes knockouts 147 for receiving the guide of the circuit cards.

The chassis 100 of this embodiment also includes mounting brackets 124, 126. These brackets 124, 126 mount to the vertical sidewalls 120, 122 and also to the vertical rails of a chassis rack (not shown). The brackets 124, 126 of this embodiment facilitate mounting the chassis 100 in different racks. The bracket 124, 126 has a first side 123, 129 that abuts the vertical sidewall 120, 122, such as in FIGS. 1 and 2, and another side 125, 127 that is perpendicular to the first side 123, 129 and that abuts the rack rail when mounting the chassis 100.

The first side 123, 129 has a first horizontal dimension and the second side 125, 127 has a second horizontal dimension different than the first horizontal dimension. The differing horizontal dimensions of the sides of the bracket 124, 126 allow the bracket 124, 126 and chassis 100 to be used for racks with different mounting widths. For one rack mounting width, the first side 123, 129 abuts the chassis 100 and the other side 125, 127 abuts the rail of the rack. For another rack mounting width that is less wide, the second side 125, 127 abuts the chassis 100 and the first side 123, 129 abuts the rack rail.

As best seen in FIG. 11, the side 129 of the bracket 126 has a bracket hole pattern established by bracket holes 164, 166, and 168. Side 123 of bracket 124 has the same bracket hole pattern. The sidewalls 120, 122 of the chassis 100 have a bracket hole pattern that matches the bracket hole pattern of the sides 123 and 129. As seen in FIG. 12, this bracket hole pattern of the chassis 100 includes bracket holes 165, 167, and 169. The bracket holes of the chassis 100 align with the bracket holes of the bracket 124, 126 when mounting the brackets 124, 126.

When using the side 125, 127 to mount to the rack rail, a rack hole configuration on the side 125, 127 is available. This rack hole configuration includes the rack holes 176, 178, and 180. This setup is applicable for racks such as an ETSI rack where the distance between adjacent rack holes 176, 178, and 180 is 25 millimeters. The ETSI rack and mounted chassis can be seen in FIGS. 49 and 50.

Figure 49:
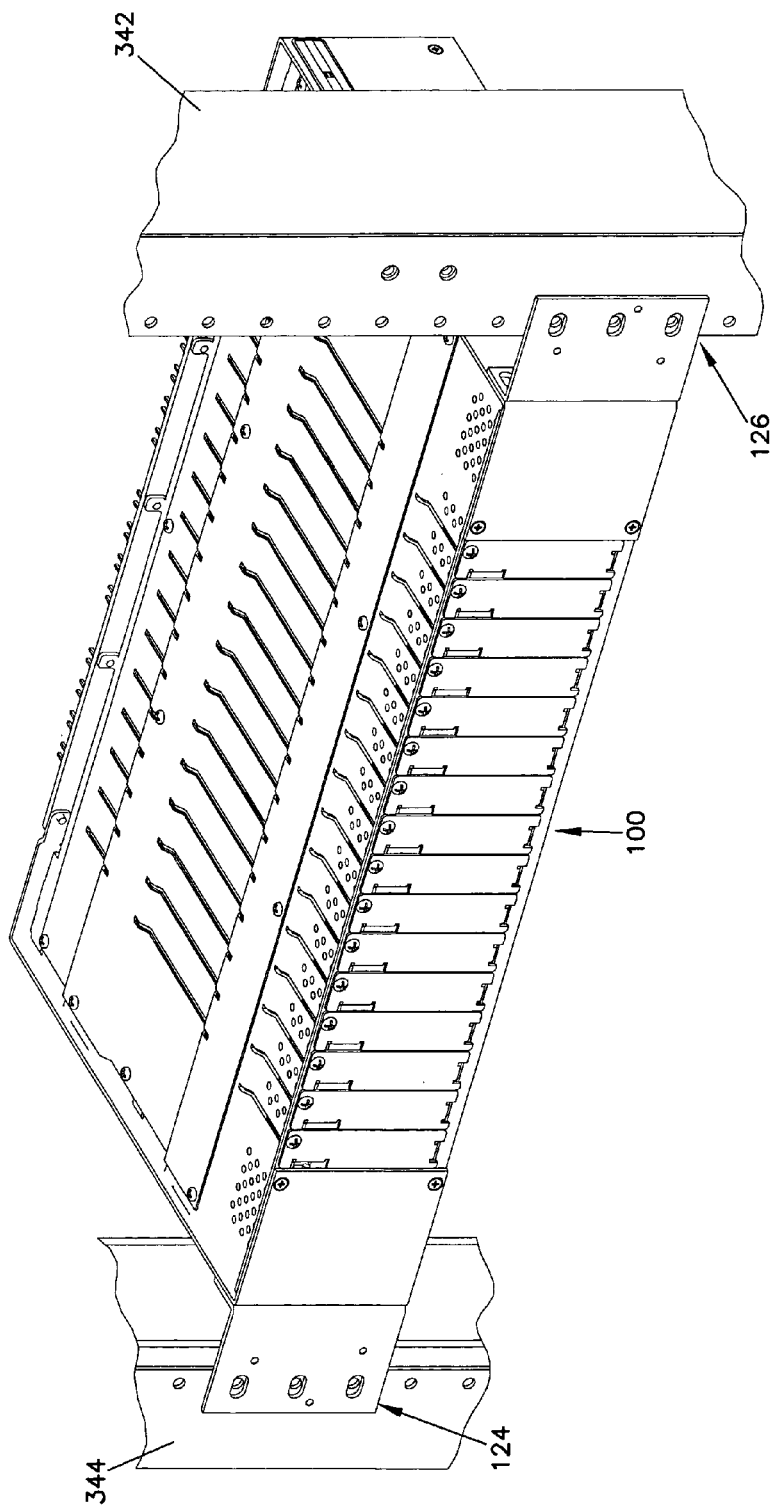
FIG. 49 is a perspective view of the empty chassis mounted in an ETSI rack.
Figure 50:
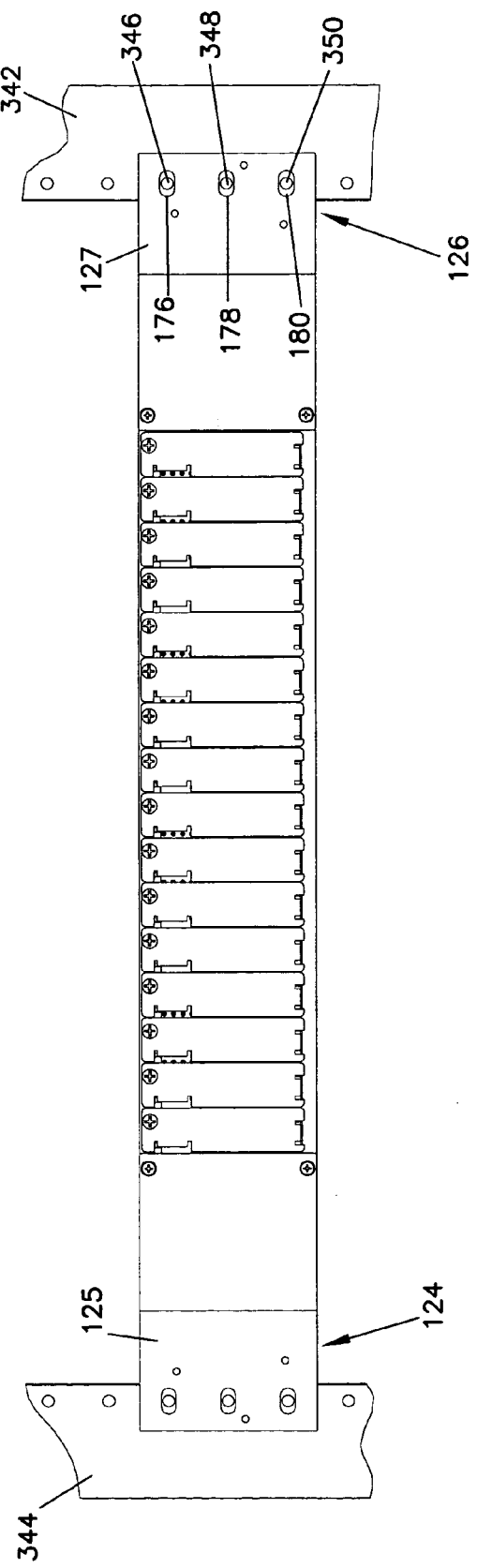
FIG. 50 is a front view of the empty chassis mounted in the ETSI rack.

The ETSI rack of FIGS. 49 and 50 includes rails 342 and 344. The rails 342, 344 have mounting holes with consistent spacing. The rails 342 and 344 and associated mounting holes of the ETSI rack are spaced further apart horizontally than those of the EIA or WECO racks. Therefore, the chassis 100 includes brackets 124 and 126 mounted such that the wide sides 125 and 127 extend from the chassis 100 while the narrow sides 123 and 129 abut the vertical sidewalls 120, 122 of the chassis 100.

The rack holes 176, 178, and 180 of the brackets 124, 126 align with three contiguous mounting holes 346, 348, and 350 of the rails 342, 344. The chassis 100 is fastened to the rails 342, 344 through screws that engage the rack holes 176, 178, and 180 and the mounting holes 346, 348, and 350. Multiple chassis 100 may be stacked one directly atop the next within the ETSI rack.

With reference to FIG. 11, the side 125 of the bracket 124 has a bracket hole pattern established by bracket holes 158, 160, and 162. Side 127 has the same bracket hole pattern. The sidewalls 120, 122 of the chassis 100 have a bracket hole pattern that matches the bracket hole pattern of sides 125 and 127. As seen in FIGS. 11 and 12, this bracket hole pattern of the chassis 100 includes brackets holes 159, 161, and 163.

When using the side 123, 129 to mount to the rack rail, a rack hole configuration on the side 123, 129 is available. This rack hole configuration includes the rack holes 170, 171, 172, and 174. This setup is applicable for racks such as an EIA or WECO rack where the distance between adjacent rack holes 170, 171, and 172 is 0.5 inches and the distance between the adjacent rack holes 172 and 174 is 1.25 inches. The EIA rack and mounted chassis can be seen in FIGS. 43 and 44 for a first mounting method and FIGS. 45 and 46 for a second mounting method. The WECO rack and mounted chassis can be seen in FIGS. 47 and 48.

The EIA rack of FIGS. 43, 44, 45, and 46 includes rails 322 and 324. The rails 322, 324 have paired mounting holes with one spacing distance between each hole of the pair and a greater second distance between adjacent holes of different pairs. Because the rails 322 and 324 and associated mounting holes of the EIA rack are spaced more closely horizontally than those of the ETSI rack, the chassis 100 includes brackets 124 and 126 mounted such that the narrow sides 123 and 129 extend from the chassis 100 while the narrow sides 125 and 127 abut the vertical sidewalls 120, 122 of the chassis 100.

Figure 43:
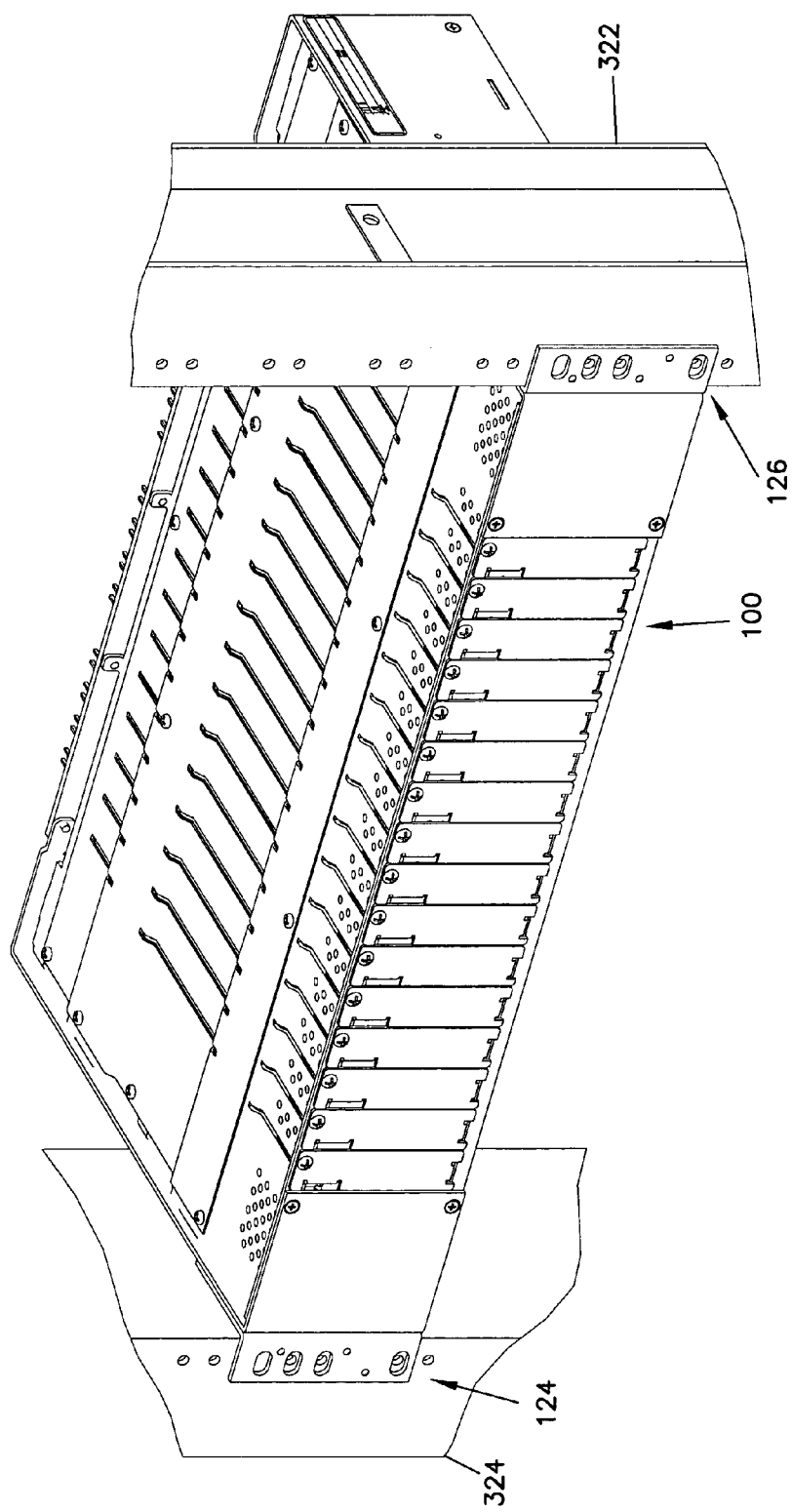
FIG. 43 is a perspective view of the empty chassis mounted in an EIA rack using a first mounting method.
Figure 44:
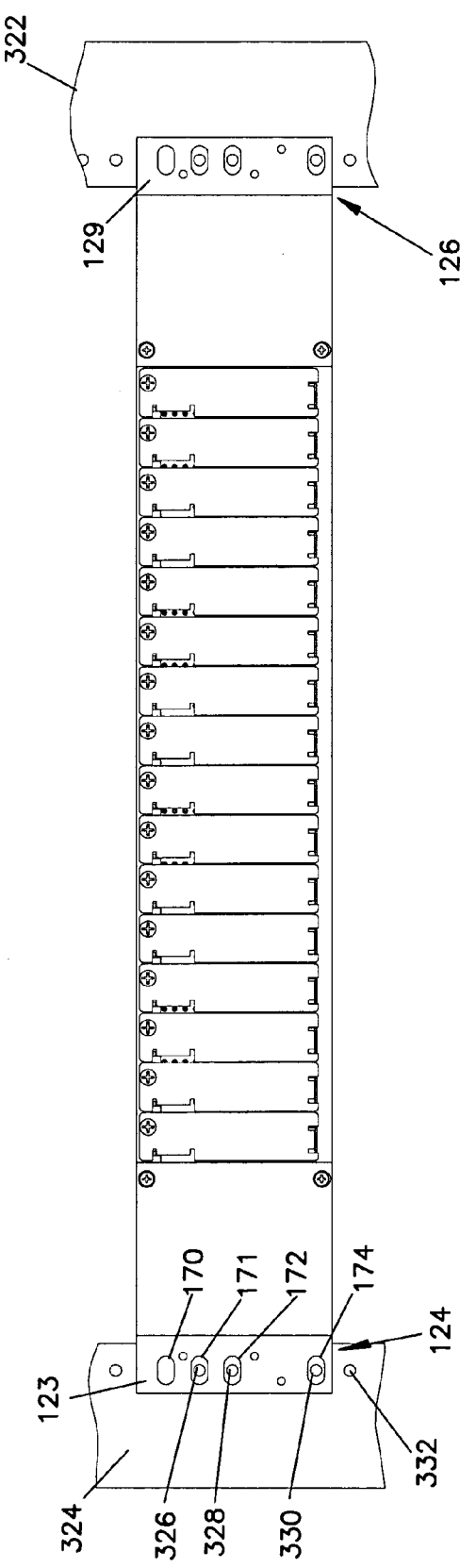
FIG. 44 is a front view of the empty chassis mounted in the EIA rack using the first mounting method.

For the first method of mounting shown in FIGS. 43 and 44, the rack holes 171, 172, and 174 of the brackets 124, 126 align with three contiguous mounting holes 326, 328, and 330 of the rails 322, 324. The mounting holes 326 and 328 are of one pair, and mounting hole 330 is paired with mounting hole 332. Both the mounting hole 332 of the rails 322, 324 and the rack hole 170 of the brackets 124, 126 are unused in this method. The chassis 100 is fastened to the rails 322, 324 through screws that engage the rack holes 171, 172, and 174 and the mounting holes 326, 328, and 330. Multiple chassis 100 may be stacked one atop the next in the EIA rack using this first mounting method and a small gap will be provided between each chassis 100.

Figure 45:
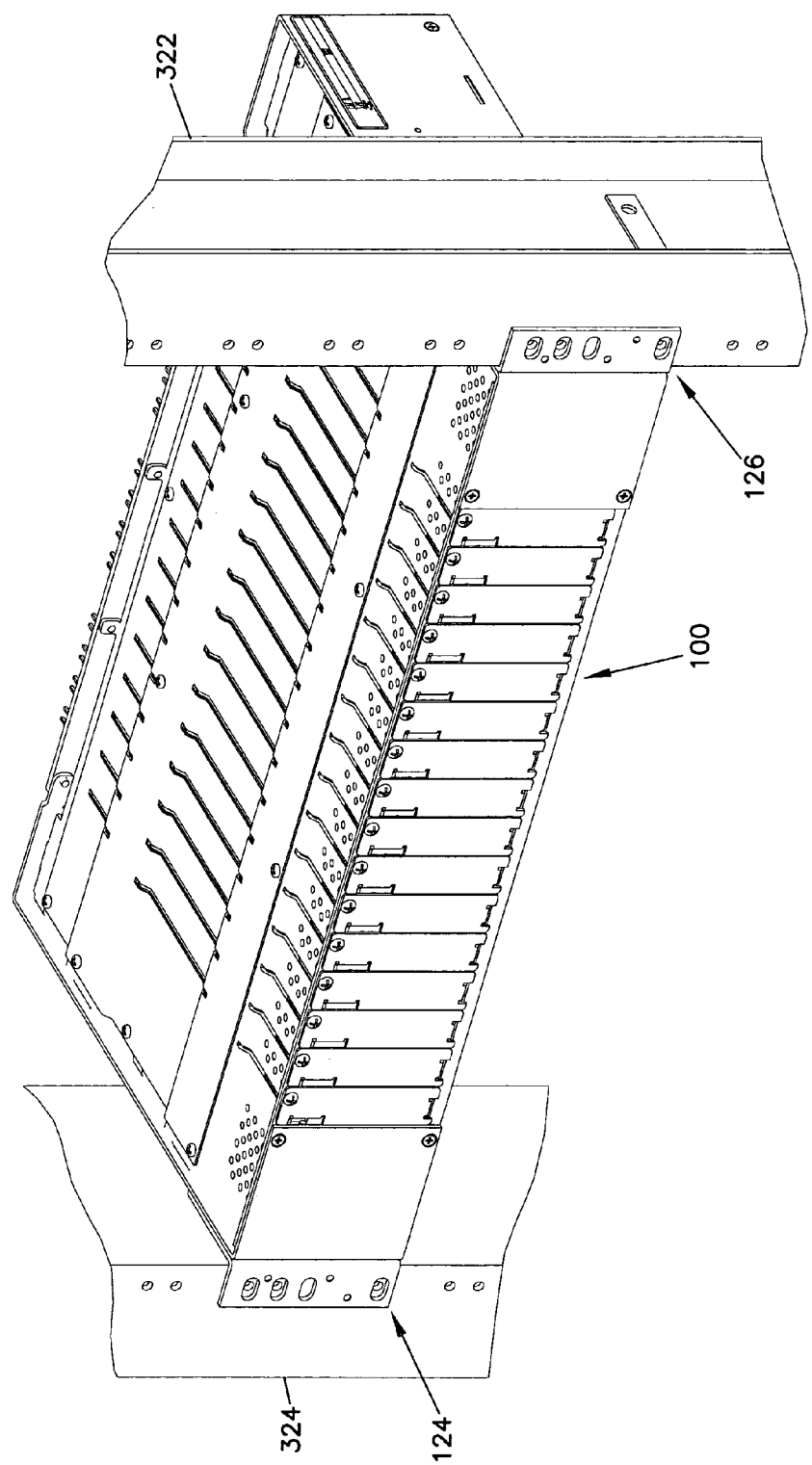
FIG. 45 is a perspective view of the empty chassis mounted in the EIA rack using a second mounting method.
Figure 46:
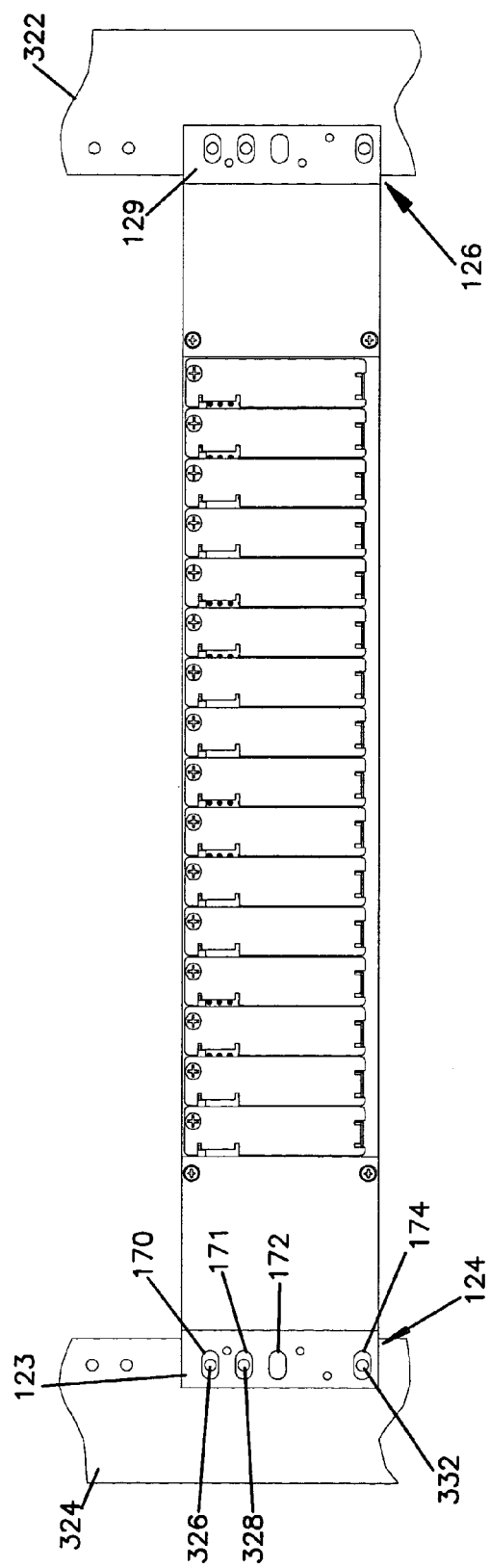
FIG. 46 is a front view of the empty chassis mounted in the EIA rack using the second mounting method.

For the second method of mounting shown in FIGS. 45 and 46, the rack holes 171, 172, and 174 of the brackets 124, 126 align with three mounting holes 326, 328, and 332 of the rails 322, 324. Mounting hole 330 of the rails 322, 324 and rack hole 172 of brackets 124, 126 are unused in this method. The chassis 100 is fastened to the rails 322, 324 through screws that engage the rack holes 171, 172, and 174 and the mounting holes 326, 328, and 332. Multiple chassis 100 may be stacked one atop the next in the EIA rack using the second mounting method as well and a small gap will be provided between each chassis 100.

Figure 47:
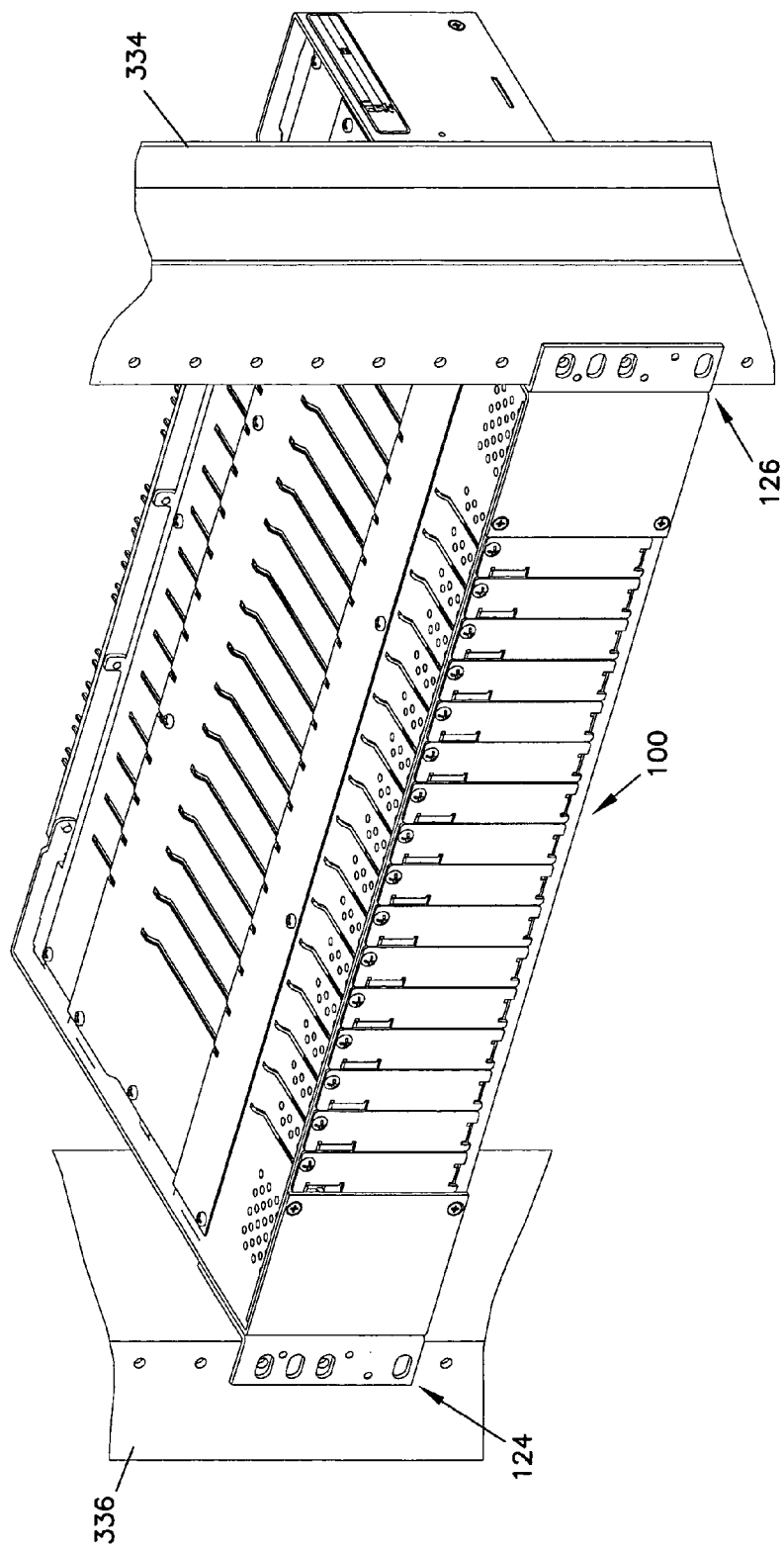
FIG. 47 is a perspective view of the empty chassis mounted in a WECO rack.
Figure 48:
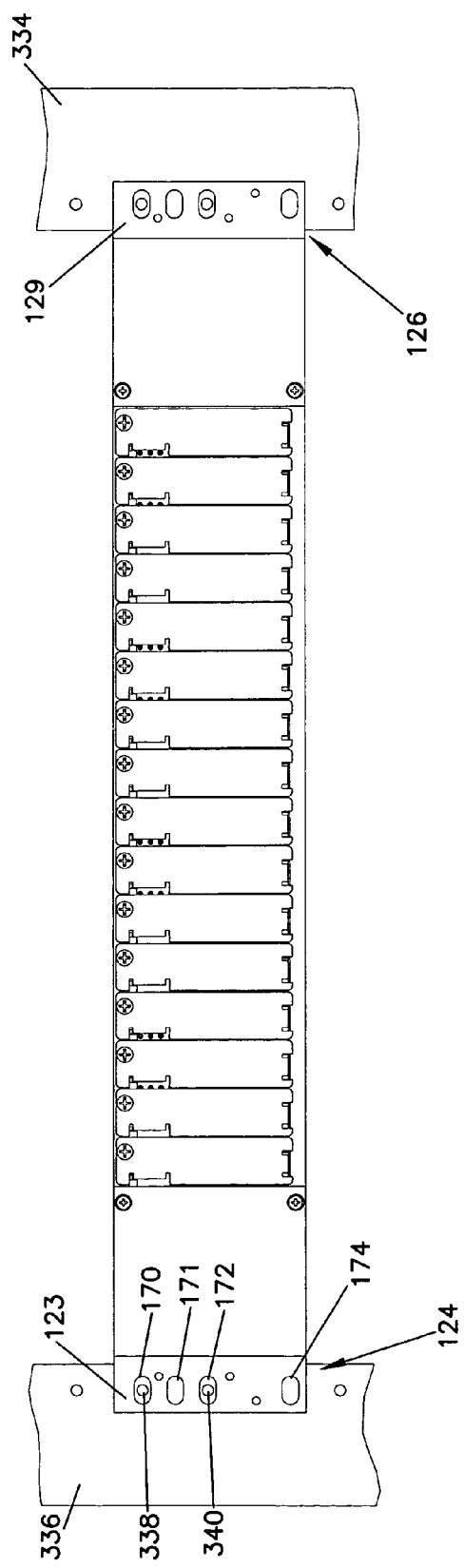
FIG. 48 is a front view of the empty chassis mounted in the WECO rack.

The WECO rack of FIGS. 47 and 48 includes rails 334 and 336. The rails 334, 336 have mounting holes with consistent spacing distance between each adjacent mounting hole. Because the rails 334 and 336 and associated mounting holes of the WECO rack are spaced horizontally the same distance as those of the EIA rack and are more closely spaced horizontally than those of the ETSI rack, the chassis 100 includes brackets 124 and 126 mounted such that the narrow sides 123 and 129 extend from the chassis 100 while the narrow sides 125 and 127 abut the vertical sidewalls 120, 122 of the chassis 100.

The rack holes 170 and 172 of the brackets 124, 126 align with two contiguous mounting holes 338 and 340 of the rails 334, 336. The rack holes 171 and 174 of the brackets 124, 126 are unused with the WECO rack. The chassis 100 is fastened to the rails 334, 336 through screws that engage the rack holes 17 and 172 and the mounting holes 338 and 340. Multiple chassis 100 may be stacked one directly atop the next in the WECO rack.

FIGS. 8–10 and 13–15 show the chassis 100 loaded with circuit cards 208. Each circuit card 208 has a handle 156 that extends from a faceplate 210 of the circuit card 208 that the user may grip to insert or remove a circuit card 208 from the chassis 100. The faceplate 210 of each of the cards fills the card slot openings that are otherwise occupied by card slot covers 132.

Figure 13:
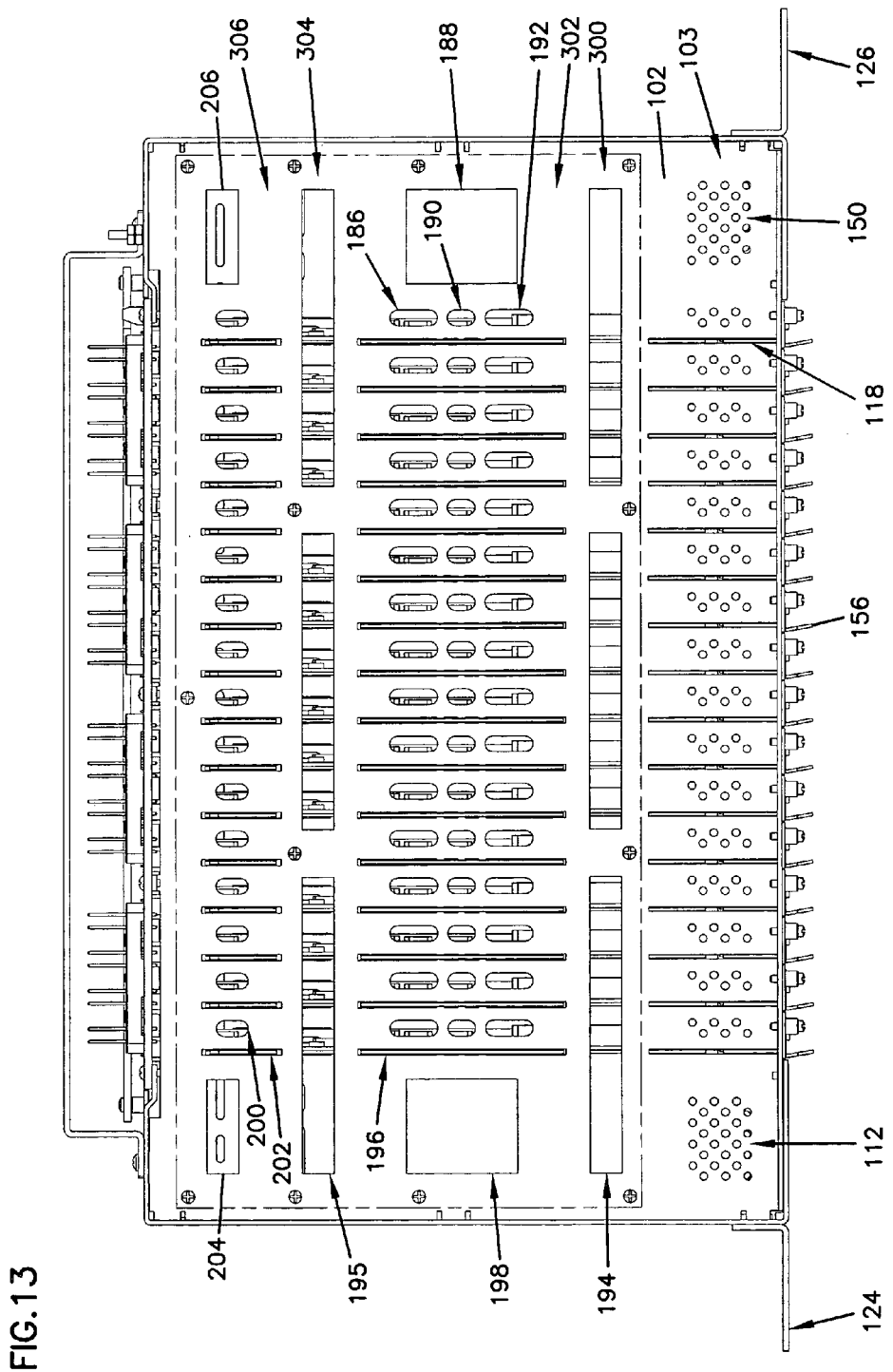
FIG. 13 is a top view of the loaded chassis with the top mesh cover removed.
Figure 14:
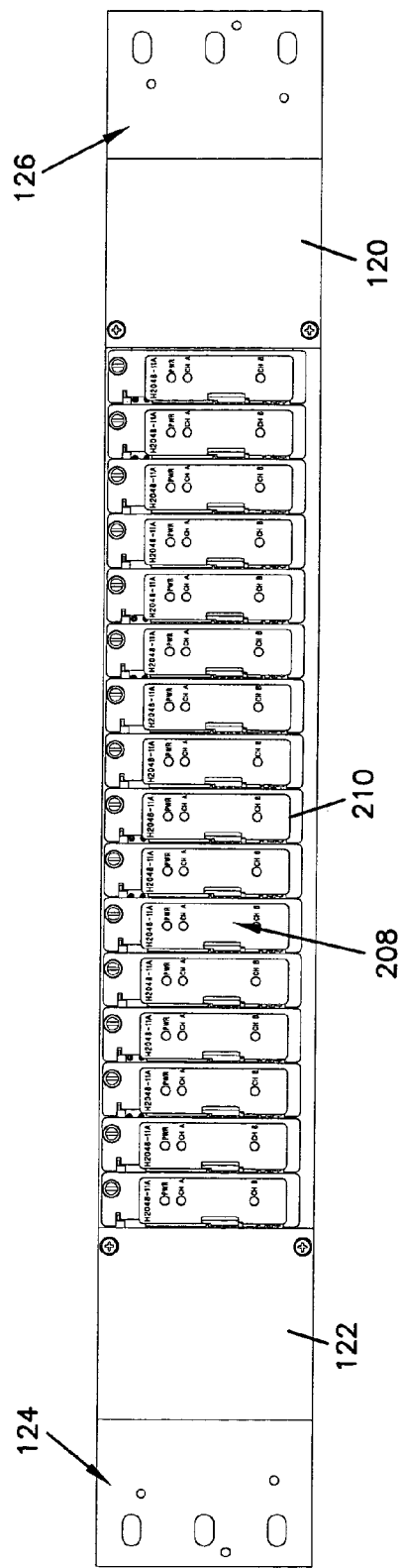
FIG. 14 is a front view of the loaded chassis.
Figure 15:
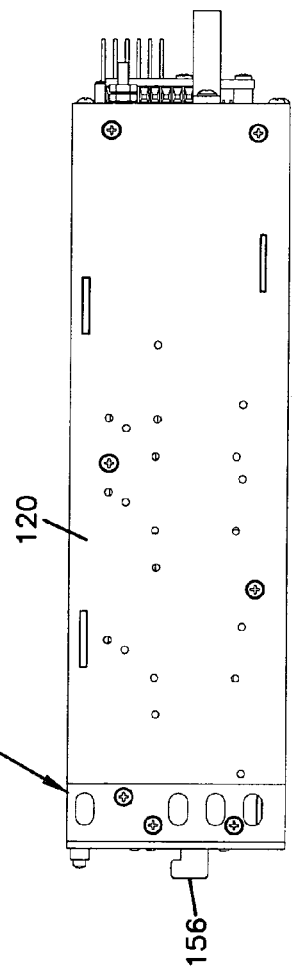
FIG. 15 is a right side view of the loaded chassis.

In FIG. 13, the first horizontal cover 104 is removed to show the first horizontal surface 102 as is also shown in FIG. 12. The first horizontal surface 102 includes the recessed area 103 adjacent to the first ridge 300. The first ridge 300 includes a row of elongated openings 194. The first ridge 300 is also adjacent to the recessed area 302. The recessed area 302 includes the second row of fin slots 196. Between each adjacent pair of fin slots 196 lies openings from a first row 192, a second row 190, and a third row 186. Over the left and right empty regions lie additional large ventilation holes 198 and 188, respectively.

Adjacent to the recessed area 302 is the second ridge 304 of the first horizontal surface 102. The second ridge 304 includes a row of elongated openings 195. Adjacent to the second ridge 304 is the recessed area 306 that includes a row of fin slots 202. Between each adjacent pair of fin slots 202 lie openings from a row of openings 200. Over the left and right empty regions lie additional ventilation holes 204 and 206, respectively.

Figure 16:
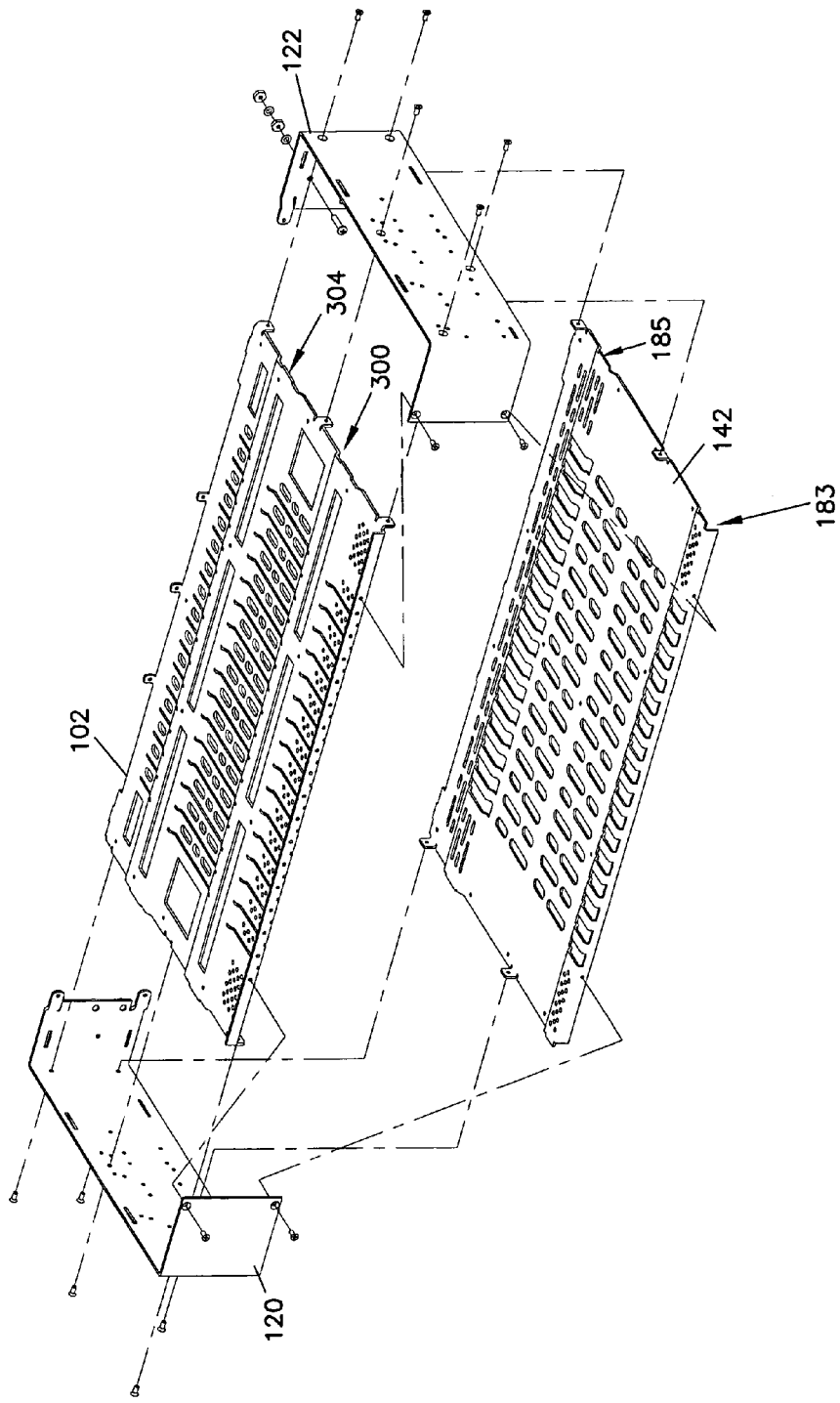
FIG. 16 is a top front exploded perspective view of the empty chassis.
Figure 17:
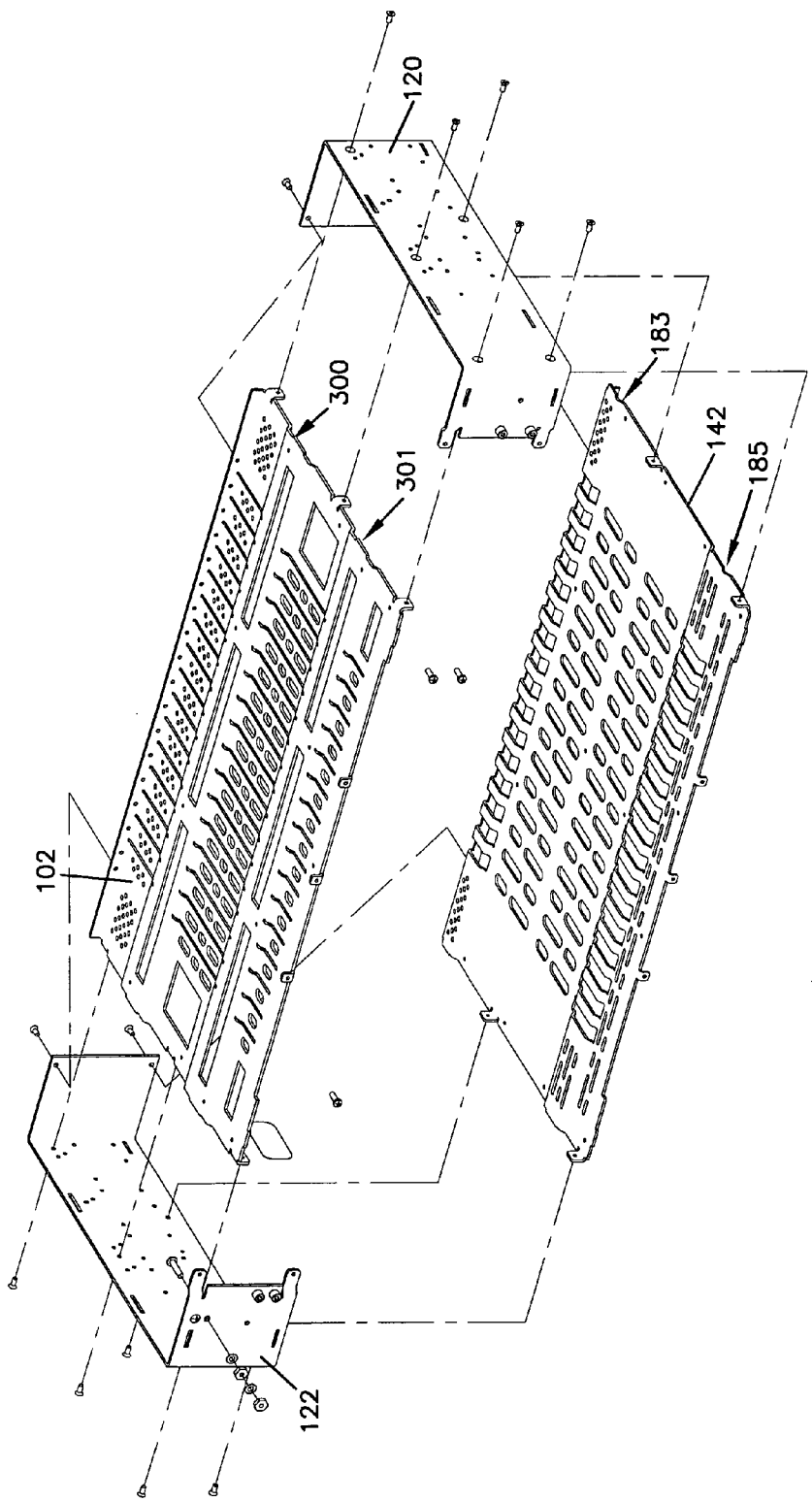
FIG. 17 is a top rear exploded perspective view of the empty chassis.

FIGS. 16 and 17 shows exploded views of the chassis 100 without the first horizontal cover 104 and the second horizontal cover 154. From these exploded views, the wrap-around structure of the vertical sidewalls 120 and 122 can be seen. Additionally, the placement of the ridges 300, 304 in the first horizontal surface 102 in relation to the placement of the ridges 183, 185 in the second horizontal surface 142 is visible as is the pattern of openings in both surfaces.

Figure 18:
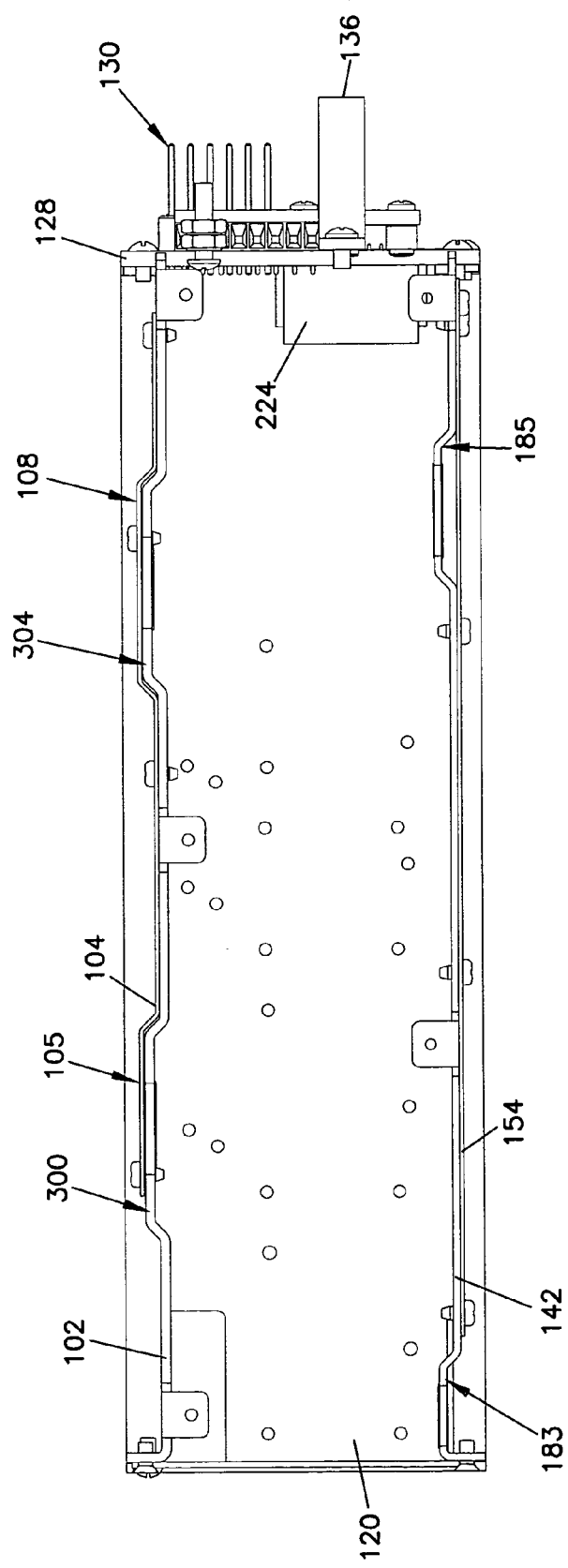
FIG. 18 is a right side view of the empty chassis with the right side panel removed.

FIG. 18 shows a right side view of the empty chassis 100 with the right vertical sidewall 122 removed. The left vertical sidewall 120 can be seen as no cards are positioned in the chassis 100 to obstruct the view of the sidewall 120. This side view illustrates the mounted relationship of the card connector 224 and the external connector 130 of the backplane 128. Also illustrated by FIG. 18 is the alignment and overlapping position of the ridges 105 and 108 of the first horizontal cover 104 in relation to the ridges 300 and 304, respectively, of the first horizontal surface 102. The ridges 183 and 185 of the second horizontal surface 142 can be seen as can the second horizontal cover 154 which does not include a ridge aligned with the ridge 185 in this embodiment.

Figure 19:
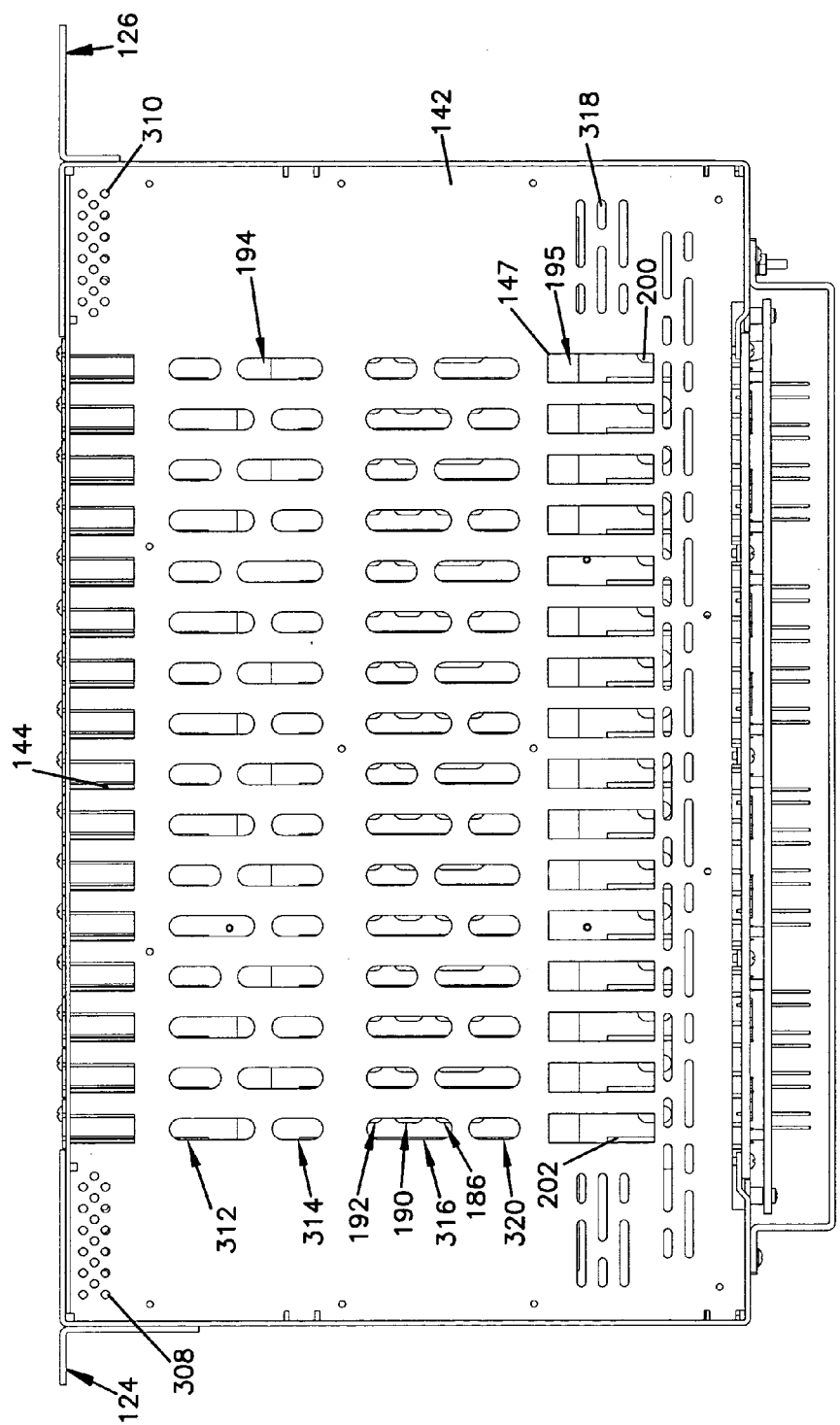
FIG. 19 is a bottom view of the empty chassis with the bottom mesh cover removed.

FIG. 19 shows an exterior view onto the second horizontal surface 142 of the chassis 100 with the mesh cover 154 removed. The second horizontal surface 142 includes the first row of knockouts 144 at the front of the chassis 100. On each side of the knockouts 144 are ventilation holes 308 and 310 over the empty side areas of the chassis. As shown, the bracket 124 is mounted with its narrow side extending outwardly from the chassis 100 while the bracket 126 is mounted with its wide side extending outwardly.

The second horizontal surface 142 includes the second row of knockouts 147 positioned near the rear of the chassis 100. Four rows of openings are positioned between the first row of knockouts 144 and the second row of knockouts 147 including a first row 312, a second row 314, a third row 316, and a fourth row 320. In the embodiment shown, the holes of a row alternate between long and short from one column to the next adjacent column. Between the rear of the chassis 100 and the second row of knockouts 147 are several smaller openings 318 that provide additional ventilation.

Because FIG. 19 shows an empty chassis 100, the positioning of the ventilation structures of the first horizontal surface 102 relative to ventilation structures of the second horizontal surface 142 can be seen. The elongated opening 194 of the ridge 300 of the first horizontal surface 102 can be seen through the first row 312 and second row 314 of openings in the second horizontal surface 142. Likewise, the elongated opening 195 of the ridge 304 can be seen through the second row of knockouts 147. The first row 186, second row 190, and third row 192 of openings of the first horizontal surface that lie between ridges 300 and 304 can be seen through the openings 316 and 320 indicating a partial vertical alignment of openings between the first horizontal surface 102 and the second horizontal surface 142. The third row of fin slots 202 of the first horizontal surface 102 and the rear row of openings 200 can be also been seen through the second row of knockouts 147.

Figure 20:
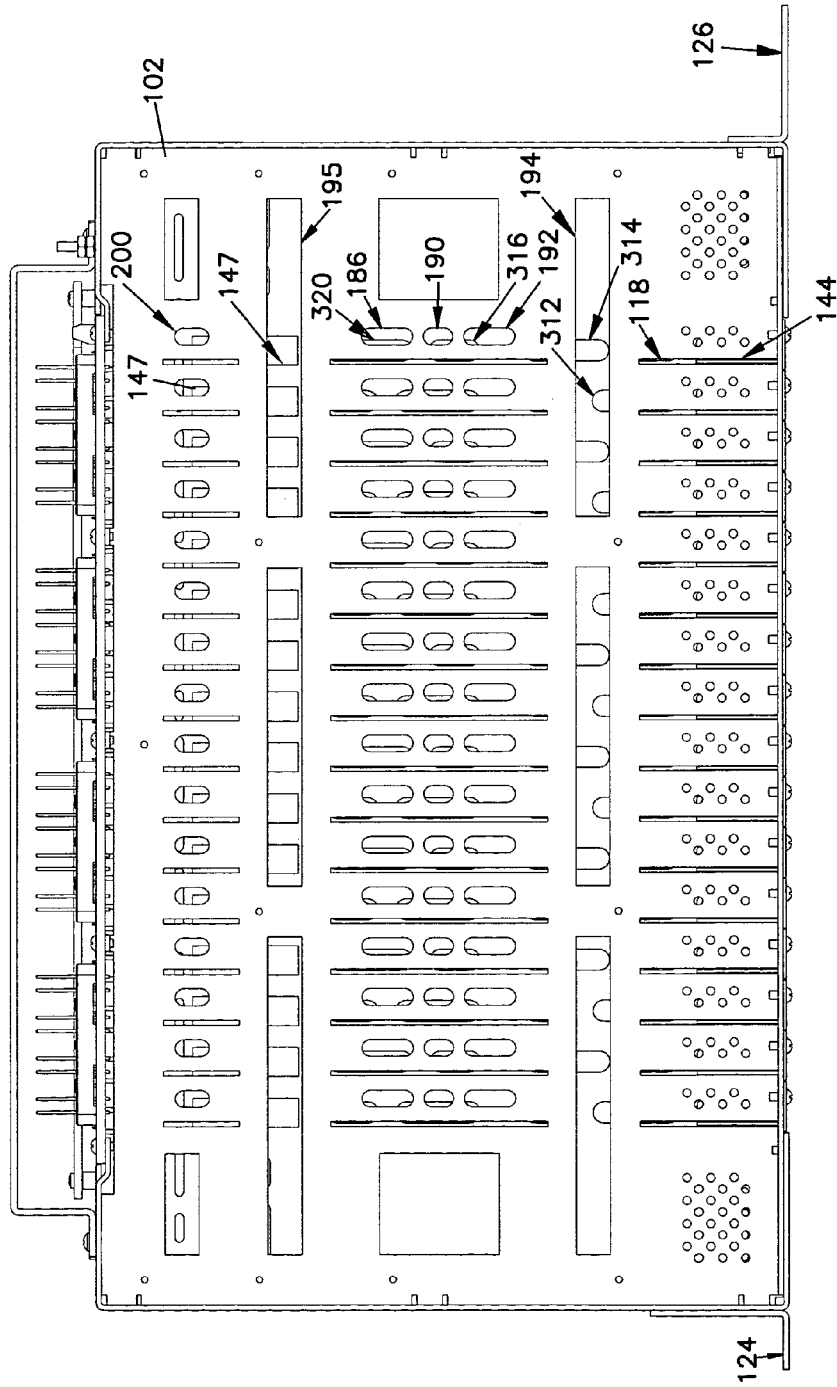
FIG. 20 is a top view of the empty chassis with the top mesh cover removed.

To further illustrate the relation of the ventilation structures of the second horizontal surface 142 in relation to those of the first horizontal surface 102, FIG. 20 shows an empty chassis 100 viewed onto the first horizontal surface 102 with the first horizontal cover 104 removed. The second row of knockouts 147 can be seen through the rear row of openings 200. The knockouts 147 can also be seen through the elongated opening 195 of the ridge 304. The third row 316 and fourth row 320 of openings of the second horizontal surface 142 can be seen through the first row 186, second row 190, and third row 192 of openings of the first horizontal surface 102. The first row 312 and second row 314 of openings of the second horizontal surface 142 can be seen through the elongated opening 194 of the ridge 300. The first row of knockouts 144 can be seen through the first row of fin slots 118.

Air rises through the bottom of the chassis 100 and passes by the circuit cards 208 installed between the first horizontal surface 102 and the second horizontal surface 142 as the components of the circuit cards 208 warm the air. In the embodiment shown, because the openings of each horizontal surface are not directly aligned, the warmed air is not able to rise directly from bottom to top within the chassis 100 but may be channeled forward, backward, and/or side-to-side before passing through the nearest hole in the first horizontal surface 102.

Figure 21:
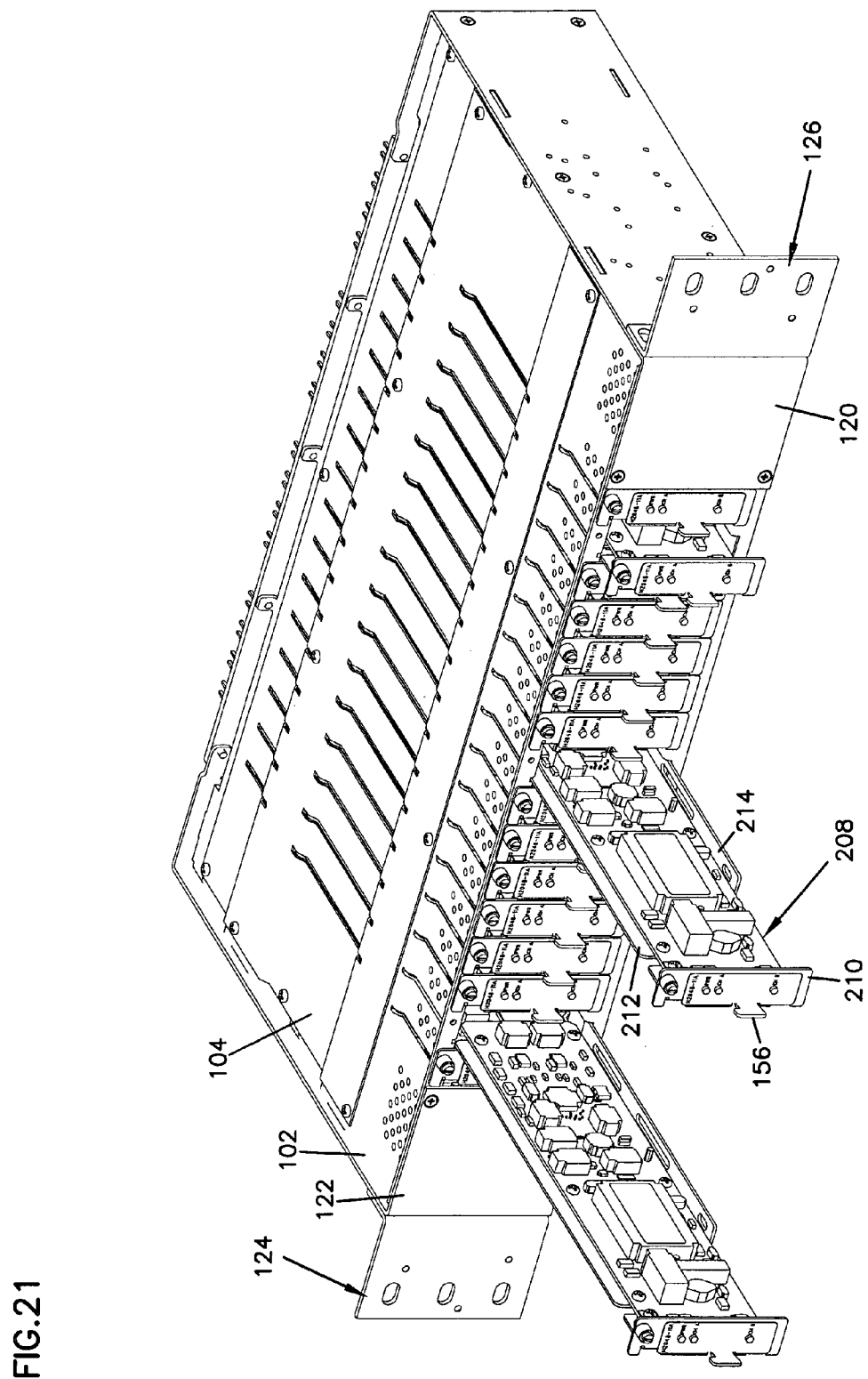
FIG. 21 is a top front perspective view of the chassis with cards being inserted.

FIG. 21 shows the chassis 100 filled with circuit cards 208 and having three cards partially inserted. The circuit cards include a fin 212 on one edge that is received by the fin slots of the first horizontal surface 102 and the first horizontal cover 104. The circuit card 208 also has a guide 214 on an opposite edge that fits within the knockout 144 of the ridge 183 of the second horizontal surface 142.

Figure 22:
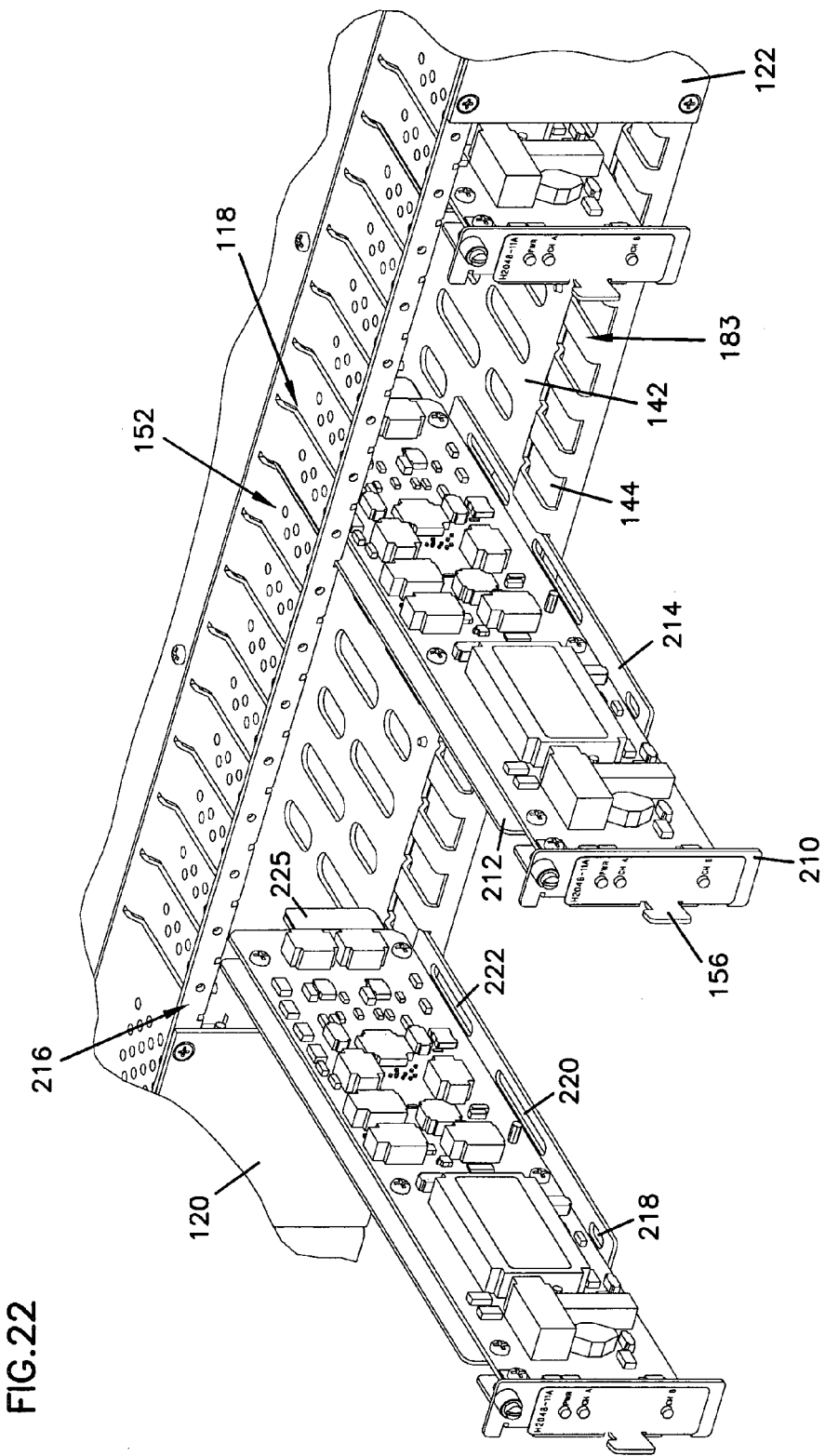
FIG. 22 is a top front perspective view of the chassis with three spaced cards being inserted in knock-outs and fin slots within horizontal surfaces of the chassis.
Figure 23:
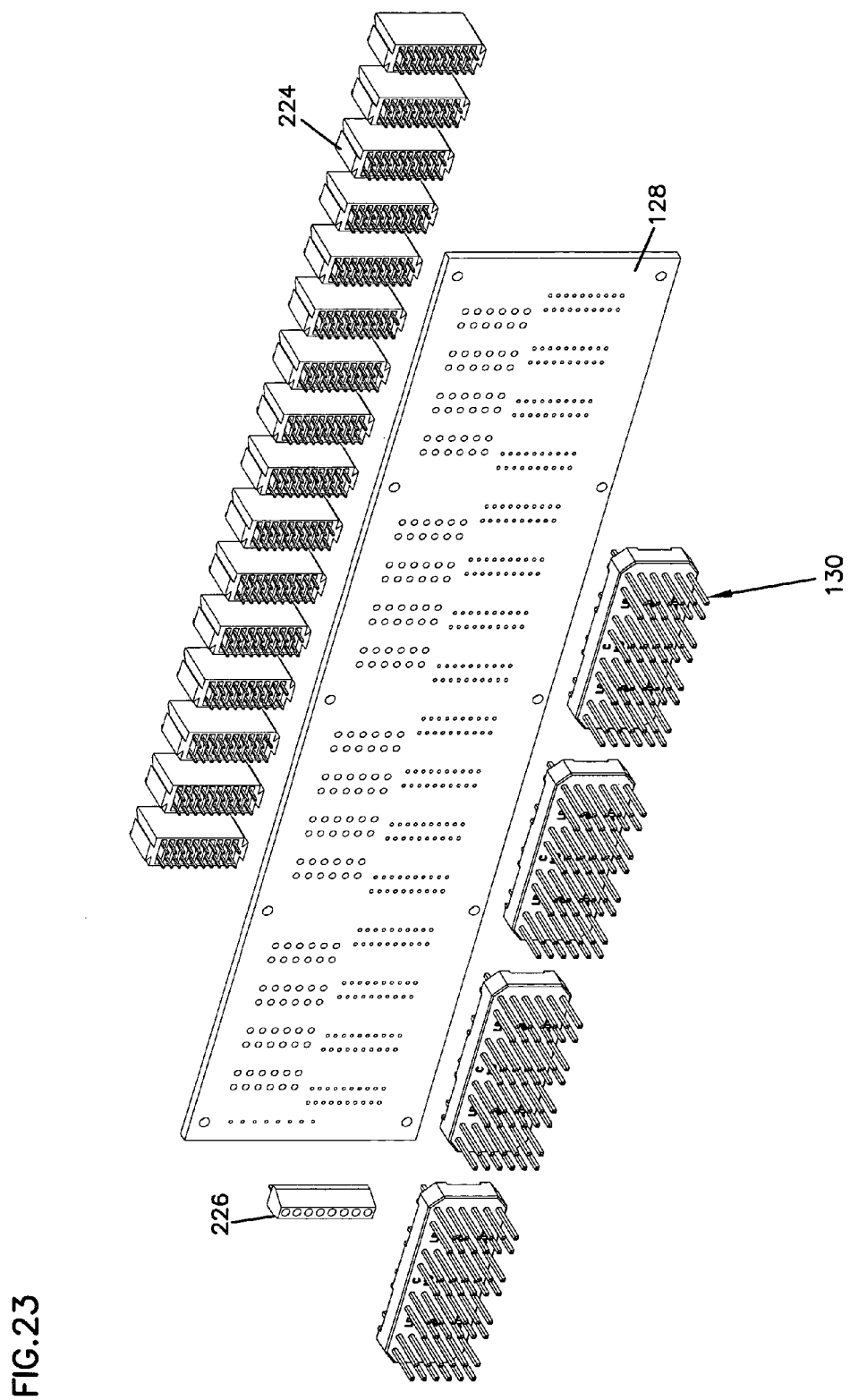
FIG. 23 is an exploded perspective view of the backplane.
Figure 27:
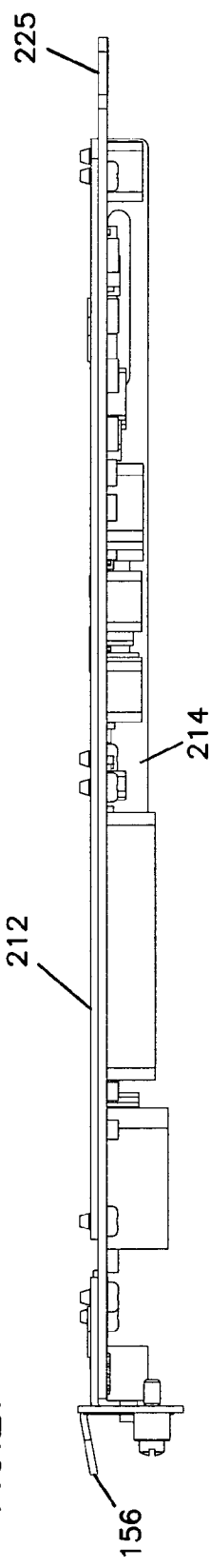
FIG. 27 is a top view of the circuit card.
Figure 29:
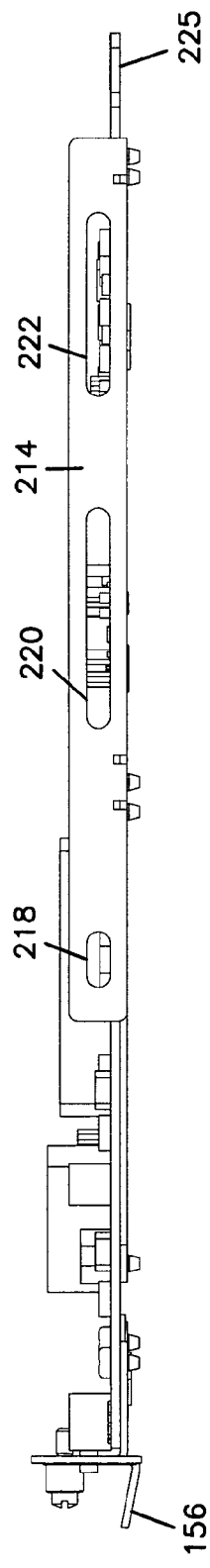
FIG. 29 is a bottom view of the circuit card.
Figure 32:
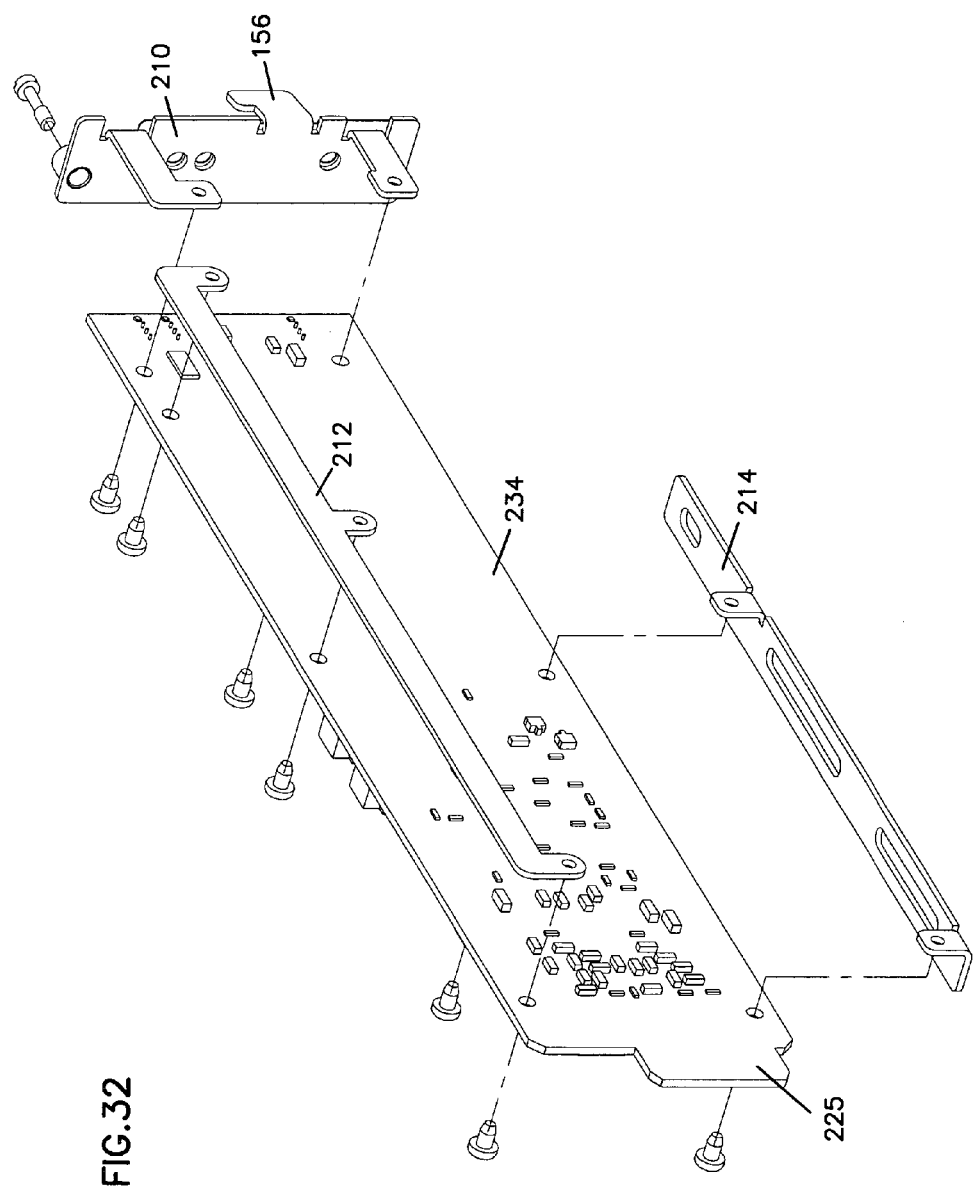
FIG. 32 is an exploded top rear perspective view of the circuit card.
Figure 33:
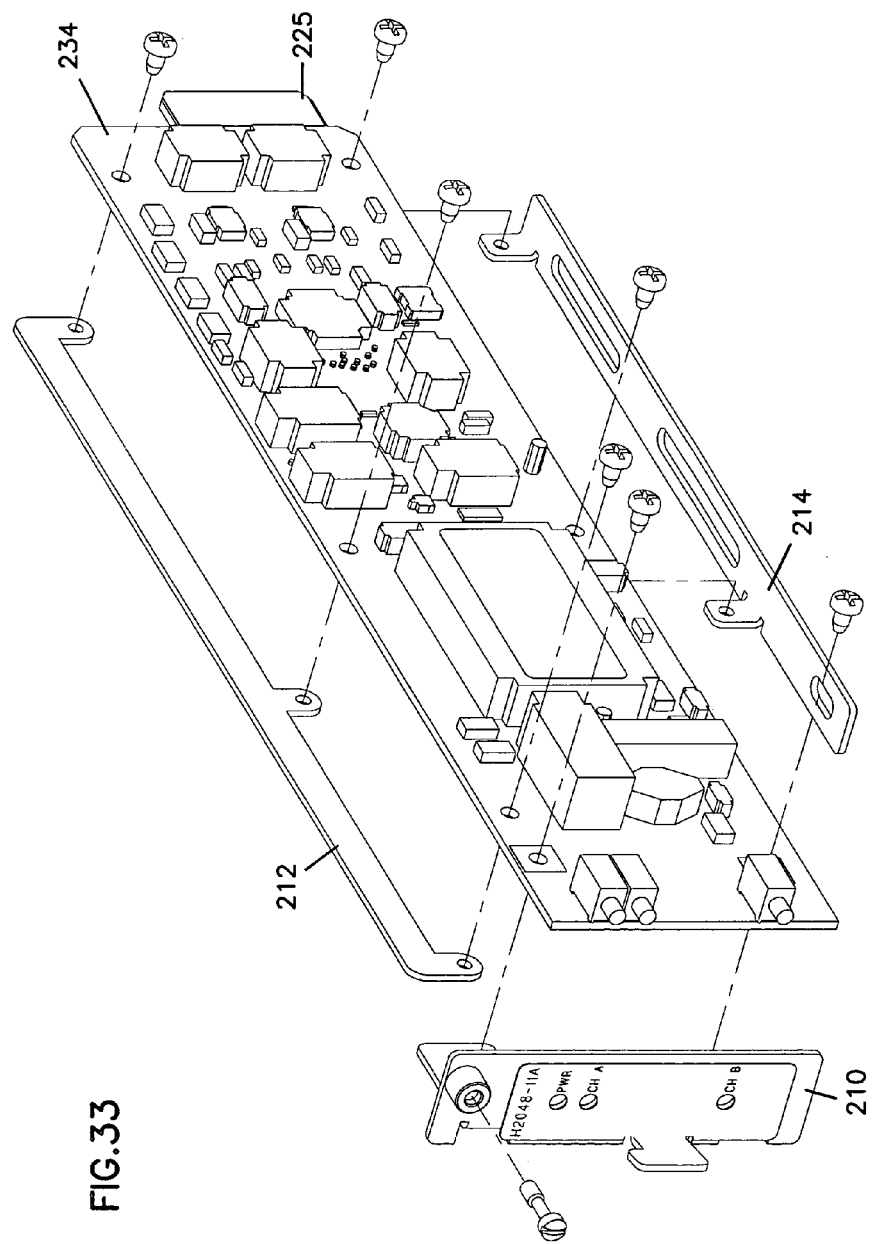
FIG. 33 is an exploded top front perspective view of the circuit card.

FIG. 22 more clearly shows the cooperation between the fin slots 118 of the first horizontal surface 102 and the fin 212 of the circuit card 208. The cooperation between the guide 214 and the knockout 144 of the first ridge 183 of the second horizontal surface 142 is also shown. The card 208 is positioned with the fin 212 in the slot 118 and the guide 214 in the knockout, and the card 208 is inserted until the faceplate 210 abuts the front edge 216 of the first horizontal surface 102. At that point, a connector 225 of the card 208 engages a card connector 224 of the backplane 128 discussed below. Also, in this embodiment holes 218, 220, and 222 of the guide 214 have at least partially aligned with holes 312, 314, and 316 in the second horizontal surface 142 once the card 208 is fully inserted. This alignment is more clearly shown in FIG. 35.

Figure 2:
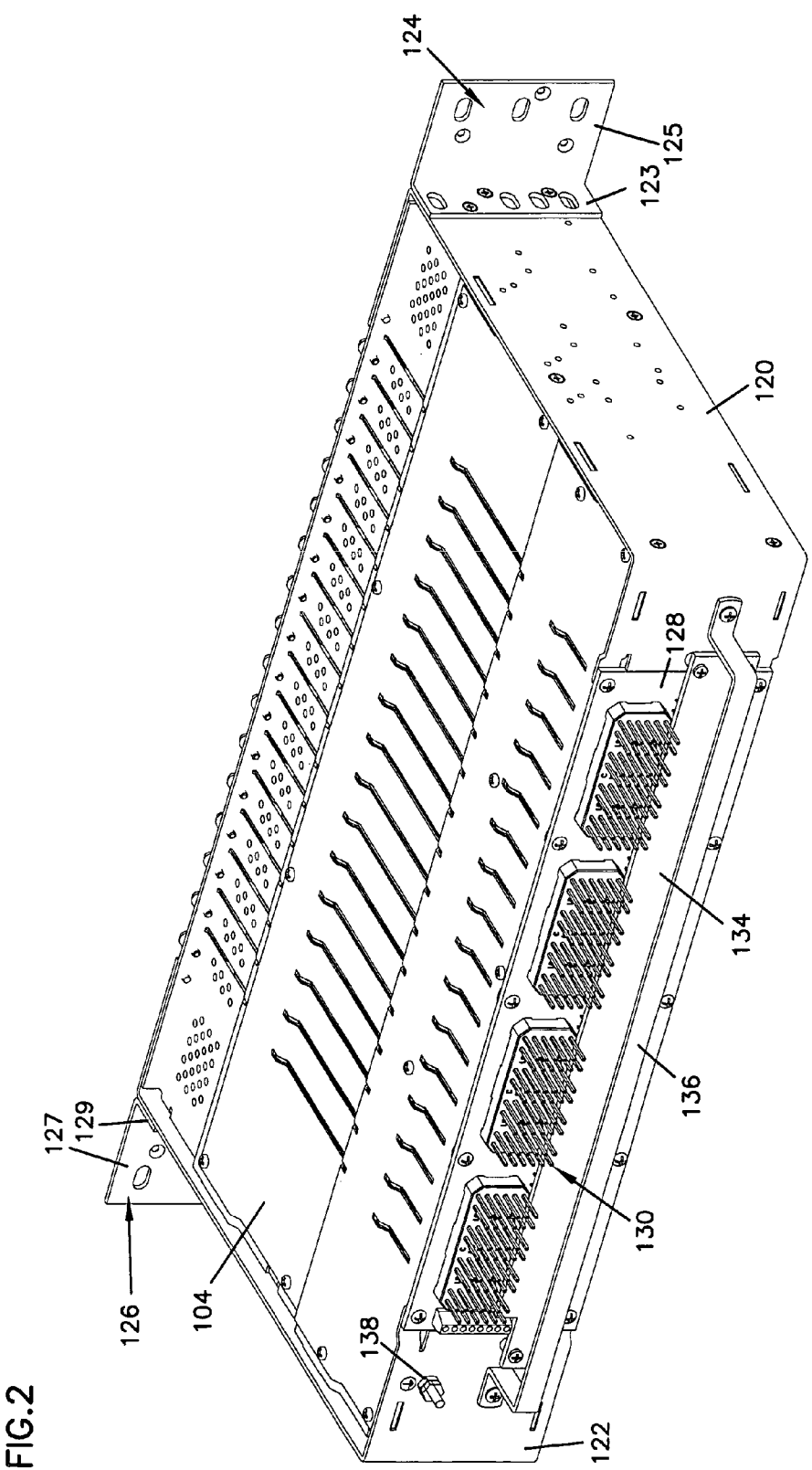
FIG. 2 is a top rear perspective view of the empty chassis.
Figure 3:
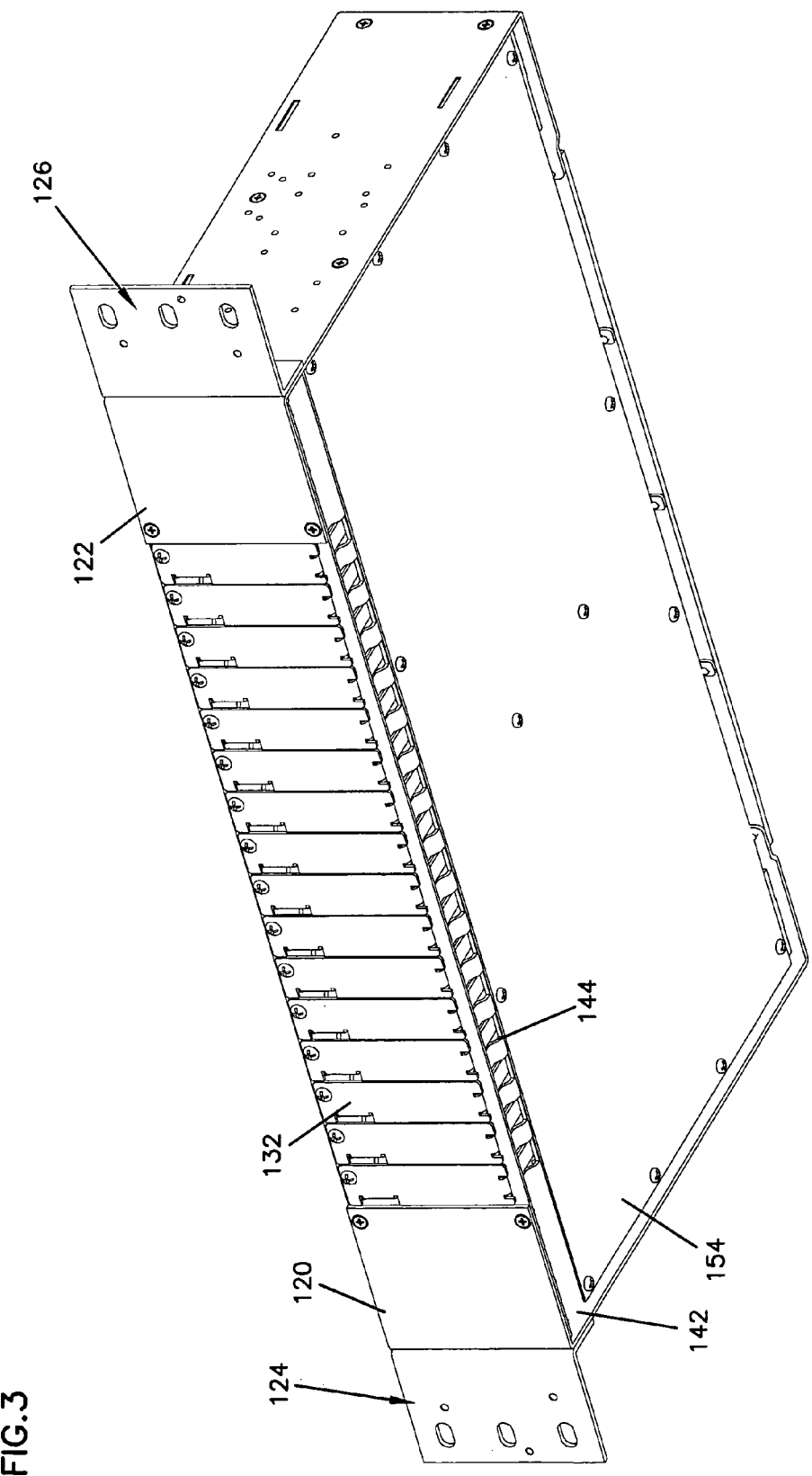
FIG. 3 is a bottom front perspective view of the empty chassis.
Figure 4:
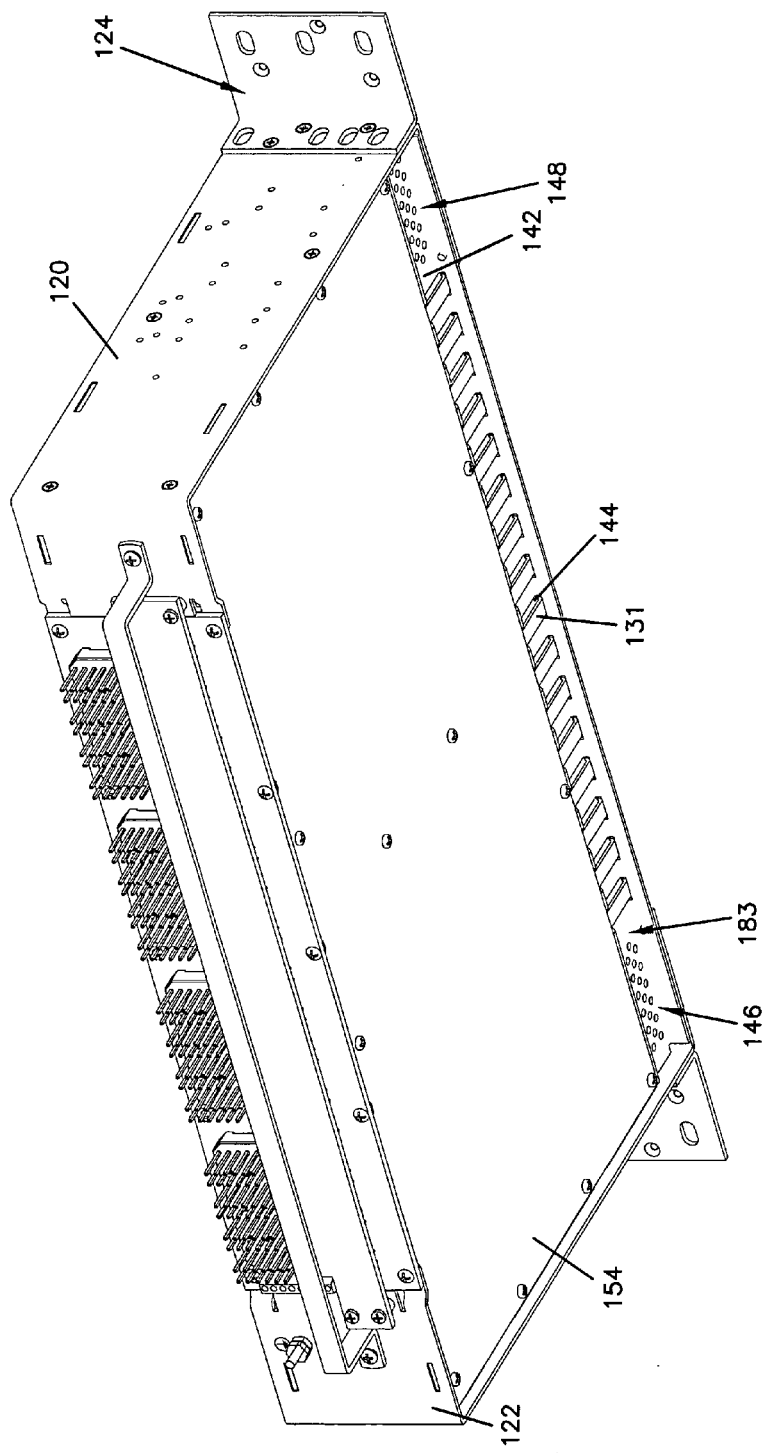
FIG. 4 is a bottom rear perspective view of the empty chassis.
Figure 5:
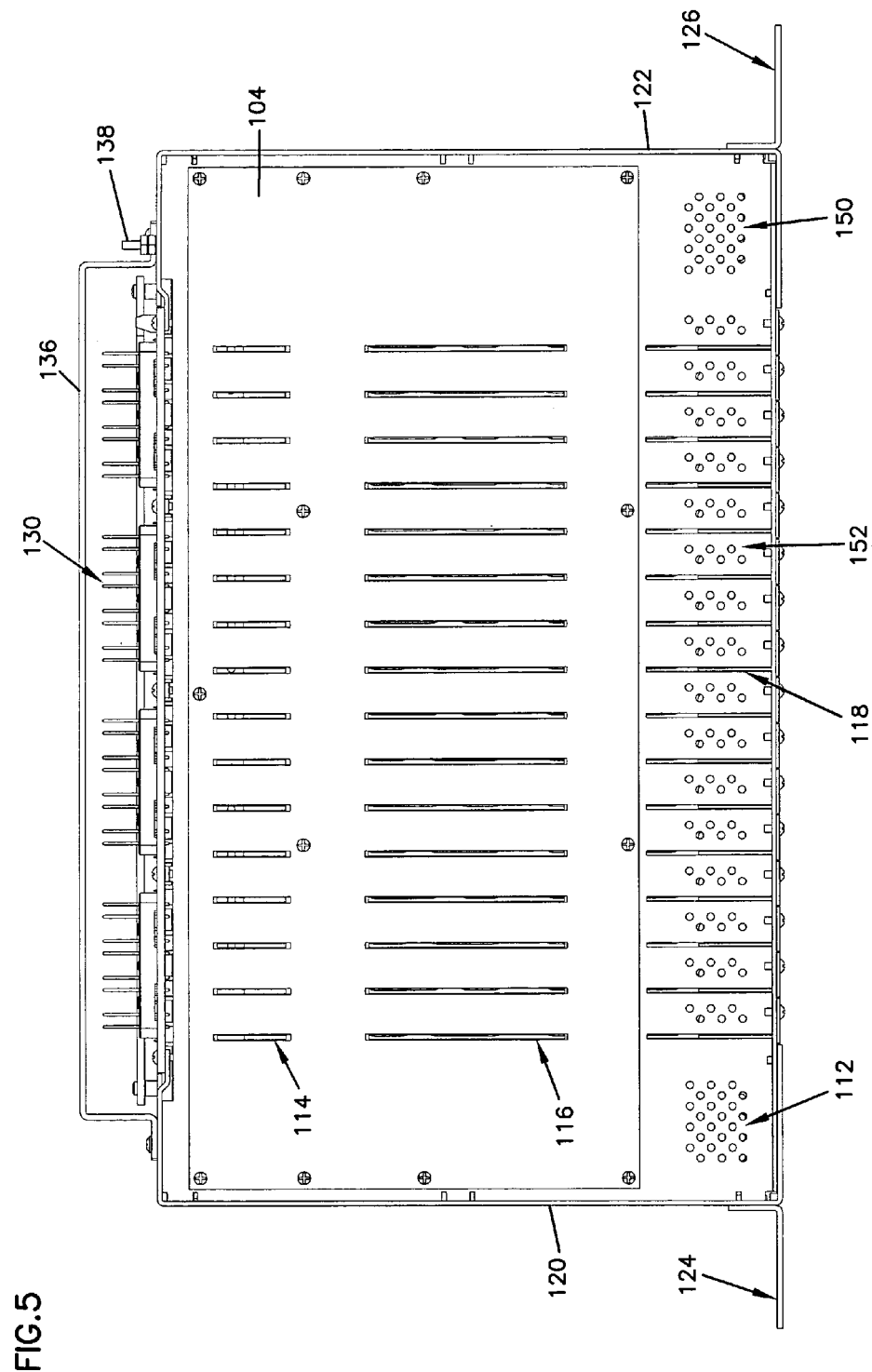
FIG. 5 is a top view of the empty chassis.
Figure 6:
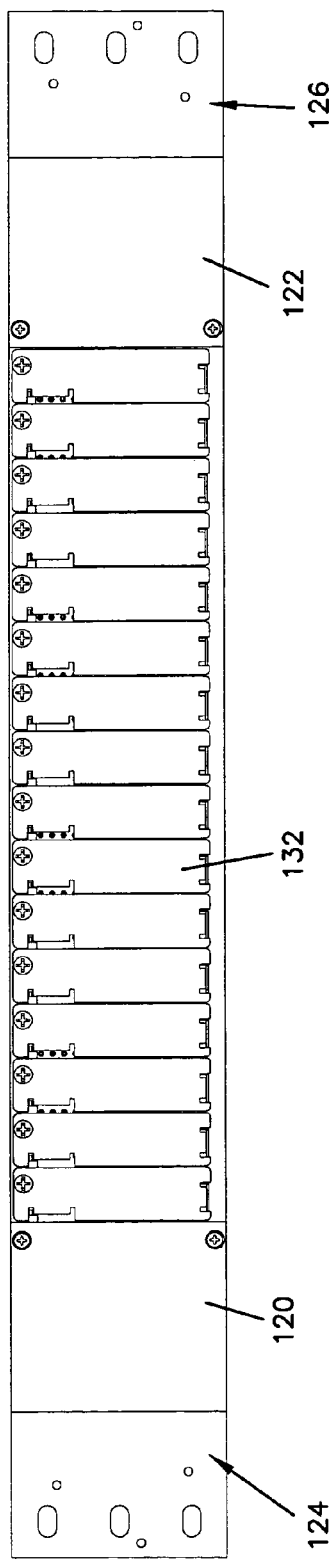
FIG. 6 is a front view of the empty chassis.
Figure 7:
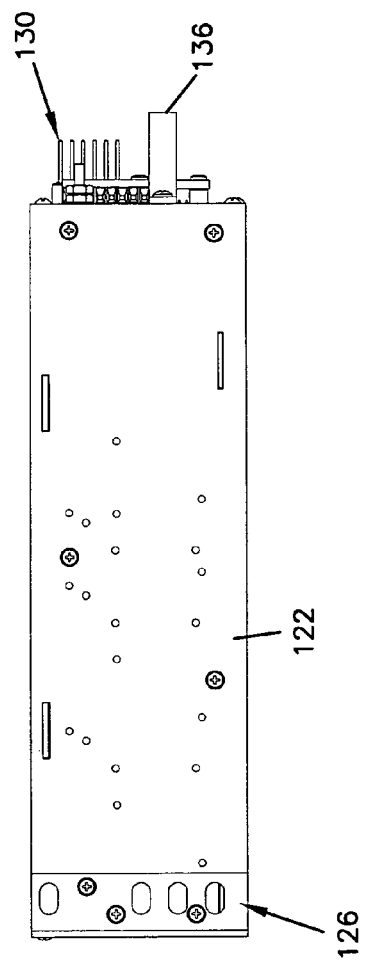
FIG. 7 is a right side view of the empty chassis.
Figure 8:
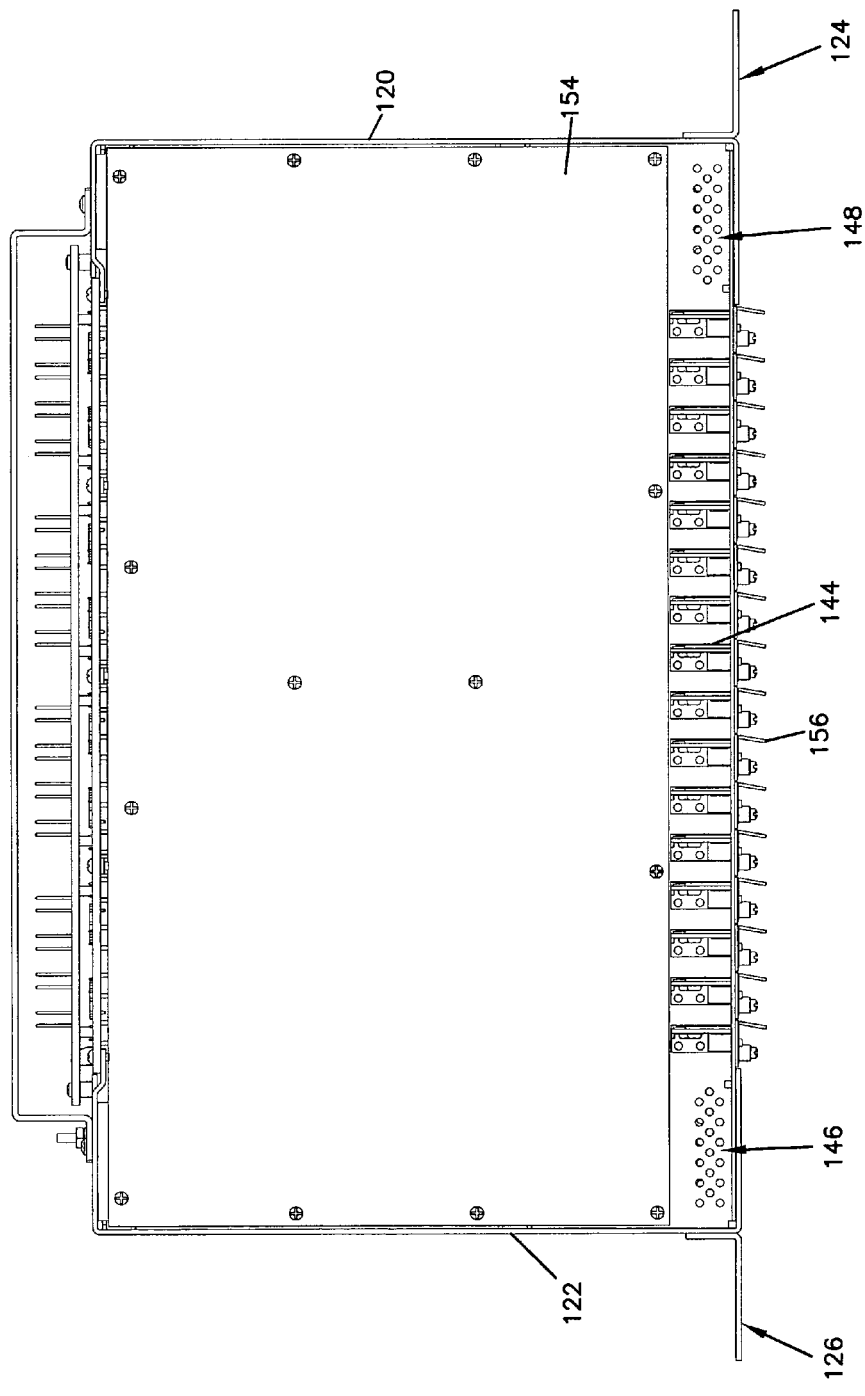
FIG. 8 is a bottom view of a loaded chassis.

FIGS. 23–26 are several views of the backplane 128. The backplane 128 is a printed circuit board and it has external connectors 130 mounted to one side and card connectors 224 mounted to the other side. A power supply connector 226 is also mounted to the side with the external connectors 130. The connector 225 of the circuit card 208 mates to the card connector 224 once the card 208 is fully inserted in the chassis 100, and the card connector 224 establishes electrical communication between the card 208 and the external connector 130. As shown in FIG. 2, the backplane 128 of the chassis 100 is vertical relative to the horizontal surfaces 102, 142, and the vertical backplane 128 is positioned between and perpendicular to the two vertical sidewalls 120, 122.

FIGS. 27–33 are several views of the circuit card 208. The circuit card 208 includes the fin 212, guide 214, faceplate 210, finger 156, and connector 225 previously discussed. The circuit card 208 also includes a printed circuit board 234 that has circuitry 236 mounted to it. The circuitry 236 may be repeater circuitry as discussed below. Light emitting diodes (LEDs), such as power LED 228, channel A LED 230, and channel B LED 232, may protruded from the faceplate 210. The LEDs 228, 230, and 232 may illuminate as one or more colors as controlled by circuitry 236 to indicate the state of operation of the circuitry 236.

Figure 34:
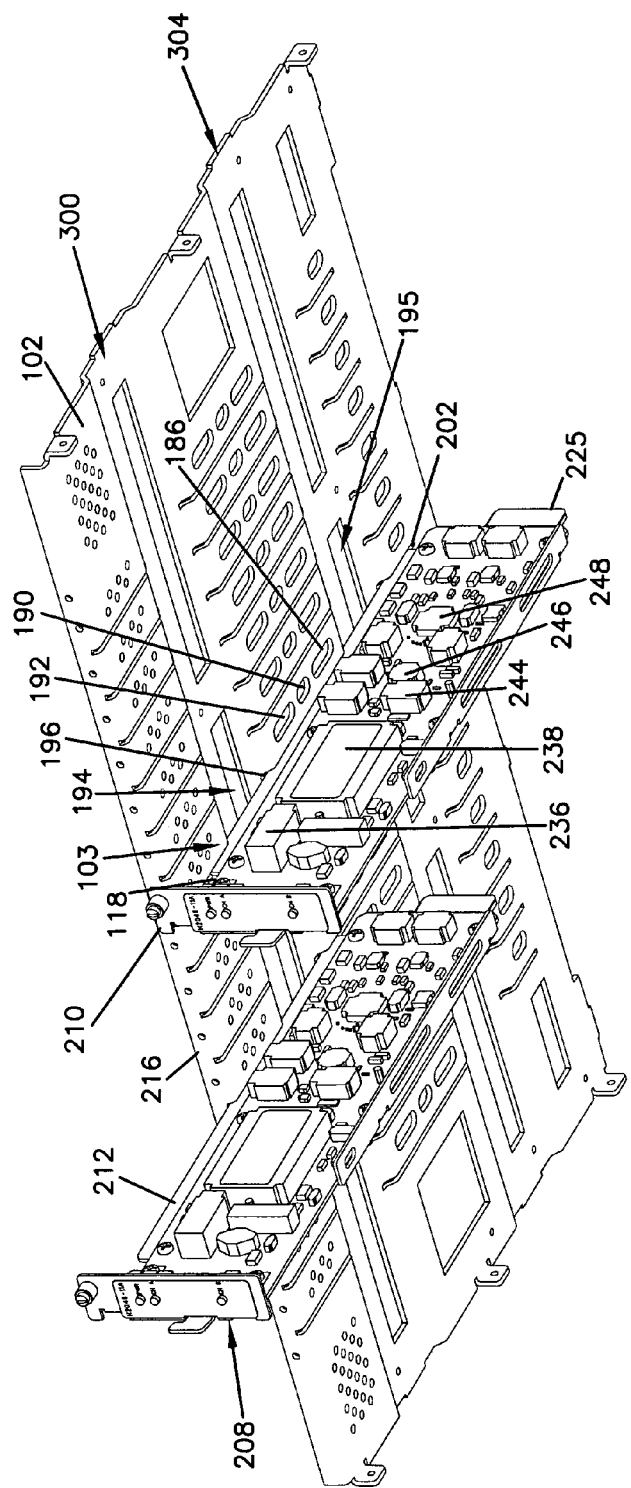
FIG. 34 is a perspective view of the card mounted in relation to a top surface of the chassis.

FIG. 34 shows the card 208 mounted in the chassis 100 in relation to the first horizontal surface 102 and its ventilation structures. The fin 212 of the card 208 is positioned within the first row 118, second row 196, and third row 202 of fin slots. The card 208 is fully inserted once the faceplate 210 has contacted the front edge 216. The card 208 includes several components such as a capacitor 236, a DC-DC converter 238, a transceiver 248, relay 244, and programmable logic device 246 that are positioned, in this embodiment, relative to the structures of the first horizontal surface 102. These components are discussed in more detail below.

The capacitor 236 lies beneath the area 103 that restricts upward ventilation and causes air to be channel toward rearward areas of the chassis 100. The DC-DC converter 238 lies partially beneath the elongated opening 194 of ridge 300. The elongated opening 194 increases the ventilation over the DC-DC converter 238 which generates a significant amount of heat. The DC-DC converter 238 also partially lies beneath the row of openings 192. The relay 244 and programmable logic device 246 lie beneath the row 190 and row 186 of openings. The transceiver 248 lies partially beneath the elongated opening 195 of the second ridge 304 which increases the ventilation over the transceiver 248 that also generates a significant amount of heat.

Figure 35:
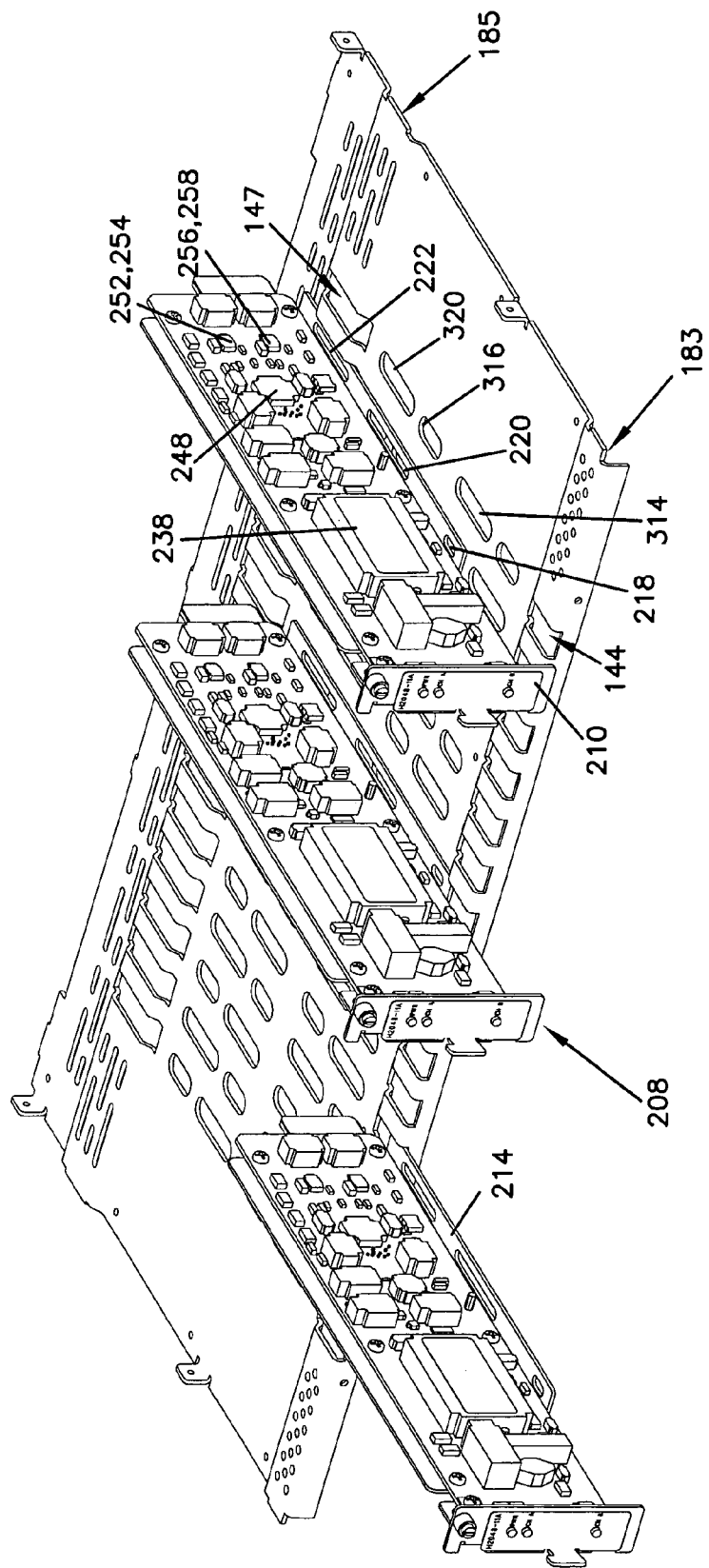
FIG. 35 is a perspective view of the card mounted in relation to a bottom surface of the chassis.

FIG. 35 shows the card 208 mounted in the chassis 100 in relation to the second horizontal surface 142 and its ventilation structures. The guide 214 of the card 208 is positioned within a knockout of the first row 144 of the first ridge 183 as the card 208 is being inserted. In this embodiment, once the card 208 is fully inserted, the guide 214 rests partially within a knockout of the second row 147 of the second ridge 185. The first hole 218 of the guide 214 comes to rest over the second row of openings 314 of the second horizontal surface 142. The second hole 220 of the guide 220 comes to rest over the third row 316 and fourth rows 320 of openings. The third hole 222 comes to rest over the second row of knockouts 147 in the second ridge 187. Thus, air is able to pass through the openings and knockouts of the second horizontal surface and pass through the guide 214 to absorb heat from the components of the card 208.

In the embodiment shown, the capacitor 236 lies over the first row of openings 312. The DC-DC converter 238 lies over the first row 312 and second row 314 of openings and over the first guide opening 218. The relay 244 and programmable logic device 246 lie over the third row 316 and fourth row 320 of openings and over the second guide opening 220. Amplifiers 252, 254 and 256, 258 included in this embodiment on the card 208 lie over the knockouts 147 and the third guide opening 222.

Figure 36A:
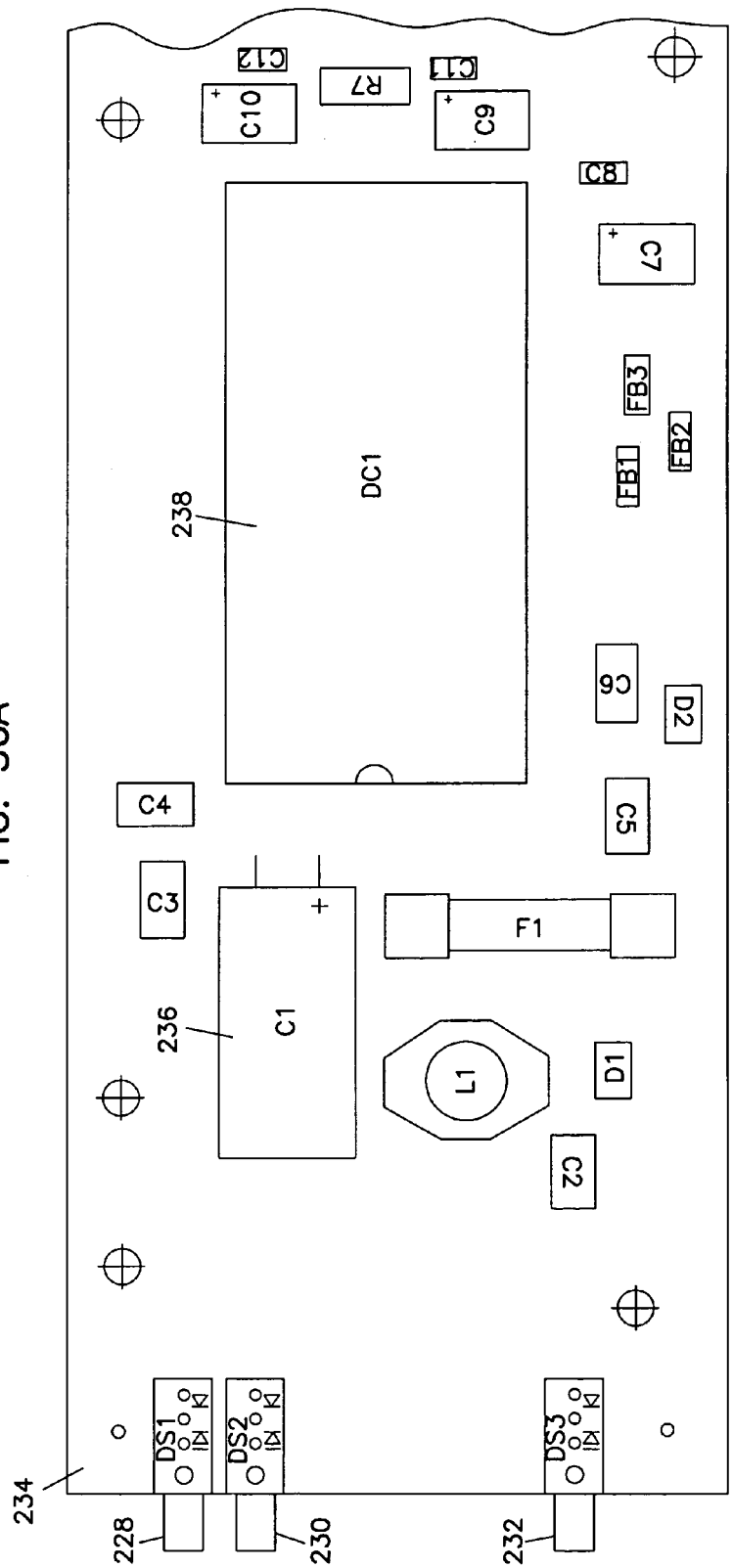
FIGS. 36A and 36B are a right side view of components mounted in relation to a circuit board of the circuit card.
Figure 36B:
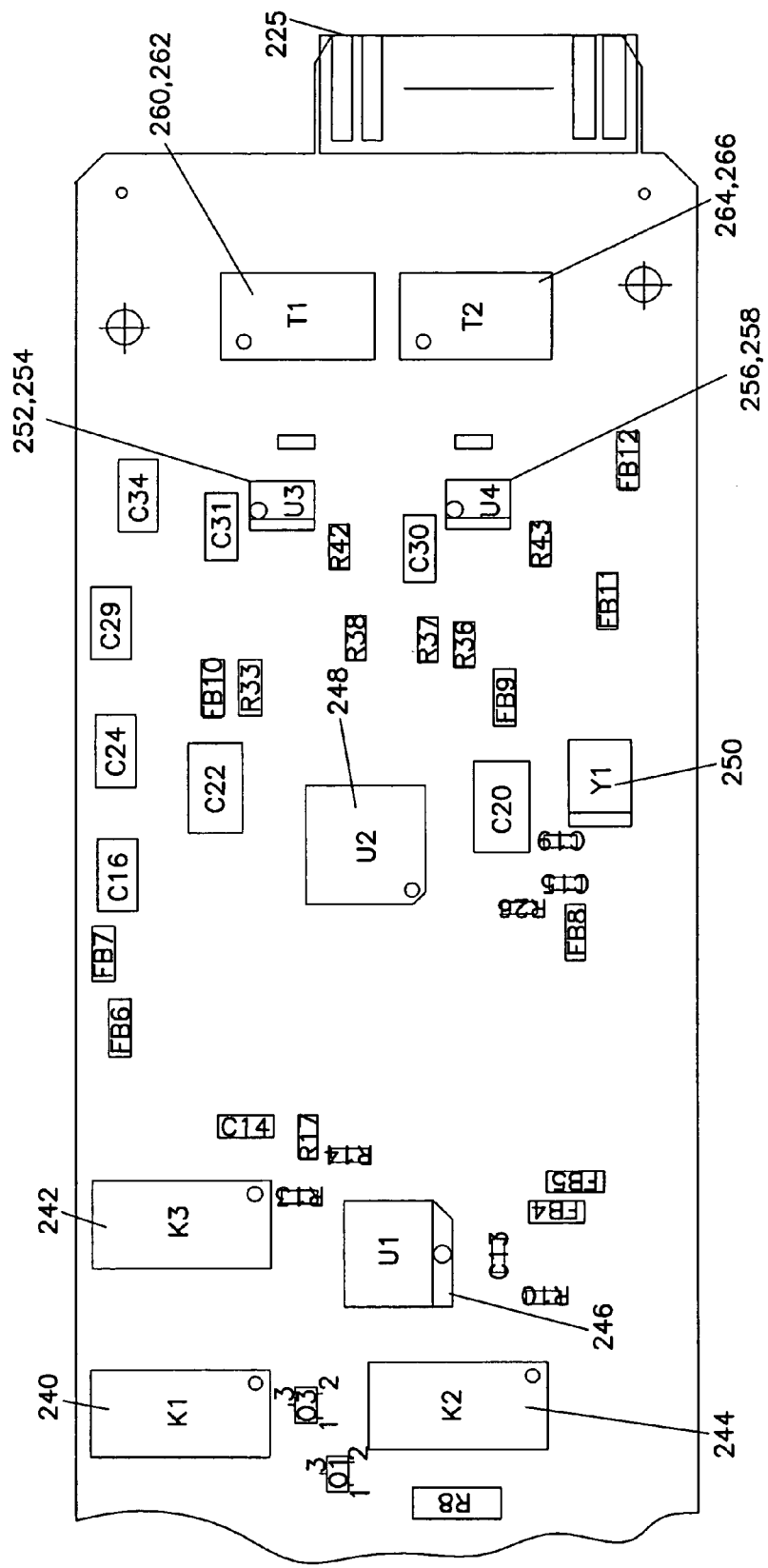
Figure 37A:
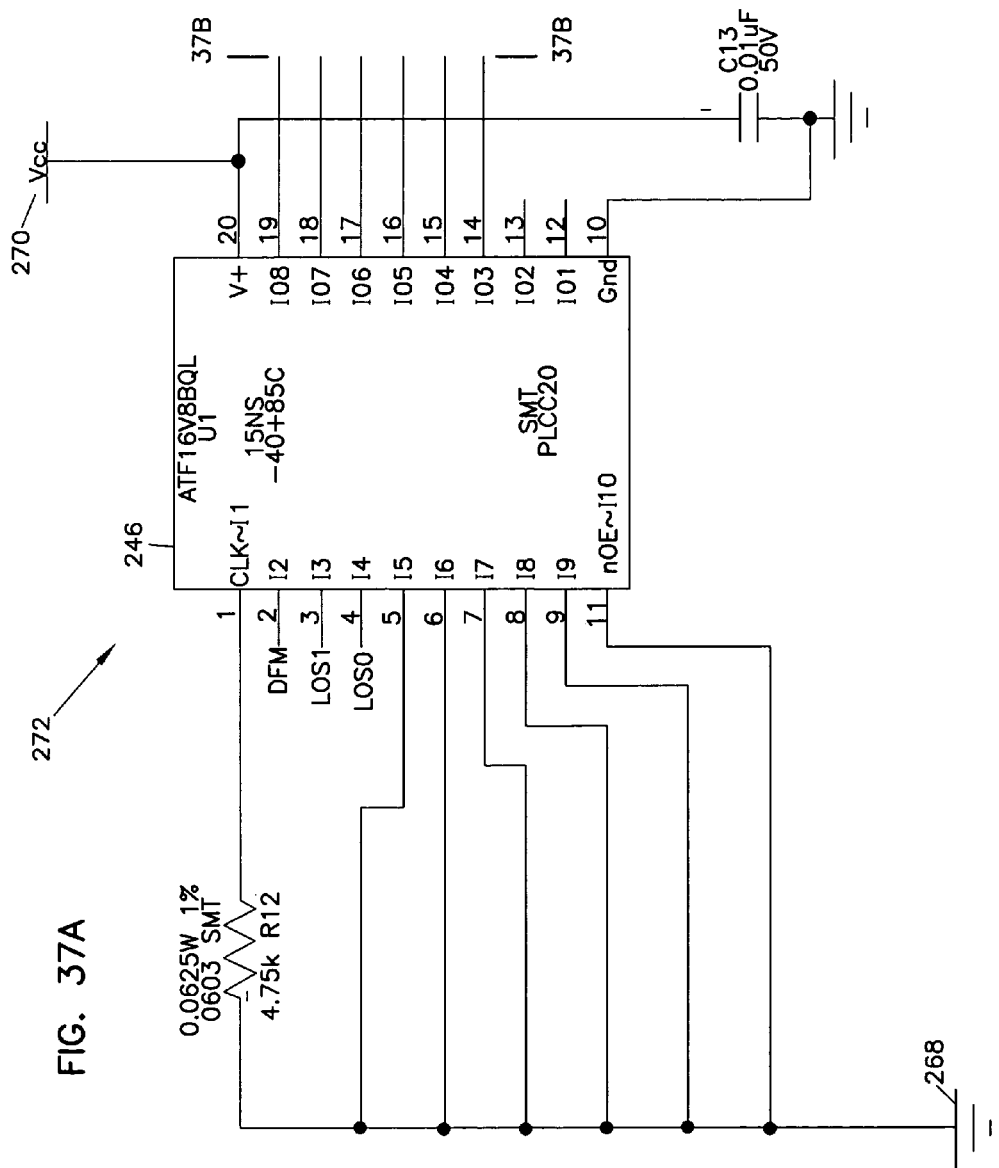
FIGS. 37A–37E are a schematic of alarm circuitry of the circuit board.
Figure 37B:
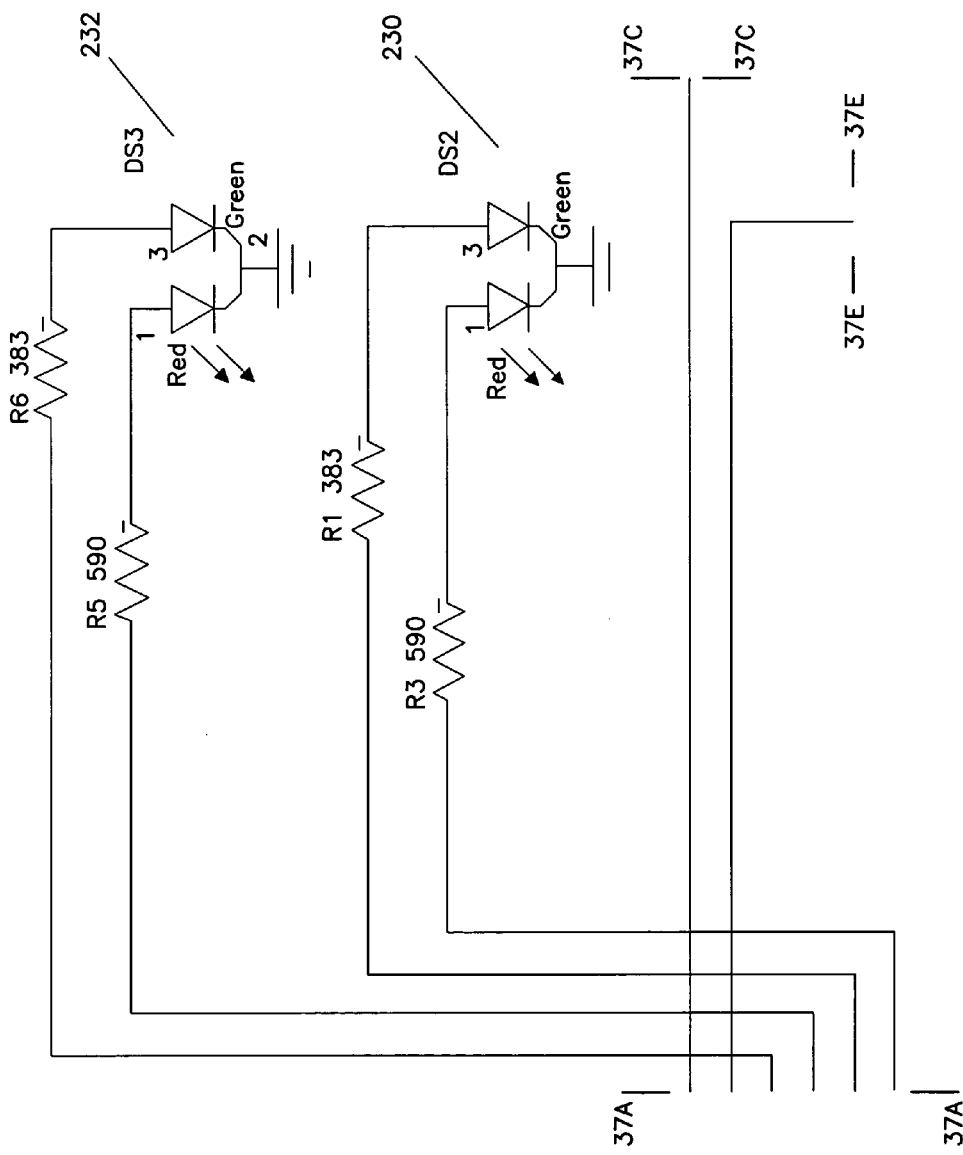
Figure 37C:
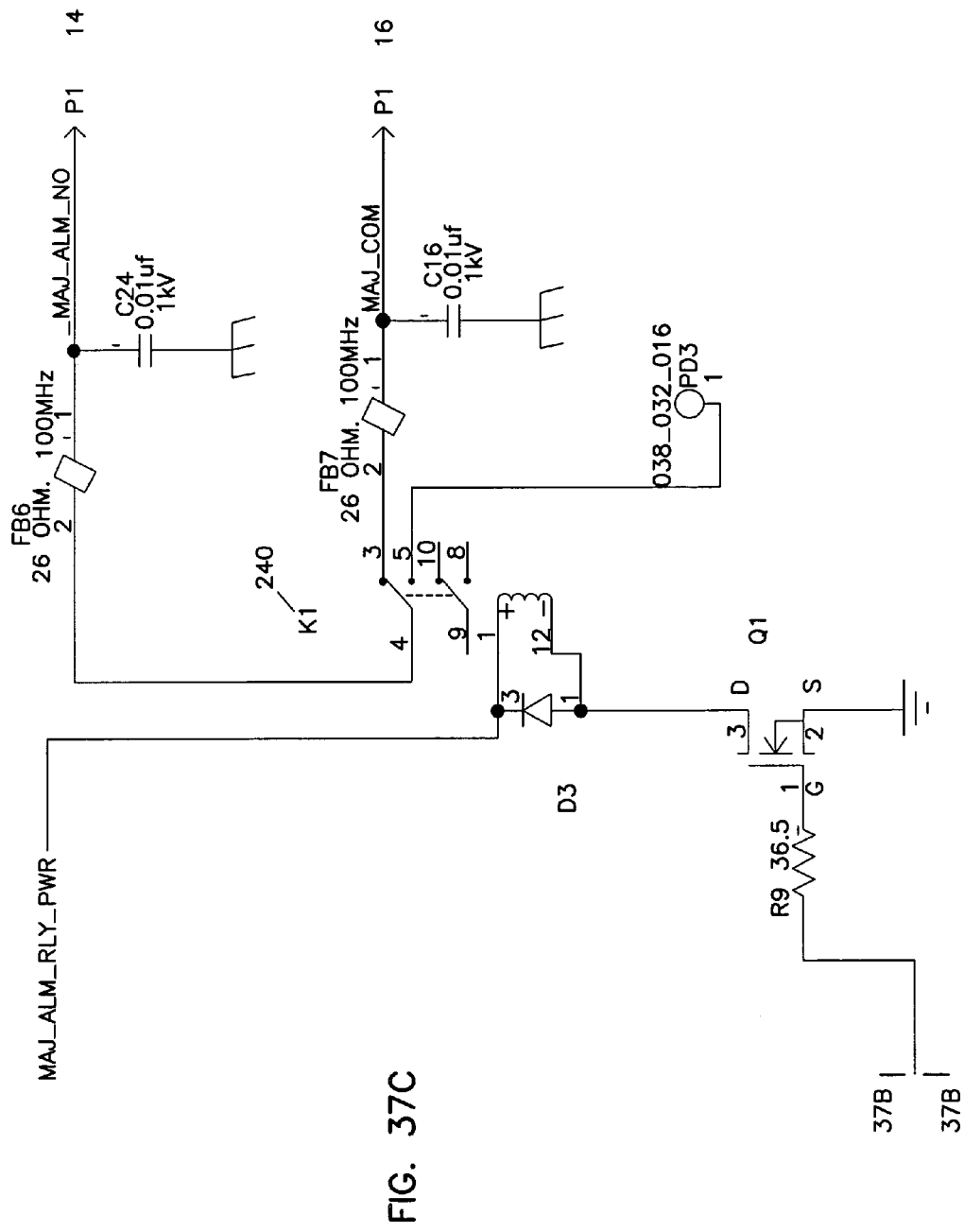
Figure 37D:
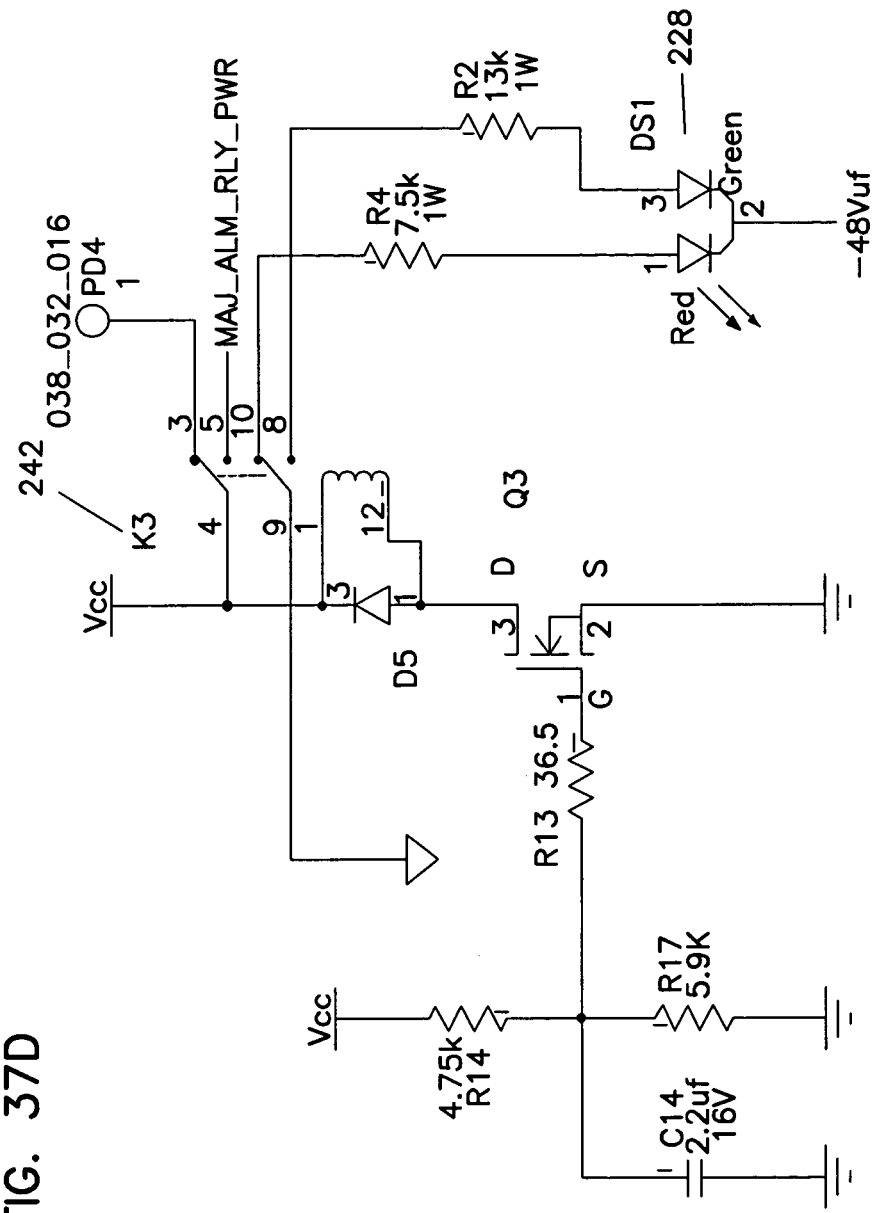
Figure 37E:
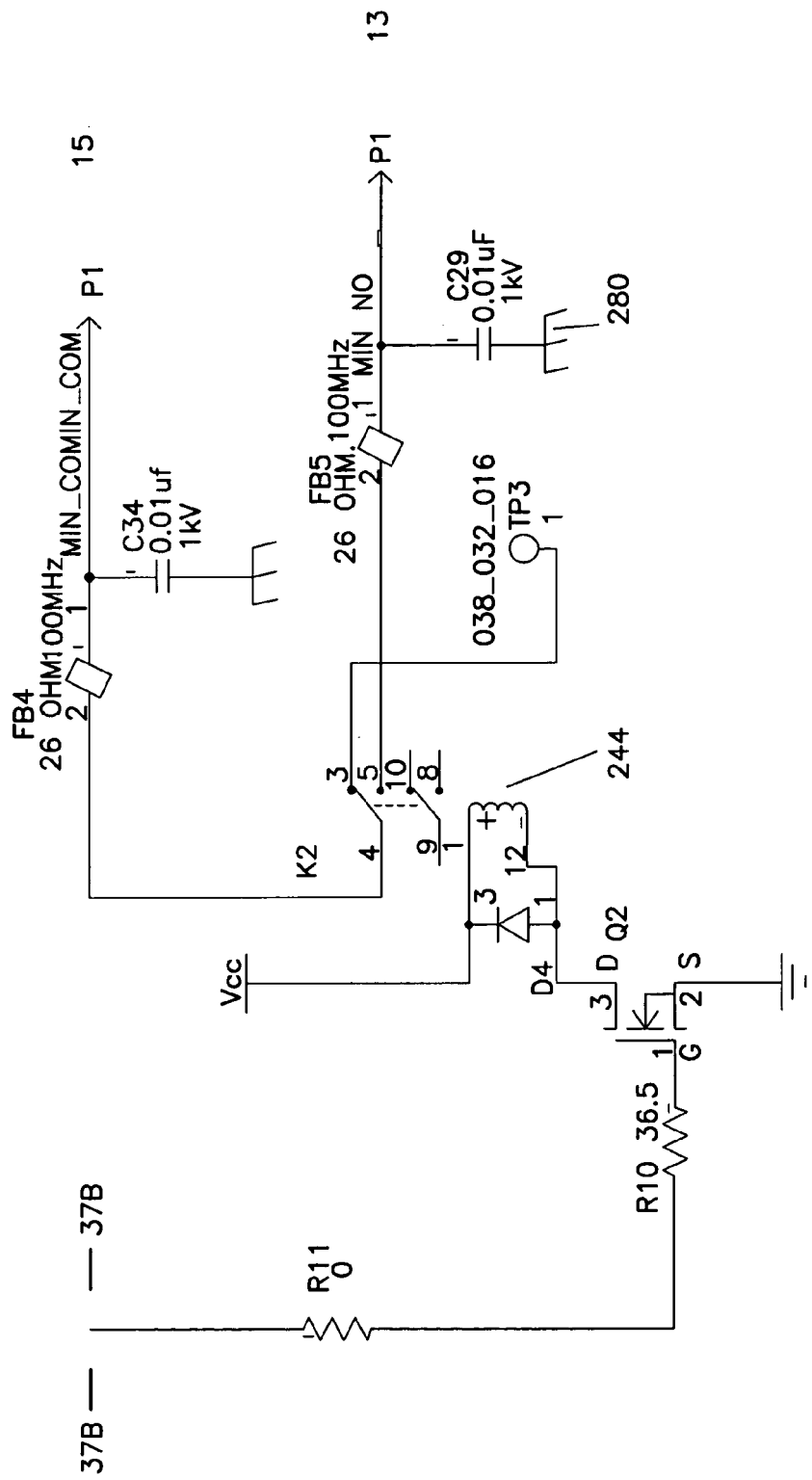
Figure 38A:
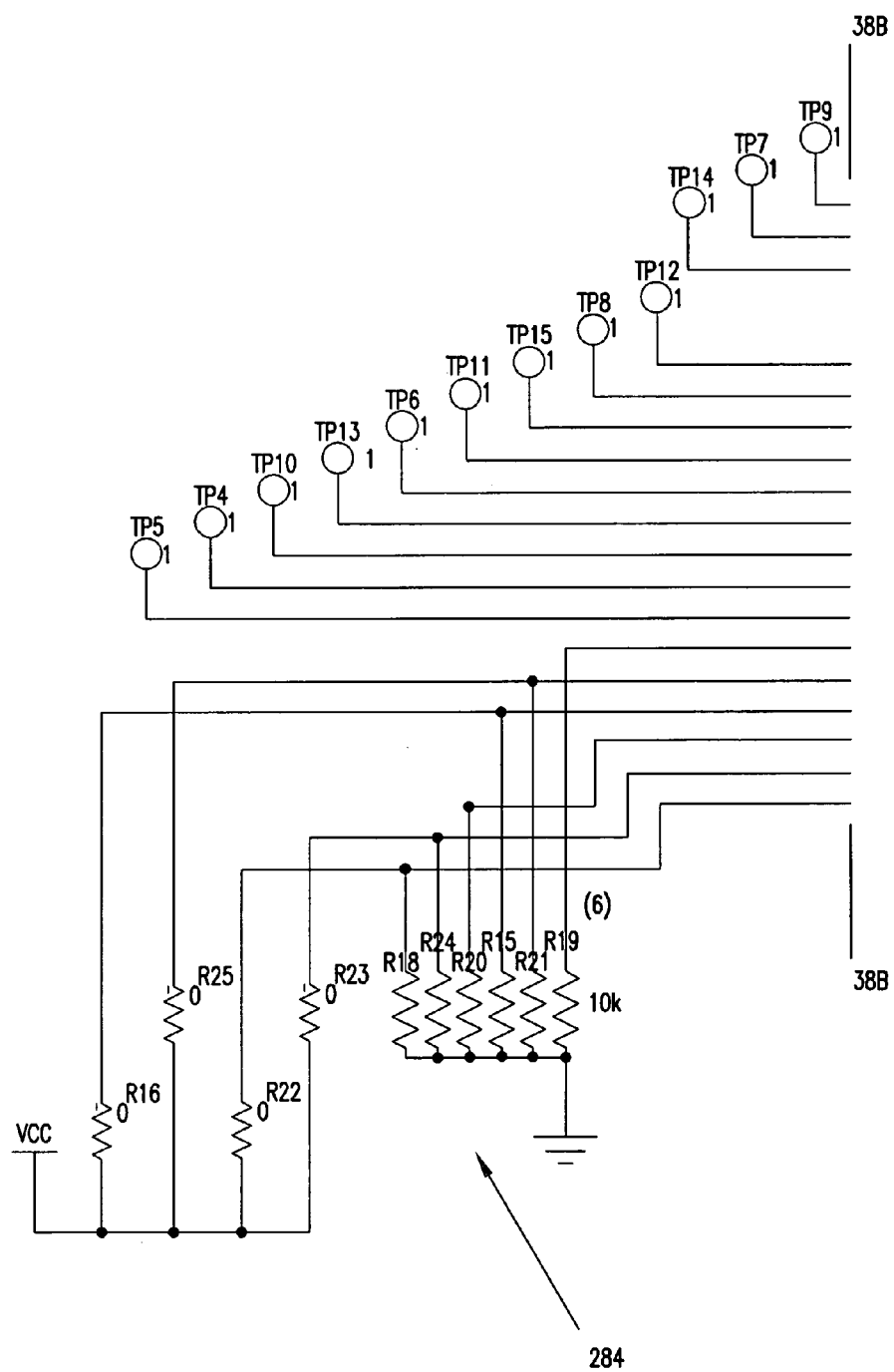
FIGS. 38A–38G are a schematic of transceiver configuration circuitry of the circuit board.
Figure 38B:
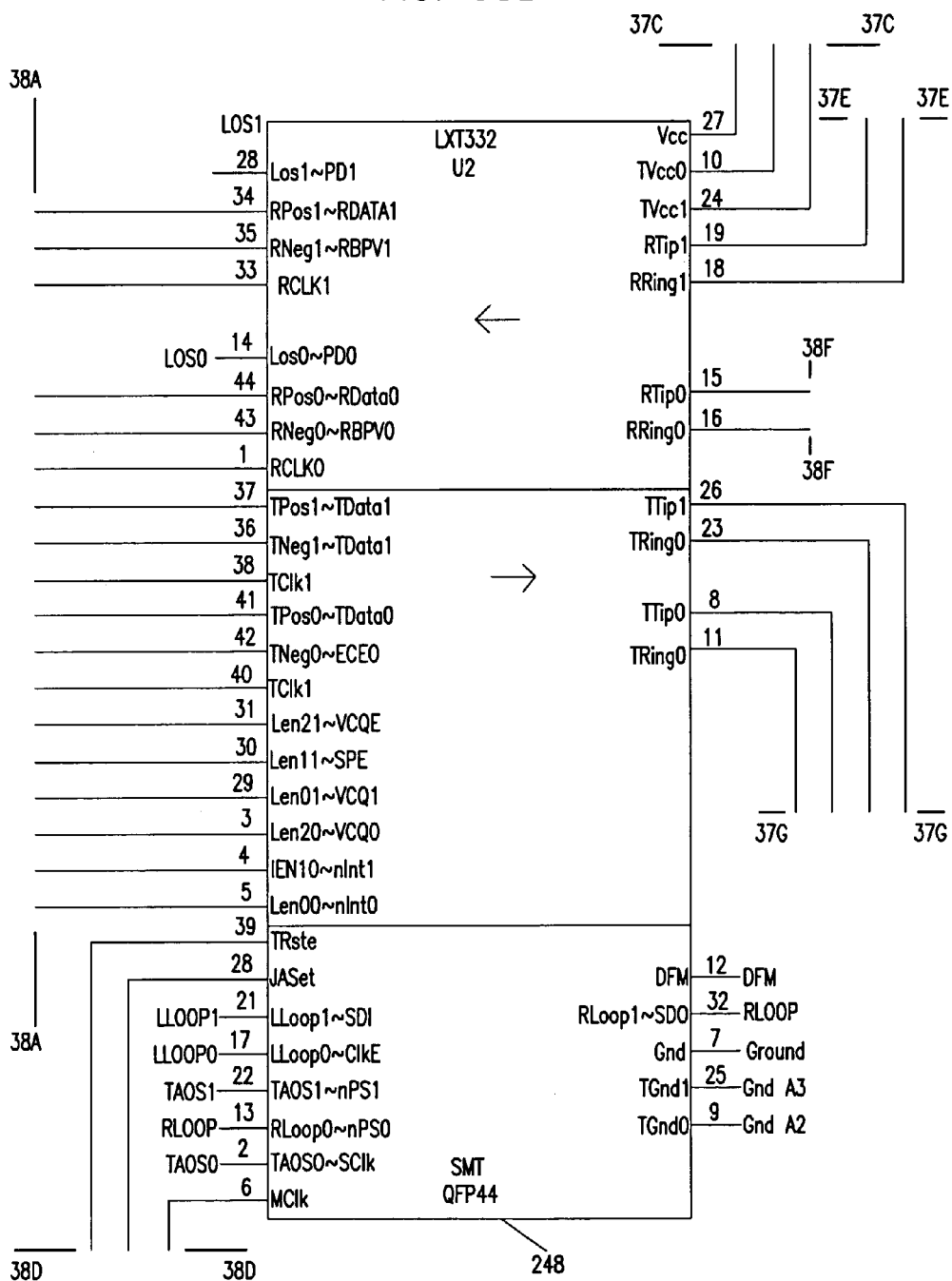
Figure 38C:
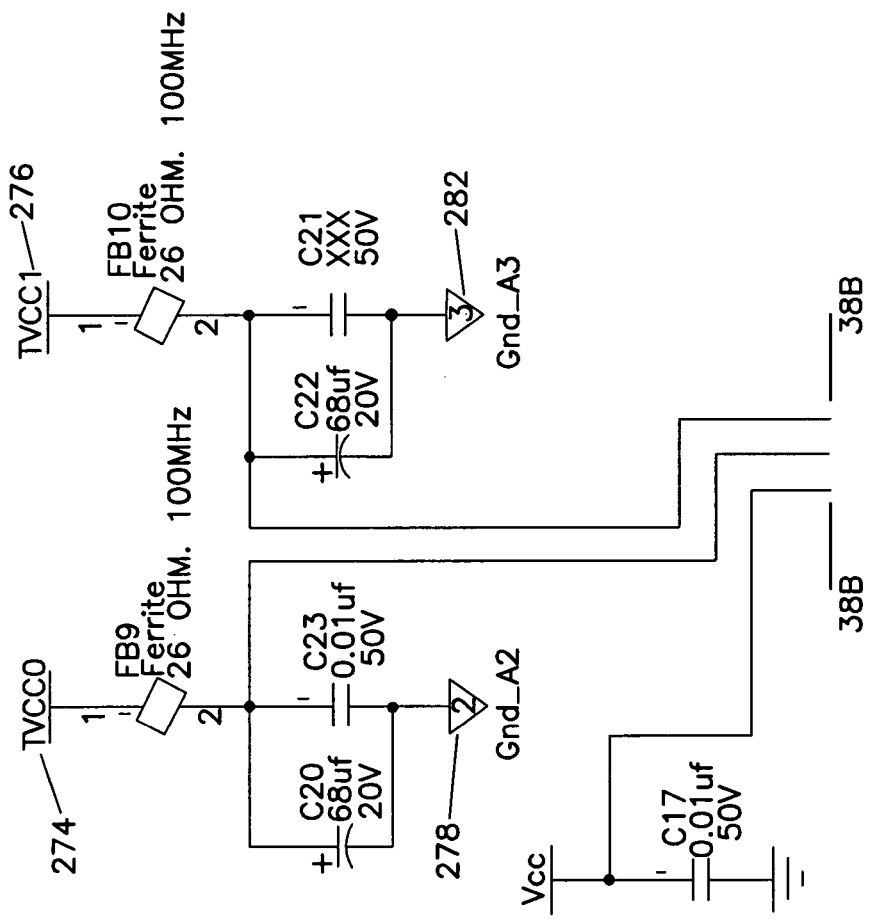
Figure 38D:
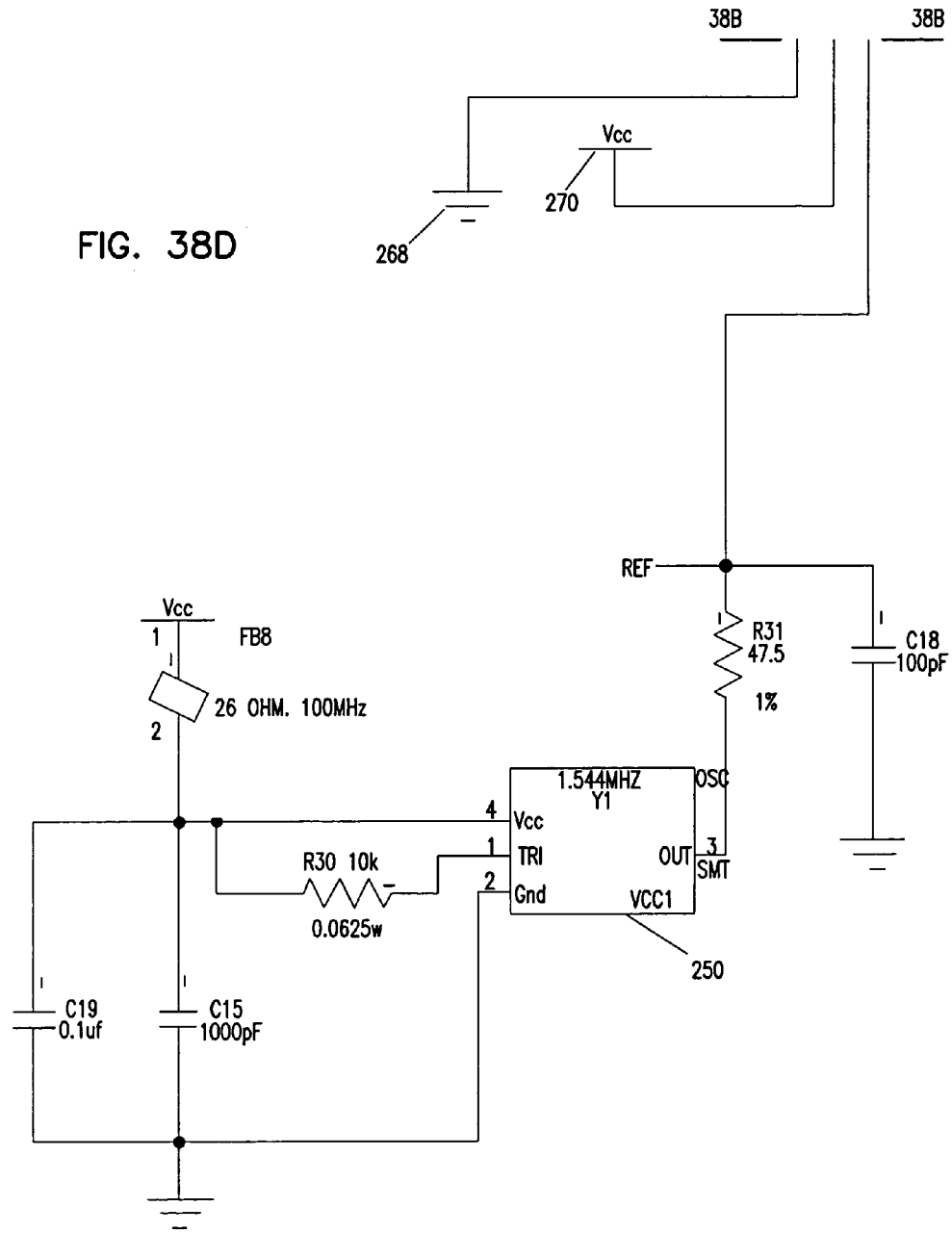
Figure 38E:
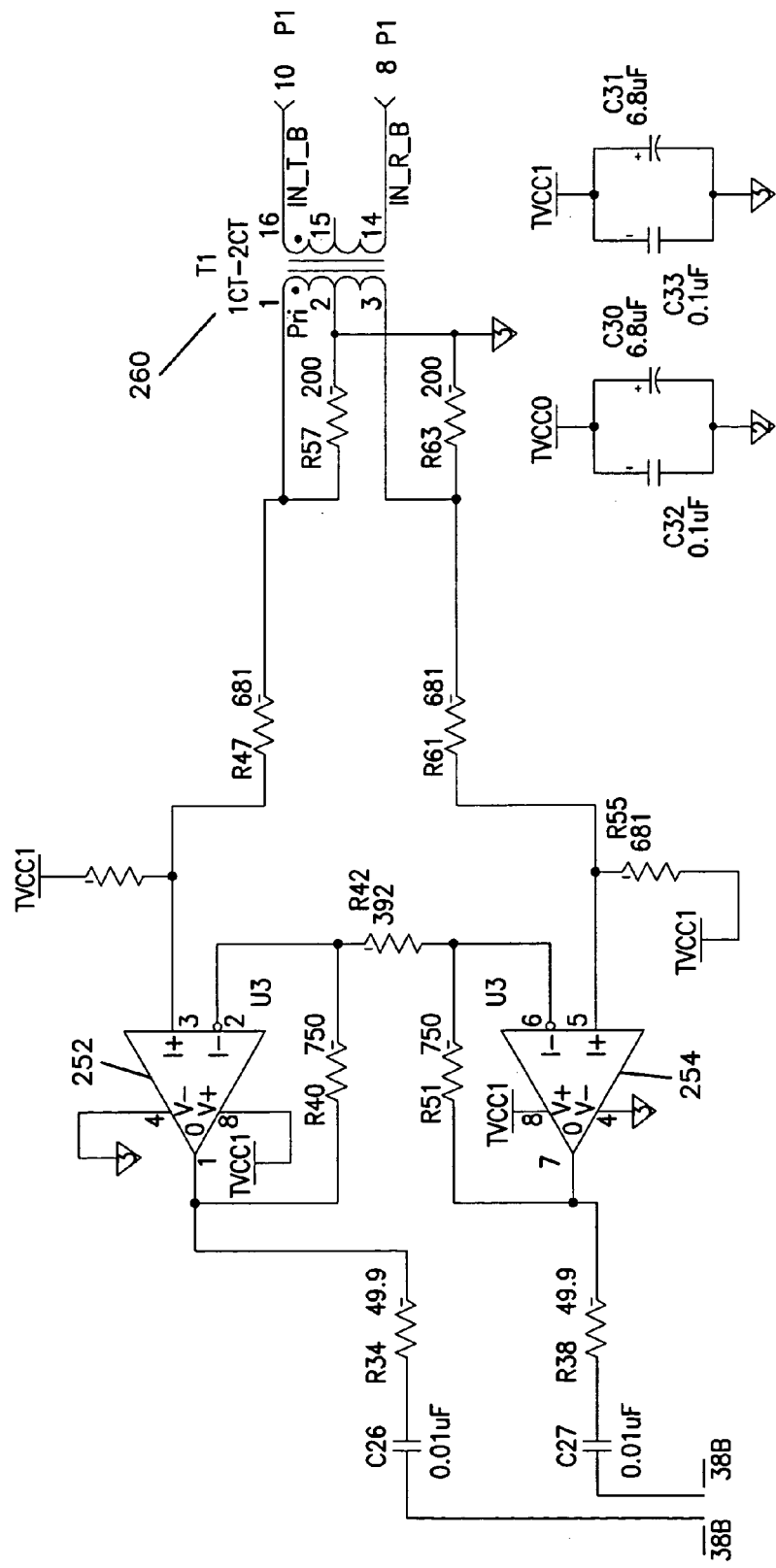
Figure 38F:
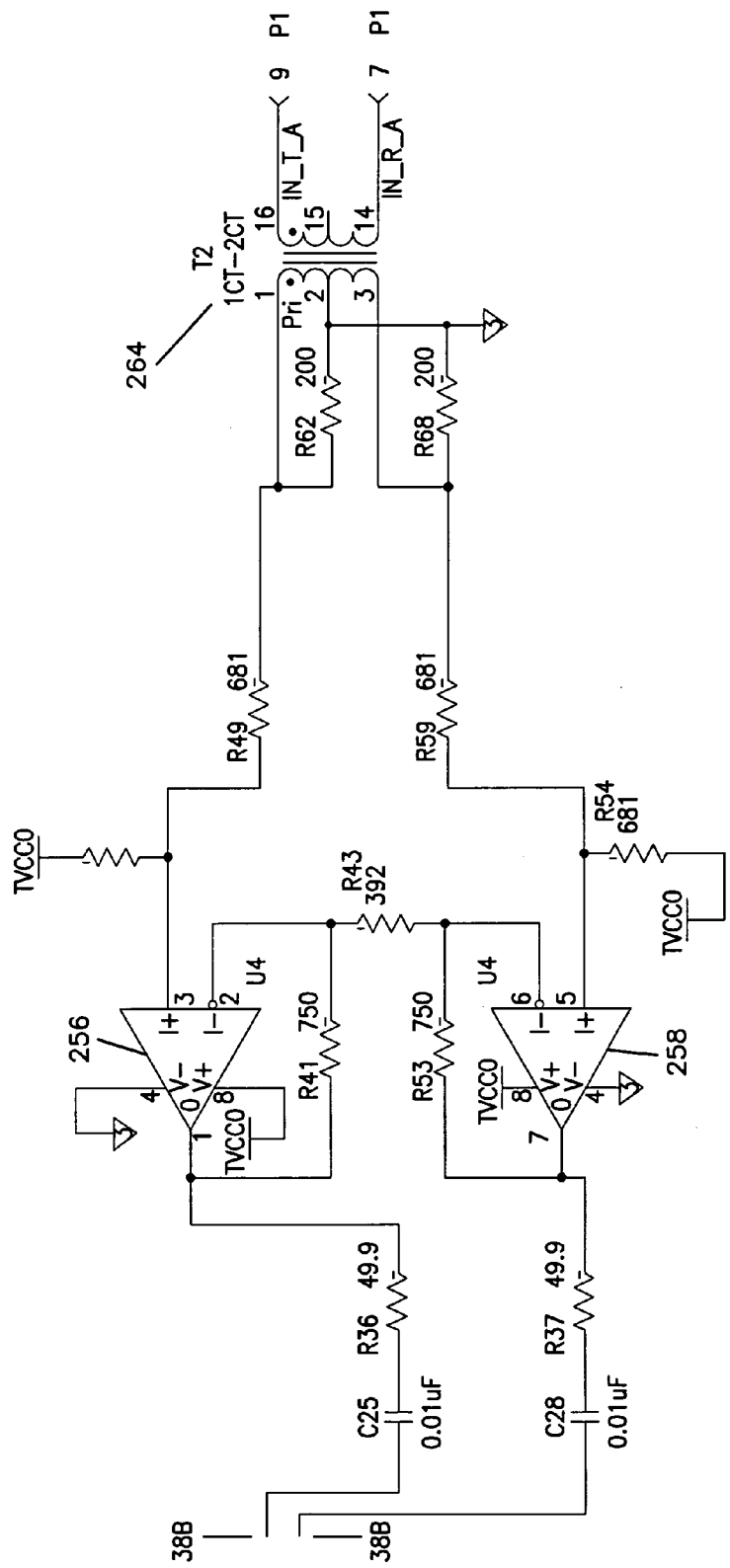
Figure 38G:
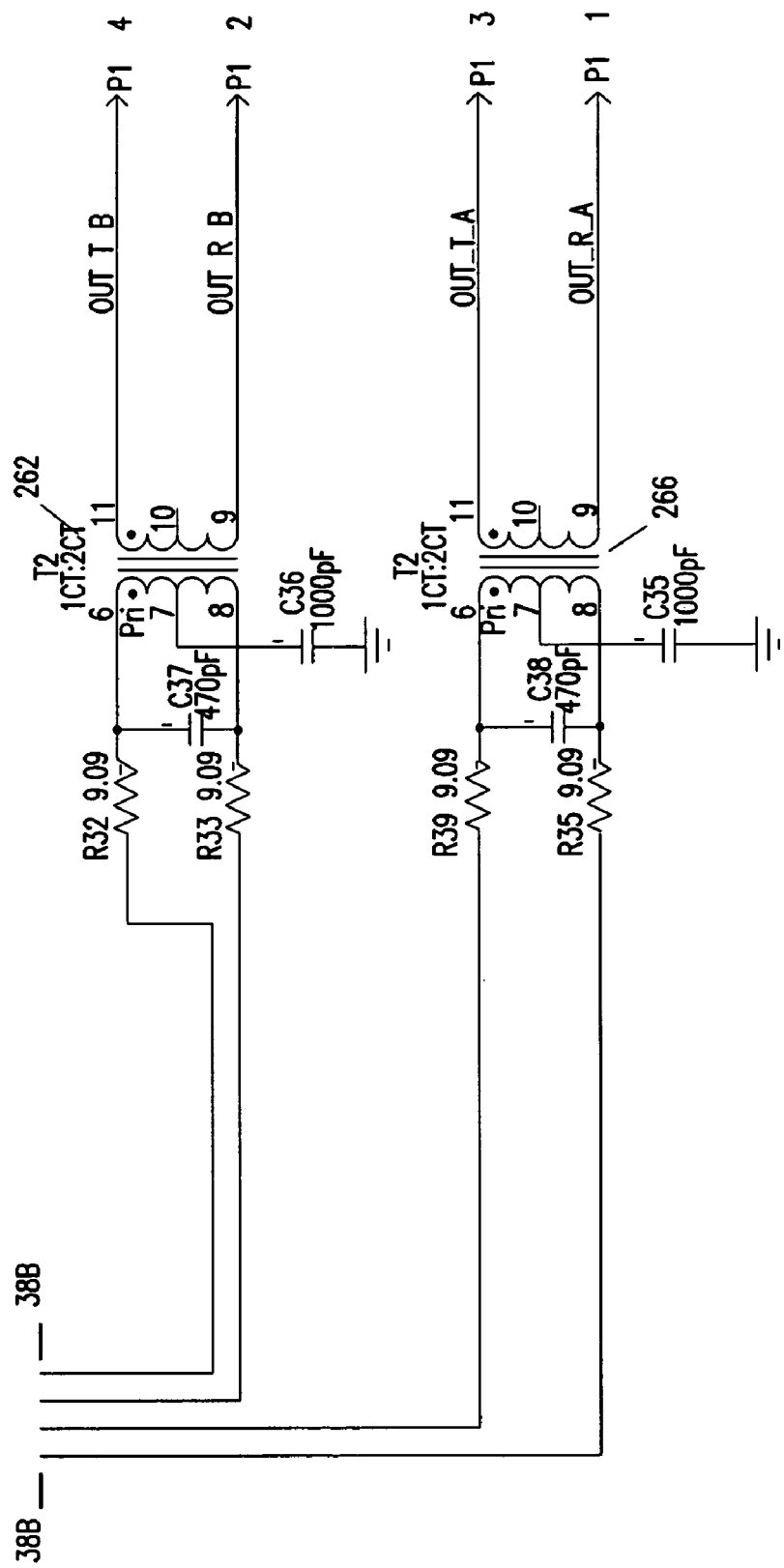

FIGS. 36A and 36B show a side view of an embodiment of the repeater circuit board 234 of a card 208 suitable for installation in the chassis 100. As discussed with reference to FIGS. 34 and 35, the repeater circuit board 234 has several components positioned on the board 234 in relation to the horizontal surface area 103, the ridges 300, 304 and the rows of openings 186, 190, 192, 312, 314, 316, and 320 of the horizontal surfaces 102, 142 of the chassis 100. The repeater circuit board 234 includes a power supply capacitor 236, a DC-DC converter 238, and a transceiver 248 previously discussed. The board 234 has the LEDs 228, 230, and 232 that provide the external visual indications of the repeater circuit's operation. Other components of the board 234 include but are not limited to relays 240, 242, and 244, a programmable logic device (PLD) 246, an oscillator 250, isolation transformers 260, 262, and 264, 266, and first channel and second channel amplifiers 252, 254 and 256, 258.

The embodiment shown in FIGS. 36A and 36B may be employed as a bridging repeater circuit that receives a low-level monitor signal through connector 225 and recreates the signal in a higher level suitable for network transmission and sends it out through connector 225. The bridging repeater circuit board 234 of FIGS. 36A and 36B may be used where a digital signal cross-connect (DSX) of the network becomes faulty and must be replaced without interrupting signal transfer. The bridging repeater circuit bypasses the faulty DSX without interrupting signal transfer by receiving monitor signals from healthy DSXs and providing high-level signals to the healthy DSXs until the healthy DSXs are permanently connected together to bypass the faulty DSX.

The capacitor 236 of the embodiment shown is positioned such that the uncovered horizontal surface area 103 of the first horizontal surface 102 is directly above it because the capacitor 236 does not need the extra ventilation provided by the larger openings 186, 190, 192 located between the ridges 300, 304 that are covered by the mesh cover 104. The DC-DC converter 238 of this embodiment may be a model that is highly flame resistant to enhance the flame containment of the chassis 100. An epoxy encased DC-DC converter 238 such as the Ericsson PFK 4611SI is suitable in this embodiment. A monitor jack, which might ordinarily be placed between the LEDs 230 and 232, is also absent in this embodiment to reduce the material on the board 234 that is susceptible to burning.

FIGS. 37A–E show the alarm circuitry 272 of the repeater circuit board 234. The alarm circuitry 272 controls the LEDs 228, 230, and 232. During normal operation, the LEDs 228, 230, and 232 are one color, such as green, to indicate normal operation. The power LED 228 turns red if the logic power plane 270 loses voltage from the output of the DC-DC converter 238. This occurs due to relay 242 changing state in response to the loss of logic power thereby causing voltage received directly from the backplane connector 225 to activate the red diode of LED 228 instead of the green diode.

The channel A LED 230 and channel B LED 232 are electrically connected to the PLD 246 and to a logic ground plane 268. The PLD 246 receives power from the logic power plane 270 and receives control signals from the transceiver 248. When a channel is operating normally, the PLD 246 causes the green diode of the LED to illuminate.

If the transceiver 248 detects that channel A has no signal, then LOS0 line passing from the transceiver 248 to the PLD 246 is triggered causing the PLD 246 to light the red diode along with the green diode of LED 230 to create a yellow illumination. If the transceiver 248 detects that channel B has no signal, then LOS1 line passing from the transceiver 248 to the PLD 246 is triggered causing the PLD 246 to light the red diode along with the green diode of LED 232 to create a yellow illumination. If either channel has a loss of signal, then a minor alarm signal is generated and provided through the backplane connector 225 by relay 244 changing state due to a control signal from the PLD 246. The minor alarm line is electrically linked to a chassis ground plane 280.

If the transceiver 248 detects that it has failed, then the DFM line passing from the transceiver 248 to the PLD 246 is triggered causing the PLD 246 to light the red diode and turn off the green diode of LEDs 230 and 232 to create a red illumination. A major alarm signal is also generated and provided through the backplane connector 225 by relay 240 changing state due to a control signal from the PLD 246. The major alarm line is electrically linked to the chassis ground plane 280 as well with coupling capacitors.

The PLD 246 and relays 240, 242, and 244 may be selected so as to minimize power consumption and reduce the amount of heat being generated by each circuit board 234 in the chassis 100. The Atmel model ATF16V8BQL PLD draws only 100 milliwatts when active and is a suitable PLD for controlling the relays 240 and 244 and LEDs 230 and 232. The NAIS TX-S relay draws only 50 milliwatts when active and is a suitable relay for controlling the LED 228 and the major and minor alarm signals.

FIGS. 38A–G shows an embodiment of the transceiver circuitry located on the board 234. The transceiver 248, such as the Level One model LXT332, is electrically connected to the logic power plane 270 and the logic ground plane 268. The transceiver 248 is also electrically linked to a channel A power plane 274, a channel A ground plane 278, a channel B power plane 276, and a channel B ground plane 282. Each channel of this embodiment has its own power and ground plane to avoid cross-talk and to avoid electrical noise from the power supply circuit of FIGS. 39A and 39B and chassis 100. The transceiver 248 is electrically linked to the oscillator 250 that is electrically connected to the logic power plane 270 and logic ground plane 268. The oscillator 250 provides a reference frequency signal to the transceiver 248.

The transceiver 248 receives its input signals for each channel from the input amplifiers 252, 254 and 256, 258. The input amplifiers 252, 254 and 256, 258 receive input signals from the backplane connector 225 through the isolation transformers. Channel A input signal passes through isolation transformer 264 to the input amplifiers 256, 258, and channel A output signal passes through isolation transformer 266. Channel B input signal passes through isolation transformer 260 to the input amplifiers 252, 254, and channel B output signal passes through isolation transformer 262. As shown in FIGS. 36A and 36B, the input isolation transformer 264 and output isolation transformer 266 of channel A are contained in one unit. Similarly, the input isolation transformer 260 and output isolation transformer 262 of channel B are contained in another unit. Likewise, input amplifiers 252 and 254 of channel B are housed in one integrated circuit chip, and input amplifiers 256 and 258 of channel A are housed in another integrated circuit chip.

The input amplifiers 252, 254 for the tip and ring connections, respectively, of channel B are electrically connected to the channel B power plane 276 and also to the channel B ground plane 282. Likewise, the input amplifiers 256, 258 for the tip and ring connections, respectively, of channel A are electrically connected to the channel A power plane 274 and also to the channel A ground plane 278. Providing power to the amplifiers of differing channels from different power and ground planes reduces cross-talk and other electromagnetic interference. The input amplifiers 252, 254 and 256, 258 increase the amplitude of the monitor signal received by the bridging repeater circuit board 234 of FIGS. 36A and 36B to a level within the sensitivity range of the transceiver 248. The transceiver 248 is then able to recreate the signal having the higher level suitable for network transmission.

In the bridging repeater circuit embodiment of FIGS. 38A–G, the line build-out function of the transceiver 248 is fixed at a specific signal level and shape because a consistent cable length is generally used when connecting the bridging repeater circuit between the healthy DSXs. Thus, line build-out variability is not needed. Resistors 284 are arranged to provide a fixed connection between certain line build-out pins of the transceiver 248 to the logic power plane 270 while providing a fixed connection between other line-build out pins of the transceiver 248 to the logic ground plane 268.

Figure 39A:
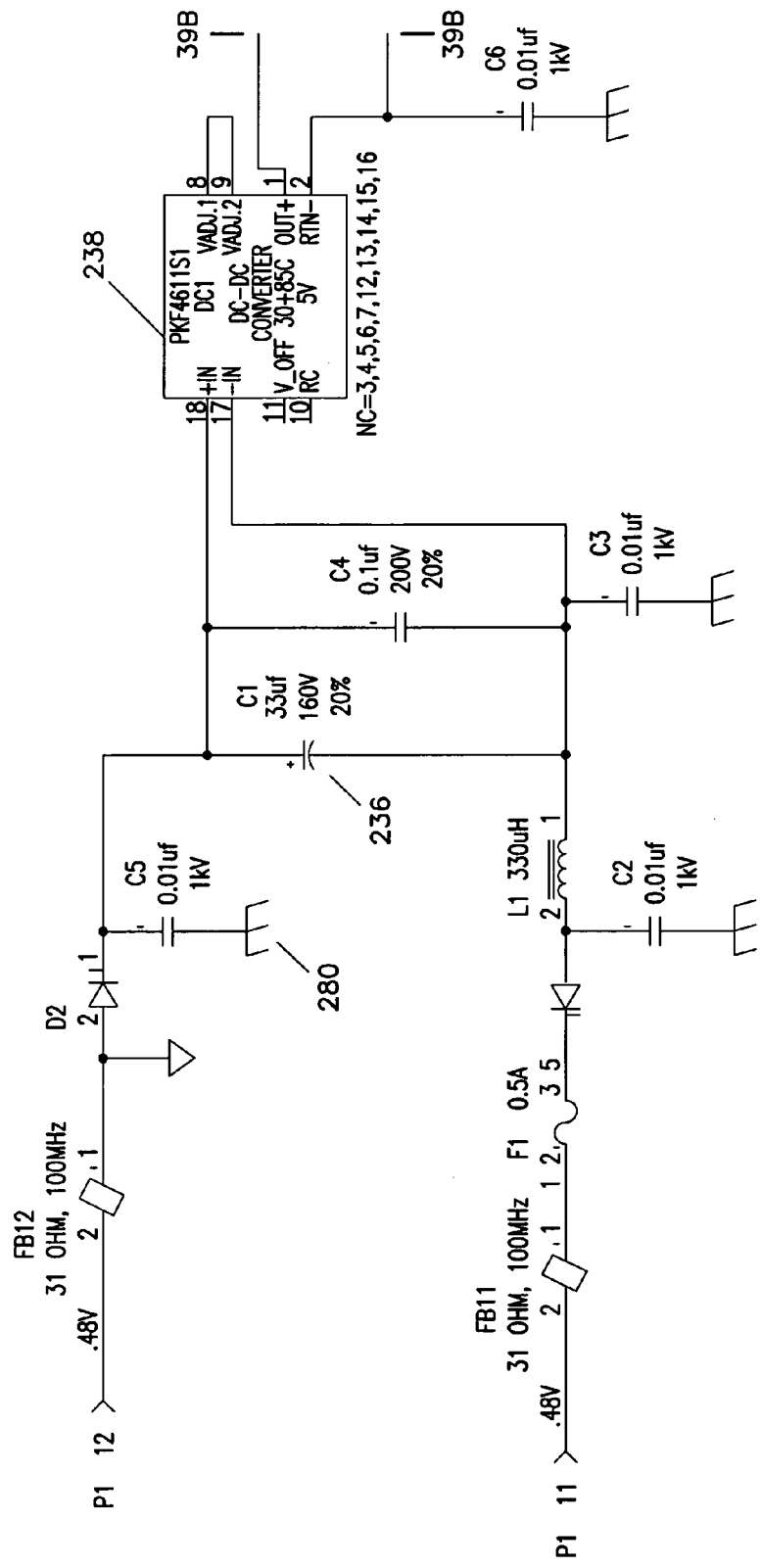
FIGS. 39A and 39B are a schematic of power supply circuitry of the circuit board.
Figure 39B:
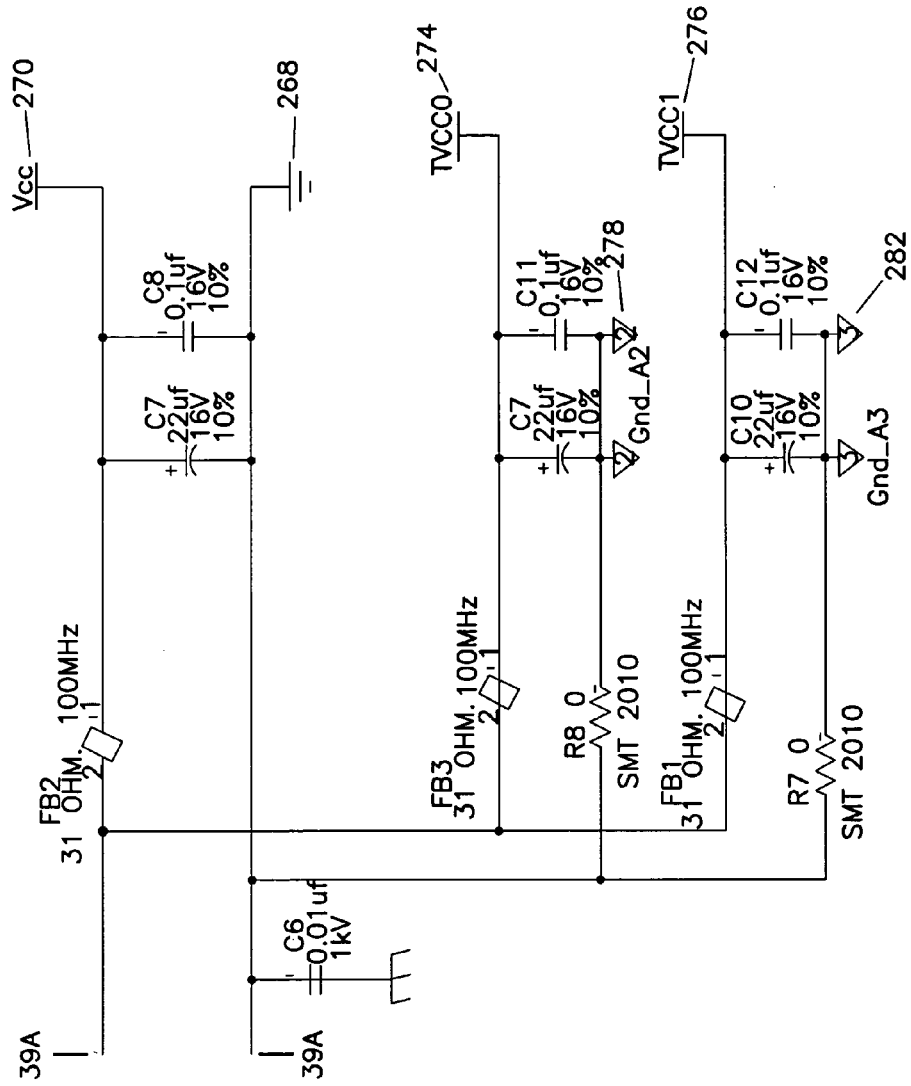

FIGS. 39A and 39B shows the power supply circuitry. The backplane connector 225 receives −48V DC power and provides it through the board 234 to the DC-DC converter 238. The −48V line and the −48 V return line are linked by the capacitor 236 to eliminate ripple. These lines are also coupled to the chassis ground plane 280. The DC-DC converter 238 outputs a voltage that is electrically connected to the logic power plane 270, the channel A power plane 274, and the channel B power plane 276. The DC-DC converter 238 has a return that is electrically connected to the logic ground plane 268, the channel A ground plane 278, and the channel B ground plane 282. Ferrite beads are used to isolate each power plane connected to the DC-DC converter 238 and each power plane is AC coupled to each ground plane.

Figure 40:
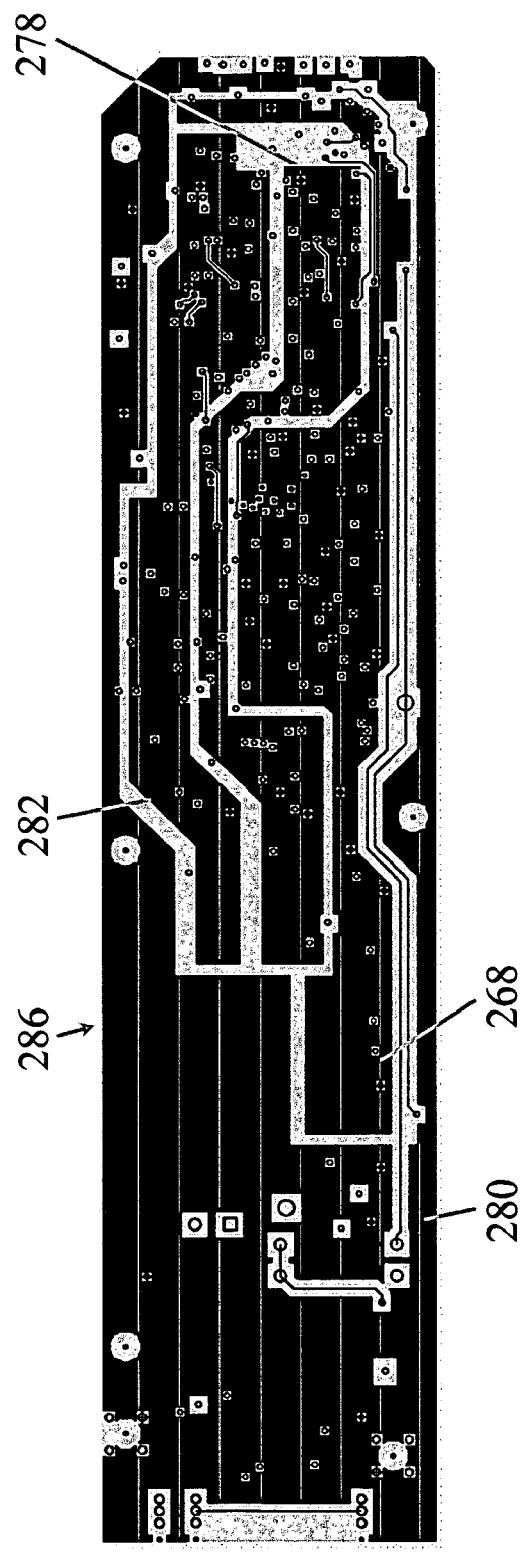
FIG. 40 is a view of a ground layer of the circuit board.

FIG. 40 shows a ground layer of the circuit board 234. The ground layer includes the chassis ground plane 280 that extends around the periphery 286 of the circuit board 234 and is electrically connected to the chassis ground provided through the chassis ground connector 138 of the chassis 100. The chassis ground plane 280 surrounds the logic ground plane 268, the channel A ground plane 278, and the channel B ground plane 282. The chassis ground plane 280, logic ground plane 268, channel A ground plane 278, and channel B ground plane 282 are copper sheets that are isolated from each other within the single ground layer of the printed circuit board 234.

Figure 41:
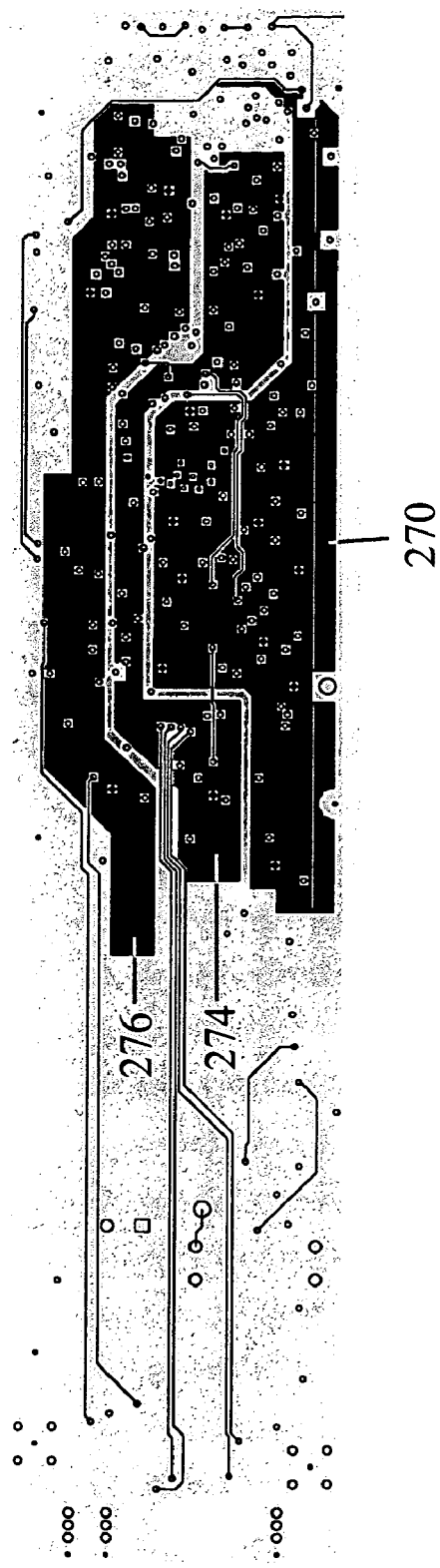
FIG. 41 is a view of a power layer of the circuit board.

FIG. 41 shows a power layer of the circuit board 234 that is adjacent to the ground layer and separated from it by a dielectric layer. The power layer includes the logic power plane 270, the channel A power plane 274, and the channel B power plane 276. The logic power plane 270 substantially overlaps with the logic ground plane 268 of the ground layer. The channel A power plane 274 substantially overlaps with the channel A ground plane 278. Likewise, the channel B power plane 276 substantially overlaps with the channel B ground plane 282. This arrangement minimizes electrical noise and cross-talk.

Figure 42A:
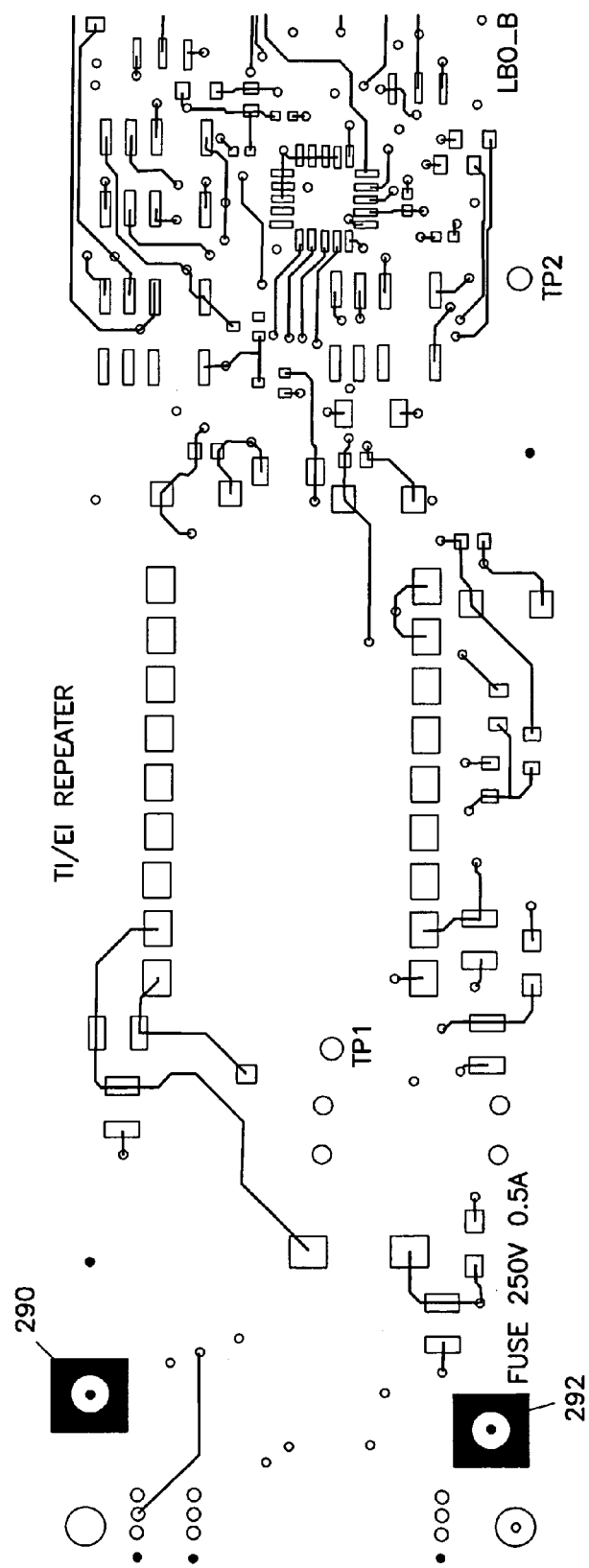
FIGS. 42A and 42B are a view of a component layer of the circuit board.
Figure 42B:
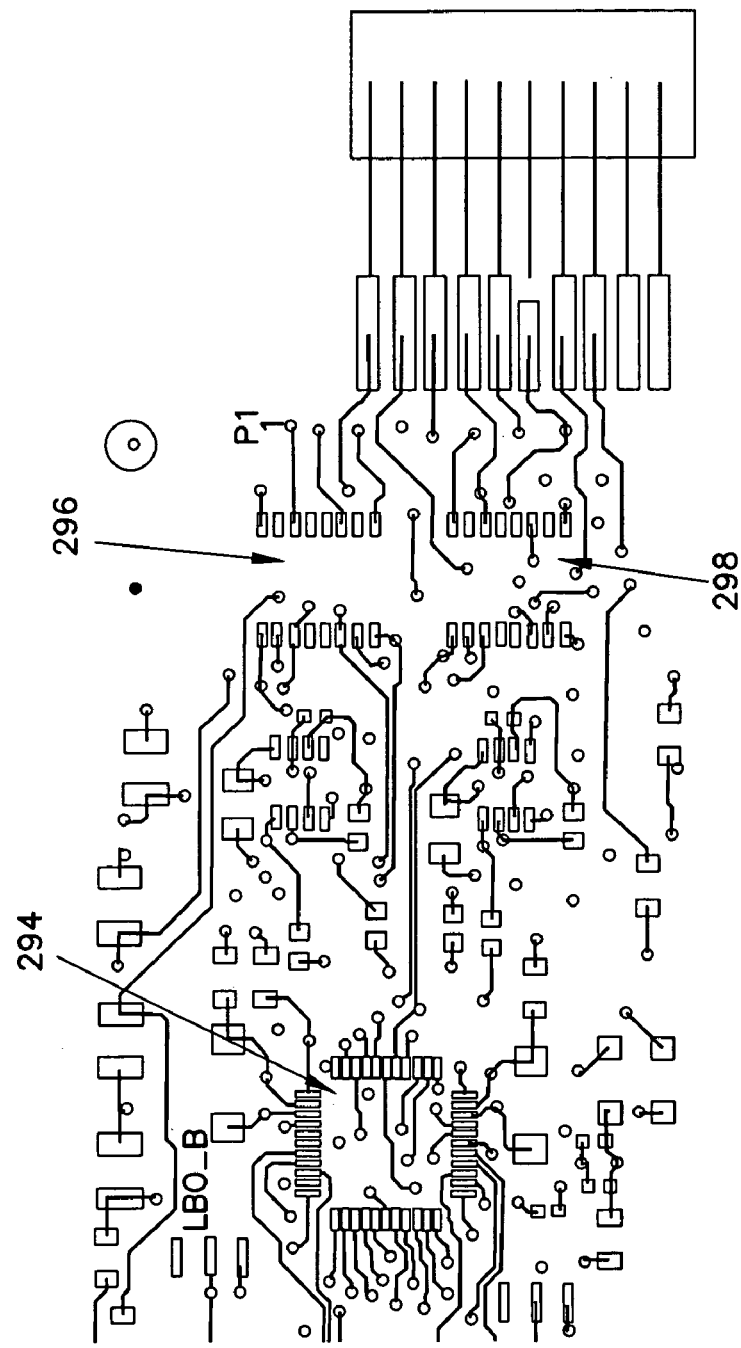

FIGS. 42A and 42B show a component layer of the circuit board 234. The electrical components previously discussed are typically mounted to the component layer. The transceiver 248 is mounted in transceiver area 294. The isolation transformers 260, 262, and 264, 266 are mounted in transformer areas 296 and 298. It is generally desirable to minimize the distance between the isolation transformer areas 296, 298 and the transceiver area 294. A distance of one and one-third inches or less is suitable.

Also located on the component layer are chassis ground pads 290 and 292. These chassis ground pads 290 and 292 are electrically connected to the chassis ground plane 280. The metal faceplate 210 of the circuit card 208 mounts to holes within the chassis ground pads 290 and 292 and metal-to-metal contact is established between the chassis ground pads 290, 292 and the faceplate 210. This metal-to-metal contact maintains the faceplate 210 at chassis ground.

Figure 51A:
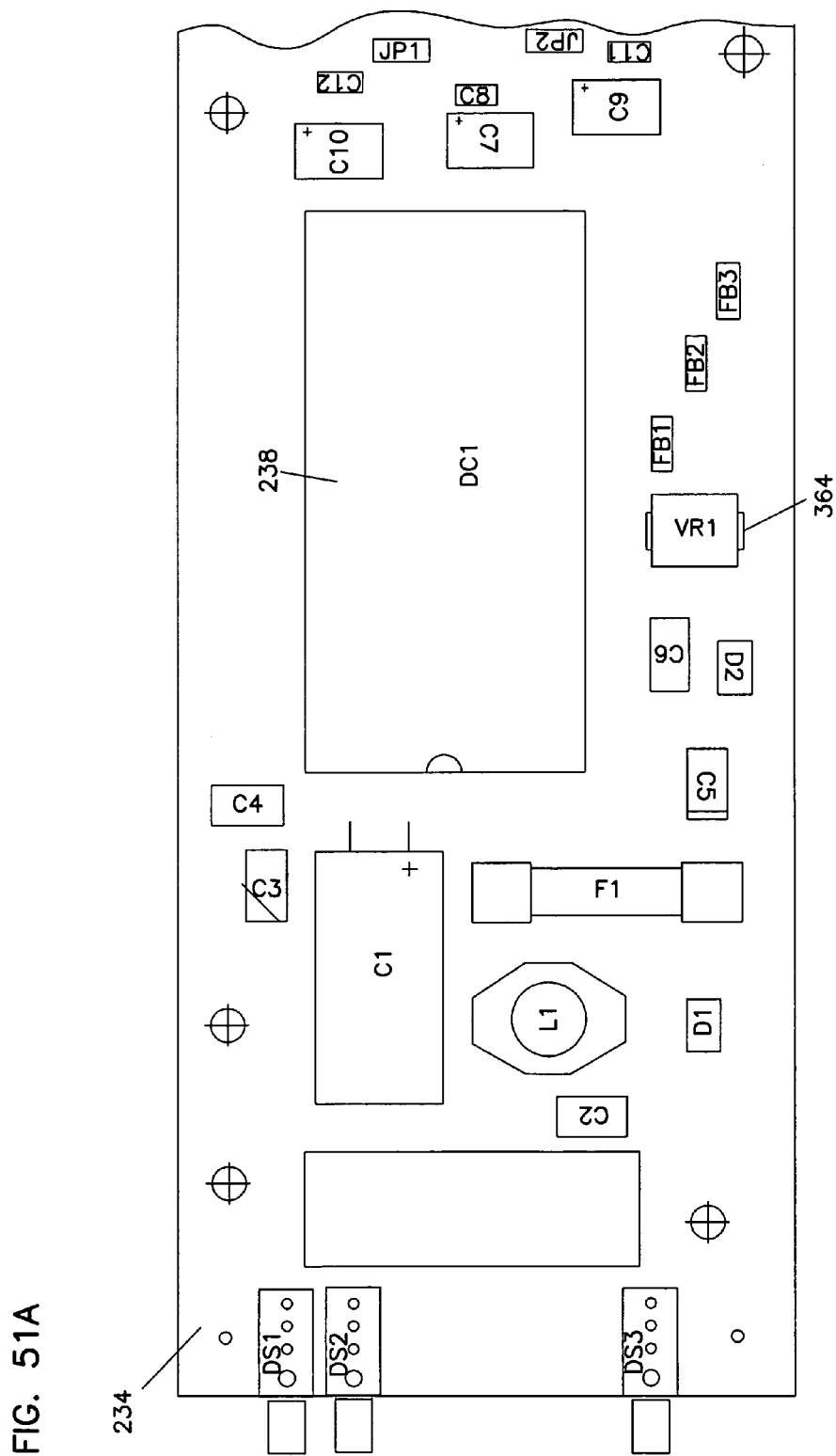
FIGS. 51A and 51B are a side view of an alternative circuit board of the circuit card having input amplification and additional surge protection components.
Figure 51B:
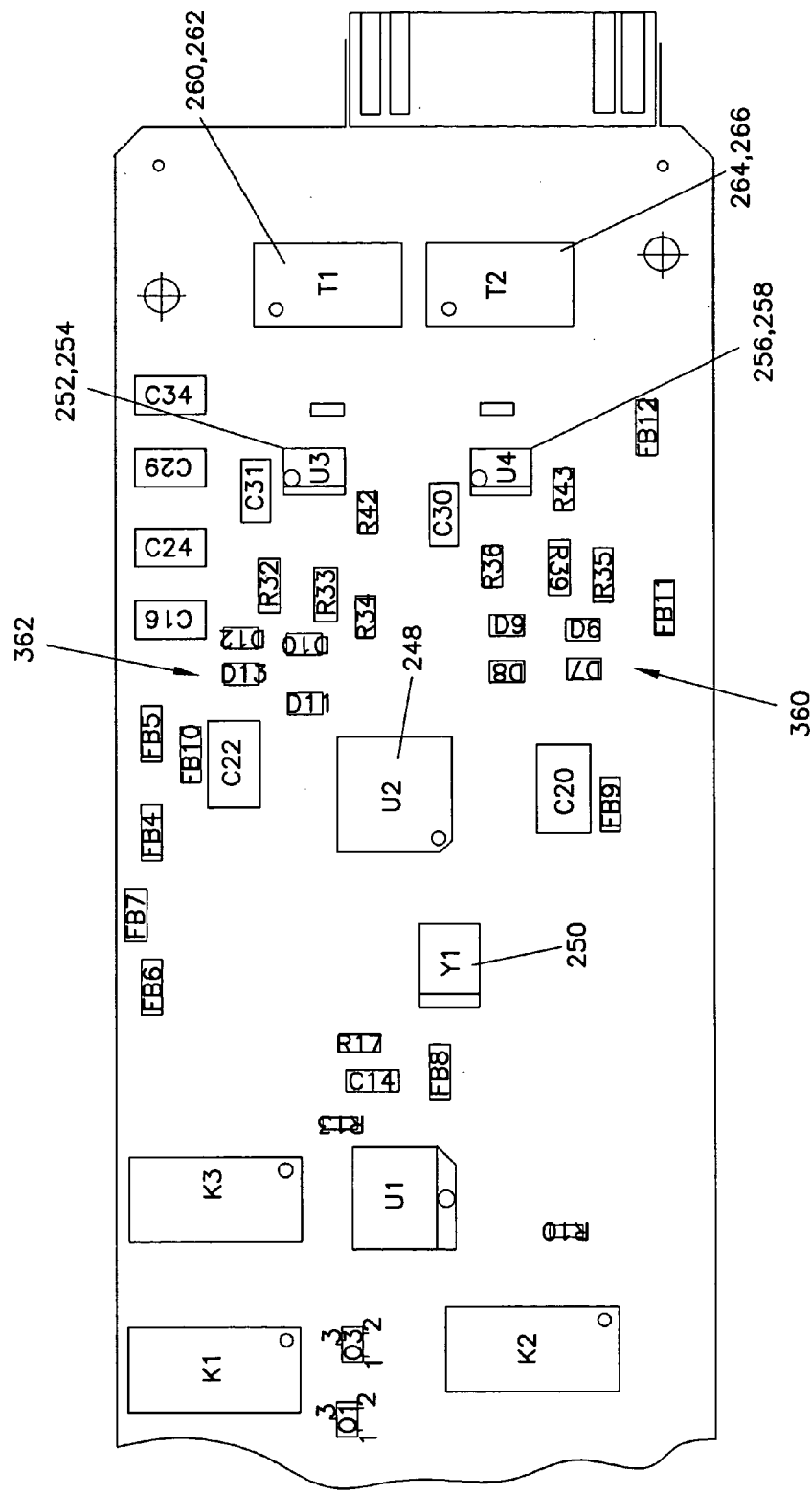

FIGS. 51A and 51B shows an alternative circuit board layout whereby additional surge protection is provided. The embodiment shown in FIGS. 51A and 51B contains input amplifiers 252, 254 and 256, 258 but lacks line build-out switches. This embodiment has Schottky diode banks 360 and 362 positioned between the isolation transformers 260, 262 and 264, 266 and the transceiver 248. Each diode bank of this embodiment includes four Schottky diodes. Additionally, this embodiment has a transient voltage suppressor 364 positioned between the DC-DC converter 238 and the bottom of the circuit board 234 which is close to the surface 142 when installed in the chassis 100.

Figure 52A:
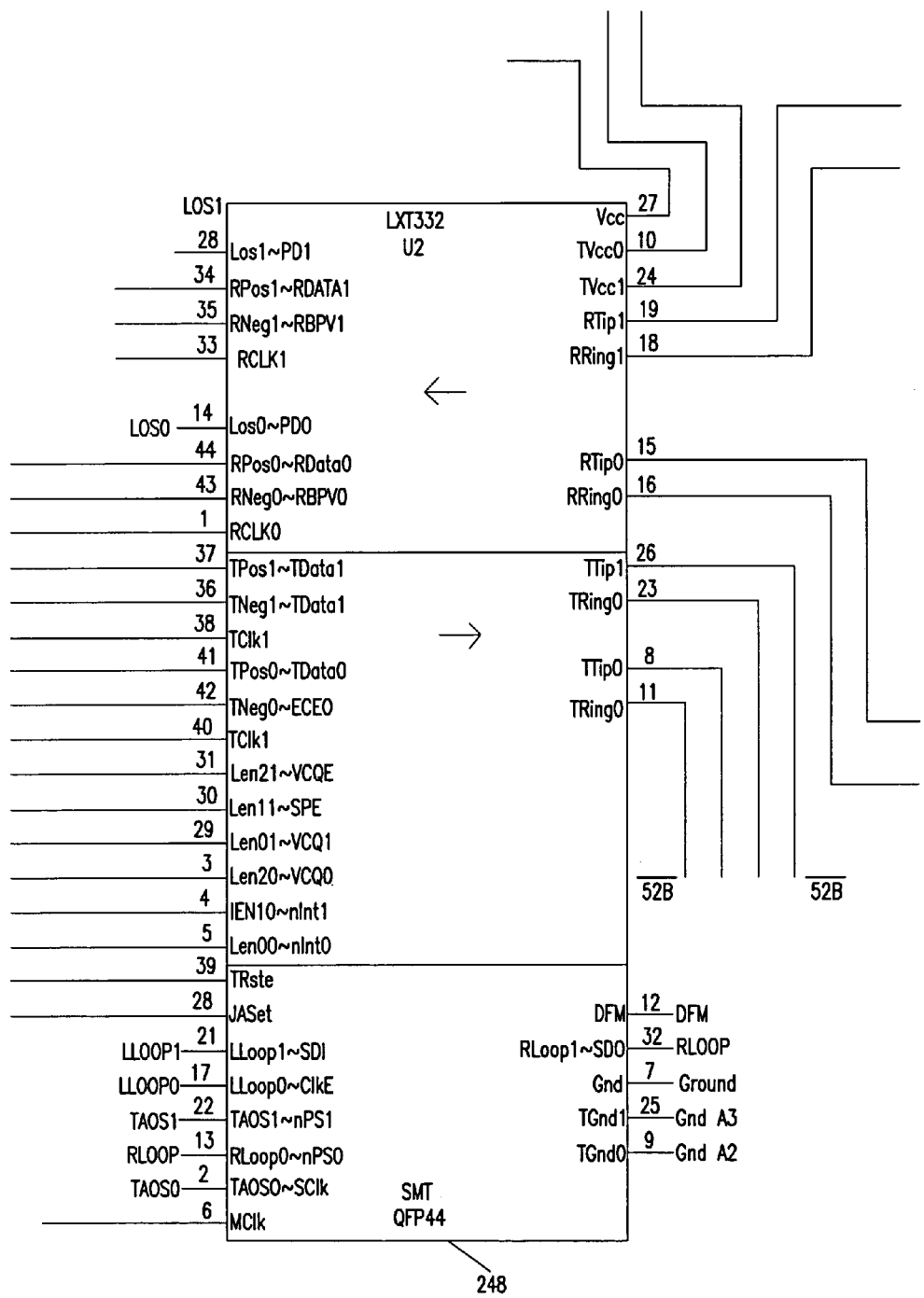
FIGS. 52A–52B are a schematic of transceiver configuration circuitry of the repeater circuit employing additional surge protection components.
Figure 52B:
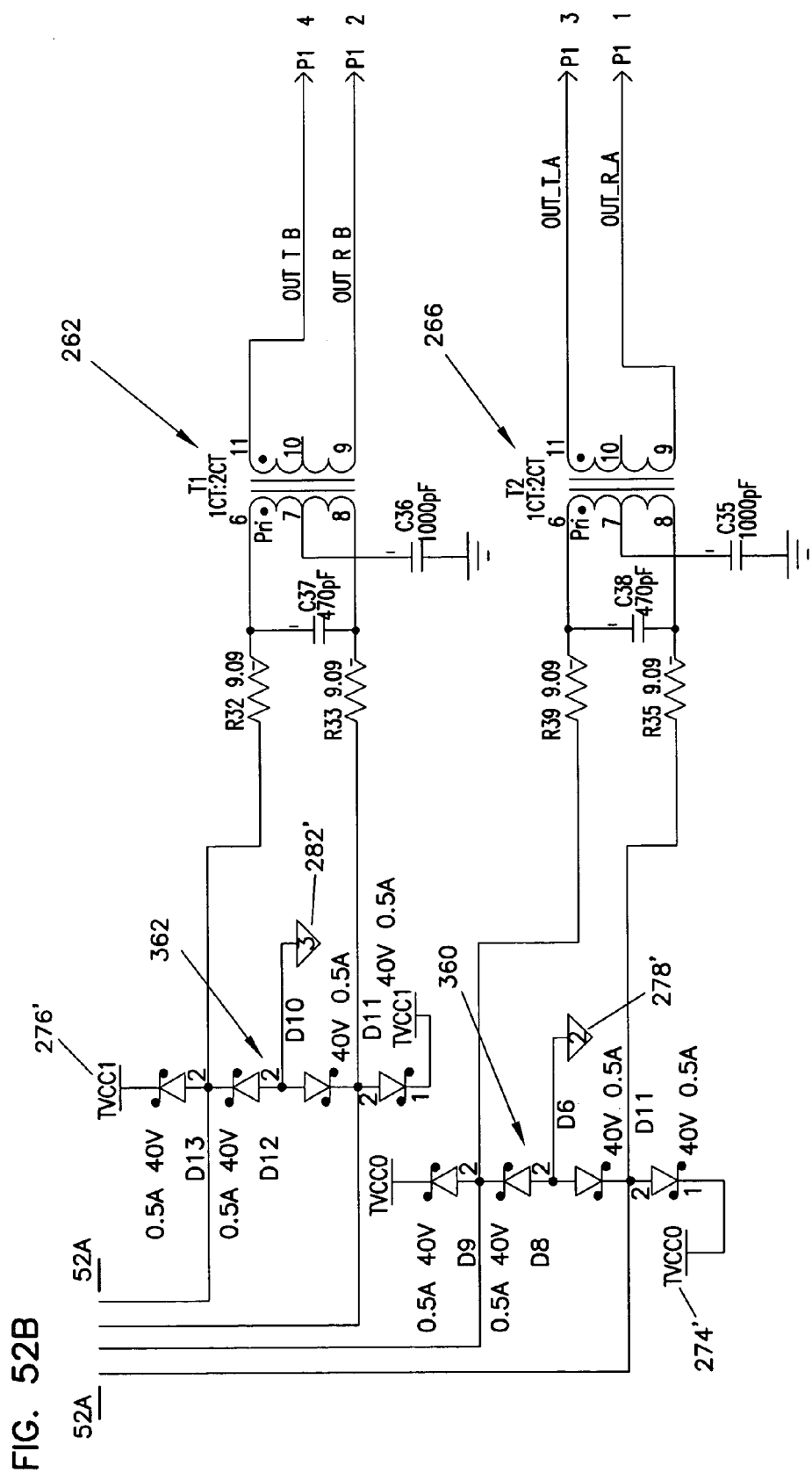

FIGS. 52A and 52B show the transceiver and the configuration of the Schottky diodes from each bank 360 and 362. This configuration of Schottky diodes can be used with the transceiver configuration shown in FIGS. 38A–G. One Schottky diode of the bank 360 is tied between the channel A power plane 274' and the channel A tip output. Another Schottky diode of the bank 360 is tied between the channel A power plane 274' and the channel A ring output. Another Schottky diode of the bank 360 is tied between the channel A tip output and the channel A ground plane 278'. The last Schottky diode of the bank 360 is tied between the channel A ring output and the channel A ground plane 278'.

Channel B output is configured the same way with one Schottky diode of the bank 362 being tied between the channel B power plane 276' and the channel B tip output. Another Schottky diode of the bank 362 is tied between the channel B power plane 276' and the channel B ring output. Another Schottky diode of the bank 362 is tied between the channel B tip output and the channel B ground plane 282'. The last Schottky diode of the bank 362 is tied between the channel B ring output and the channel B ground plane 282'.

Figure 53A:
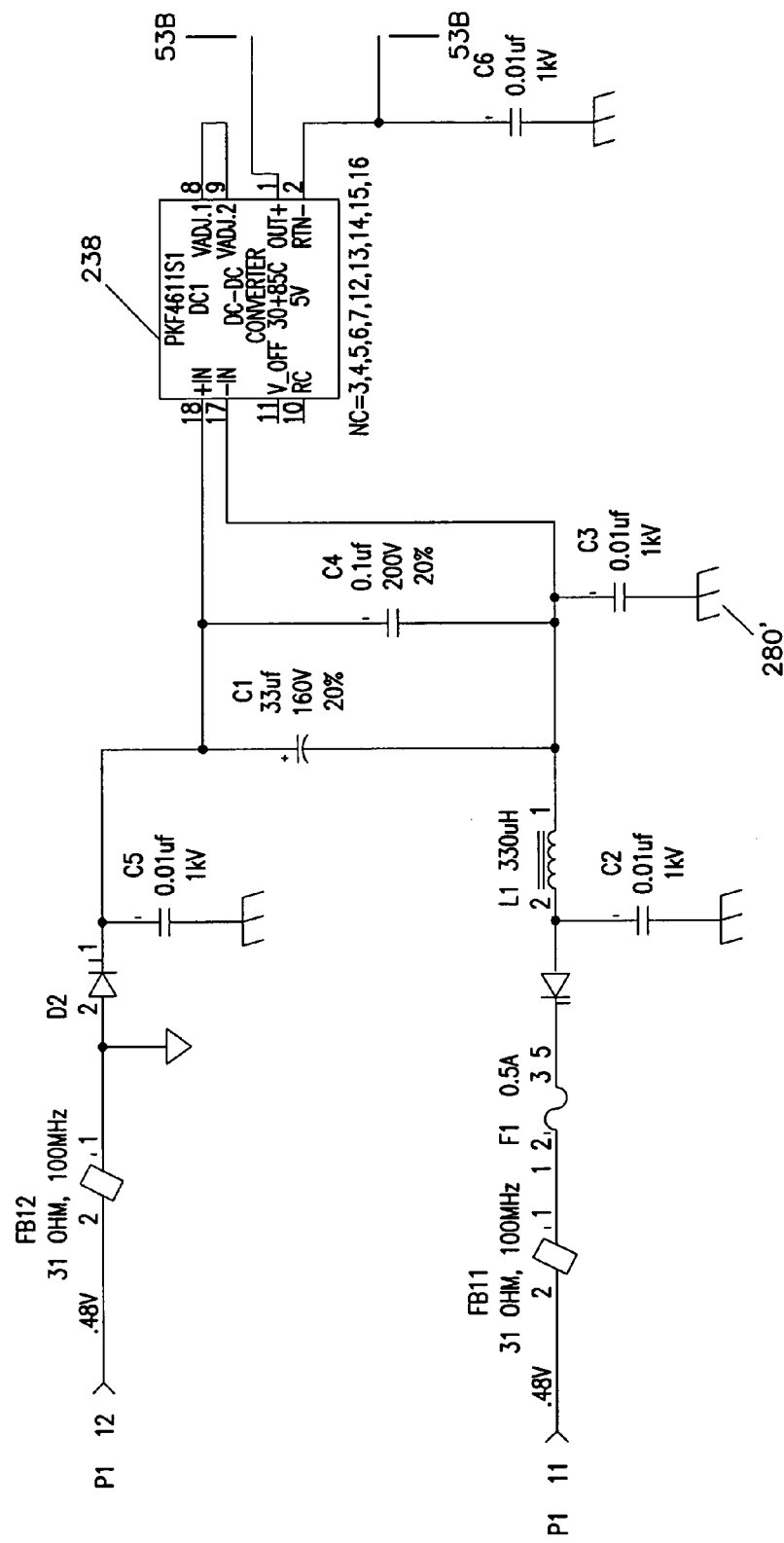
FIGS. 53A and 53B are a schematic of power supply circuitry of the repeater circuit employing additional surge protection components.
Figure 53B:
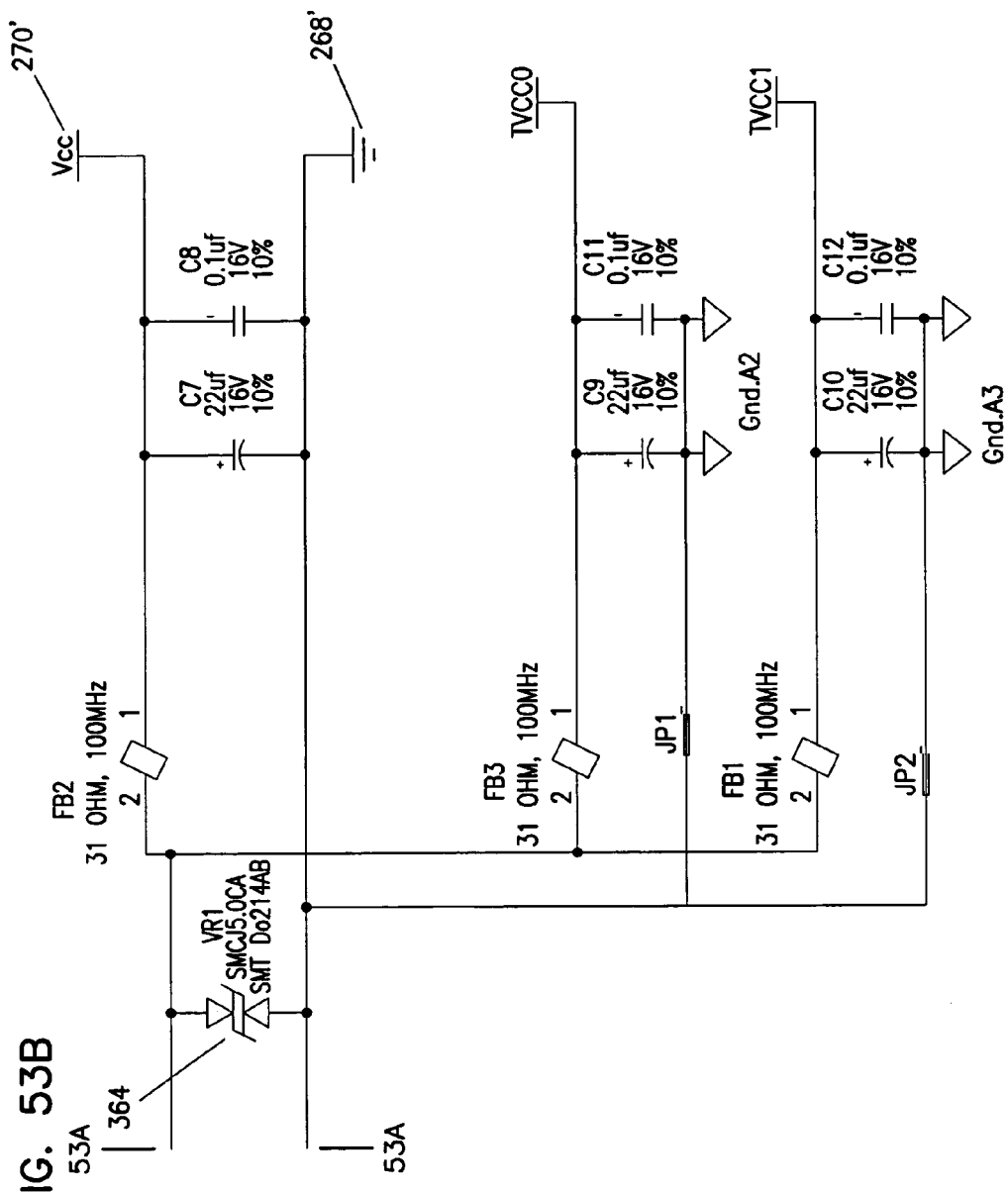

FIGS. 53A and 53B illustrate the power supply circuit that includes additional surge protection. The DC-DC converter 238 of the circuit has an output line and a return line that ultimately provide the channel A power and ground, channel B power and ground, and the logic power and ground. A transient suppressor 364 is tied between the output line and the return line of the DC-DC converter 238.

Figure 54:
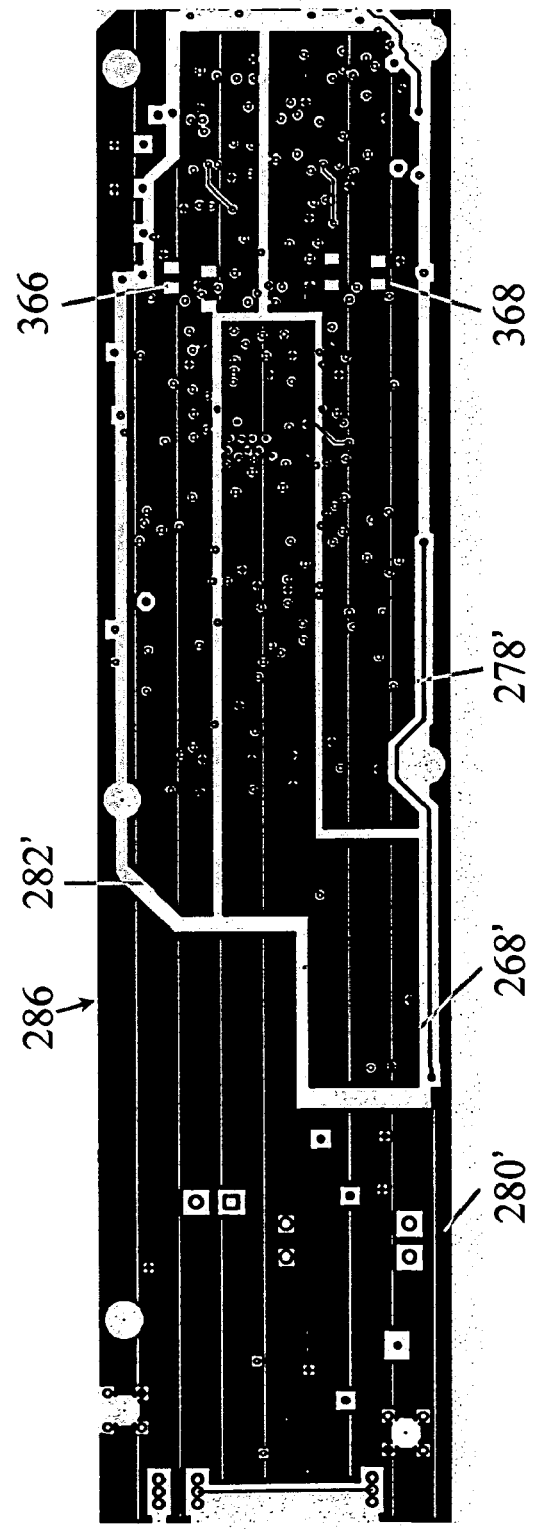
FIG. 54 is a view of an alternative ground conductor layer of the printed circuit board that employs the additional surge protection components.

FIG. 54 shows the ground layer of the circuit board 234 utilizing the additional surge protection. In this embodiment, the chassis ground plane 280' surrounds the periphery 286 of the ground layer and is electrically connected to the chassis ground provided through the chassis ground connector 138 of the chassis 100. The chassis ground plane 280' surrounds the channel A ground plane 278', logic ground plane 268', and the channel B ground plane 282'. As with the previous embodiment, chassis ground plane 280', logic ground plane 268', channel A ground plane 278', and channel B ground plane 282' are copper sheets that are isolated from each other within the single ground layer of the printed circuit board 234.

In this embodiment, the logic ground plane 268' is positioned such that it is partially between the channel A ground plane 278' and the channel B ground plane 282'. The diode bank 360 is located on the component layer and in the area 368 positioned over the channel A ground plane 278'. Similarly, the diode bank 362 is located in the area 366 positioned over the channel B ground plane 282'.

Figure 55:
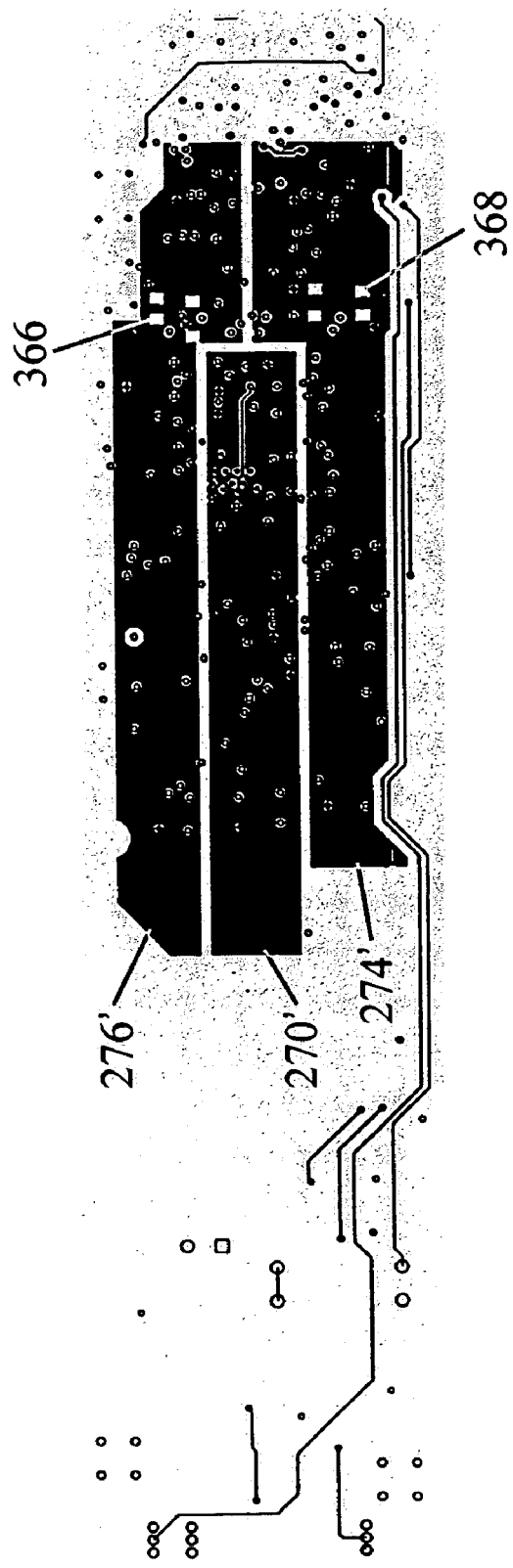
FIG. 55 is a view of an alternative power conductor layer of the printed circuit board that employs the additional surge protection components.

FIG. 55 shows a power layer of the circuit board 234 that is adjacent to the ground layer shown in FIG. 54 and separated from it by a dielectric layer. The power layer includes the logic power plane 270', the channel A power plane 274', and the channel B power plane 276'. The logic power plane 270' substantially overlaps with the logic ground plane 268' of the ground layer embodiment shown in FIG. 54. The channel A power plane 274' substantially overlaps with the channel A ground plane 278' of the ground layer embodiment shown in FIG. 54. Likewise, the channel B power plane 276' substantially overlaps with the channel B ground plane 282' of the ground layer embodiment shown in FIG. 54. As can be seen, the bank 360 of diodes is located on the component layer in the area 368 positioned over the channel A power plane 274'. The bank 362 of diodes is positioned over the channel B power plane 276'.

While the invention has been particularly shown and described with reference to preferred embodiments thereof, it will be understood by those skilled in the art that various other changes in the form and details may be made therein without departing from the spirit and scope of the invention.

What is claimed is:

1. A chassis for holding telecommunications cards, comprising:
    a housing having a first and a second horizontal surface and vertical sidewalls between the first and second horizontal surfaces, the first and second horizontal surfaces having a plurality of openings, the first horizontal surface having a first ridge substantially perpendicular to a longitudinal axis of the vertical sidewalls;

a first horizontal cover overlaying the first horizontal surface, the first horizontal cover having a first ridge that is aligned with the first ridge of the first horizontal surface;

a second ridge of the first horizontal surface that is substantially parallel to the first ridge of the first horizontal surface; and a second ridge of the first horizontal cover that is aligned with the second ridge of the first horizontal surface;

wherein the first horizontal cover is made of a mesh material defining densely populated openings, each of the densely populated openings being smaller than larger openings defined by the first horizontal surface.

2. The chassis of claim 1, further comprising a second horizontal cover underlaying the second horizontal surface.

3. The chassis of claim 1, wherein the second horizontal surface has a first ridge, the first ridge of the second horizontal surface having a plurality of knockouts, each knockout for receiving a guide of a telecommunications card.

4. The chassis of claim 1, wherein the first horizontal surface has a first row of fin slots substantially perpendicular to the first ridge of the first horizontal surface, the first row of fin slots extending partially across the first ridge, and wherein each fin slot is for receiving a fin of a telecommunications card.

5. The chassis of claim 4, wherein the first horizontal cover has a first row of fin slots substantially perpendicular to the first ridge of the first horizontal cover, the first row of fin slots of the first horizontal cover being aligned with the first row of fin slots of the first horizontal surface.

* * * * *